United States Patent
Niwa et al.

(10) Patent No.: US 9,196,778 B2
(45) Date of Patent: Nov. 24, 2015

(54) LIGHT CONCENTRATING OPTICAL ELEMENT, LIGHT CONCENTRATING DEVICE, PHOTOVOLTAIC POWER GENERATION DEVICE AND PHOTOTHERMAL CONVERSION DEVICE

(71) Applicant: NIKON CORPORATION, Tokyo (JP)

(72) Inventors: Tatsuo Niwa, Sakura (JP); Wakana Uchida, Fuchu (JP)

(73) Assignee: NIKON CORPORATION, Tokyo (JP)

( * ) Notice: Subject to any disclaimer, the term of this patent is extended or adjusted under 35 U.S.C. 154(b) by 434 days.

(21) Appl. No.: 13/718,510

(22) Filed: Dec. 18, 2012

(65) Prior Publication Data

US 2013/0118554 A1 May 16, 2013

Related U.S. Application Data

(63) Continuation of application No. PCT/JP2011/064092, filed on Jun. 20, 2011.

(30) Foreign Application Priority Data

| Jun. 18, 2010 | (JP) | 2010-138838 |
| Aug. 5, 2010 | (JP) | 2010-176830 |
| Oct. 25, 2010 | (JP) | 2010-238217 |
| Nov. 5, 2010 | (JP) | 2010-248856 |

(51) Int. Cl.
  *G02B 6/10* (2006.01)
  *H01L 31/052* (2014.01)
  (Continued)

(52) U.S. Cl.
  CPC ............ *H01L 31/0525* (2013.01); *F24J 2/1047* (2013.01); *G02B 5/0236* (2013.01); *G02B 5/10* (2013.01); *H01L 31/0547* (2014.12); *Y02E 10/52* (2013.01)

(58) Field of Classification Search
  None
  See application file for complete search history.

(56) References Cited

U.S. PATENT DOCUMENTS

| 6,274,860 B1 | 8/2001 | Rosenberg |
| 6,952,310 B1 | 10/2005 | Miyatake et al. |

(Continued)

FOREIGN PATENT DOCUMENTS

| EP | 1 052 451 A1 | 11/2000 |
| JP | A-2000-352623 | 12/2000 |

(Continued)

OTHER PUBLICATIONS

Hammam et al., "Performance evaulation of thin-film solar concentrators for greenhouse applications", Apr. 30, 2007, Desalination, vol. 209, Issues 1-3, pp. 244-250.*

(Continued)

*Primary Examiner* — Sung Pak
(74) *Attorney, Agent, or Firm* — Oliff PLC

(57) ABSTRACT

A light concentrating optical element includes: a substrate; and a plurality of micro-optical members dispersed inside the substrate. The plurality of micro-optical members each direct light having been transmitted through the substrate and having entered a micro-optical member along an entering direction, so that the light exits the micro-optical member along a matching direction matching the entering direction, and direct light having entered the micro-optical member along an other entering direction, so that the light exits the micro-optical member along an exiting direction, resulting in an advancing direction of light having entered the substrate through a substrate front surface and advancing through the substrate being deflected via the plurality of micro-optical members to extend along the matching direction; and the light having been deflected so as to advance through the substrate along the matching direction is concentrated at an end area of the substrate.

36 Claims, 44 Drawing Sheets

(51) Int. Cl.
  *G02B 5/02* (2006.01)
  *F24J 2/10* (2006.01)
  *G02B 5/10* (2006.01)
  *H01L 31/054* (2014.01)

(56) References Cited

U.S. PATENT DOCUMENTS

| | | |
|---|---|---|
| 2004/0141108 A1 | 7/2004 | Tanaka et al. |
| 2004/0246581 A1 | 12/2004 | Miyatake et al. |
| 2006/0107993 A1 | 5/2006 | Wilhelm Krokoszinski et al. |
| 2006/0193047 A1 | 8/2006 | Miyatake et al. |
| 2006/0215265 A1 | 9/2006 | Miyatake et al. |
| 2006/0232861 A1 | 10/2006 | Miyatake et al. |
| 2007/0014007 A1 | 1/2007 | Miyatake et al. |
| 2010/0139769 A1* | 6/2010 | Mapel .................. 136/259 |
| 2010/0243053 A1* | 9/2010 | Coe-Sullivan et al. ....... 136/259 |
| 2011/0253197 A1* | 10/2011 | Mapel et al. .................. 136/247 |
| 2012/0024345 A1* | 2/2012 | Reisfeld et al. ............... 136/247 |
| 2014/0140091 A1* | 5/2014 | Vasylyev ..................... 362/606 |

FOREIGN PATENT DOCUMENTS

| | | |
|---|---|---|
| JP | 2002-022966 A | 1/2002 |
| JP | A-2003-207646 | 7/2003 |
| JP | A-2005-142373 | 6/2005 |
| JP | A-2005-217224 | 8/2005 |
| JP | A-2007-218540 | 8/2007 |
| JP | 2009-169019 A | 7/2009 |

OTHER PUBLICATIONS

Sep. 8, 2014 Office Action issued in Japanese Application No. 2010-248856.
Sep. 8, 2014 Office Action issued in Japanese Application No. 2010-238217.
Sep. 12, 2014 Office Action issued in Japanese Application No. 2010-176830.
Jul. 21, 2014 Office Action issued in Chinese Application No. 201180030080.X (with translation).
Aug. 30, 2011 International Search Report issued in International Application No. PCT/JP2011/064092.

* cited by examiner

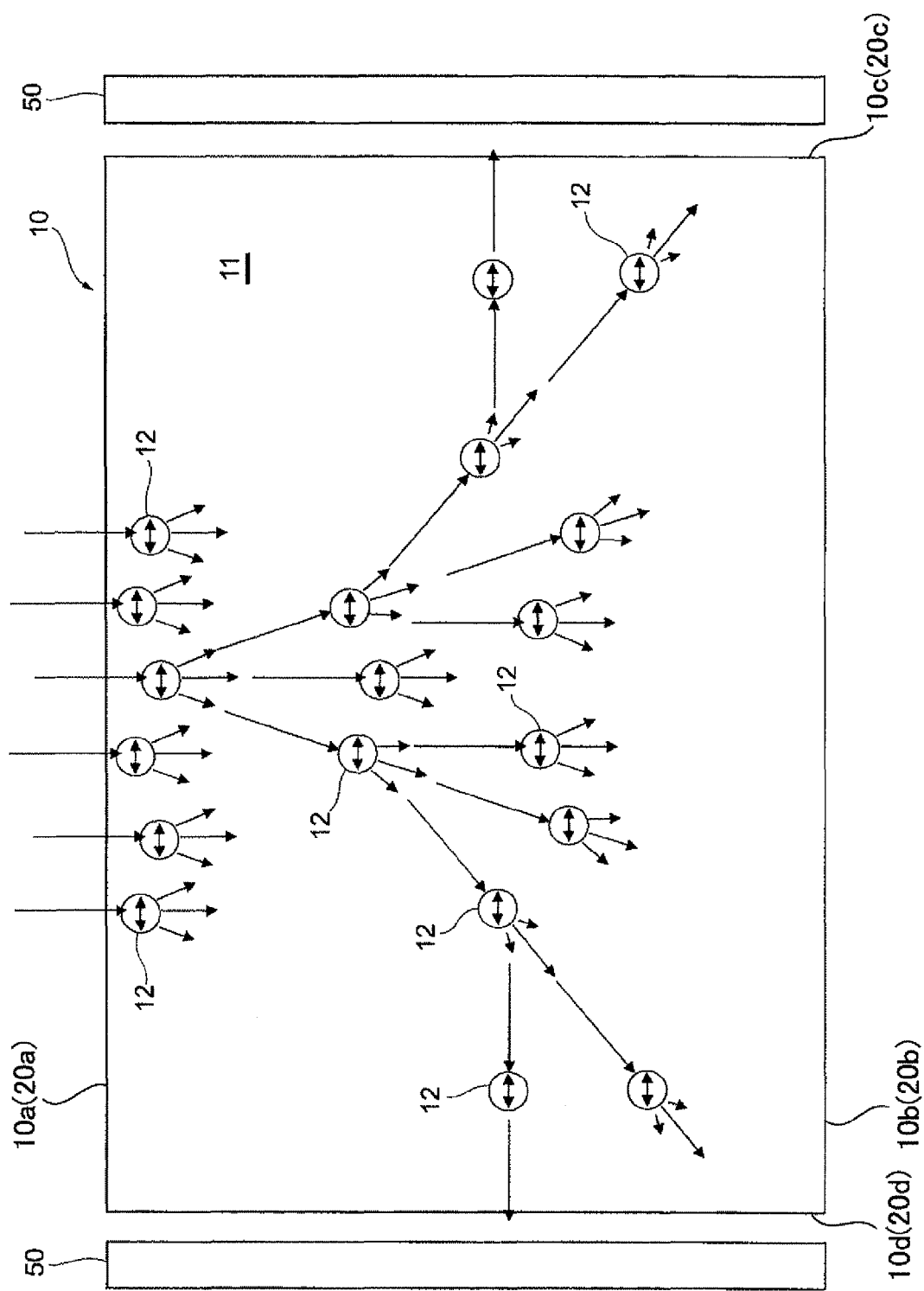

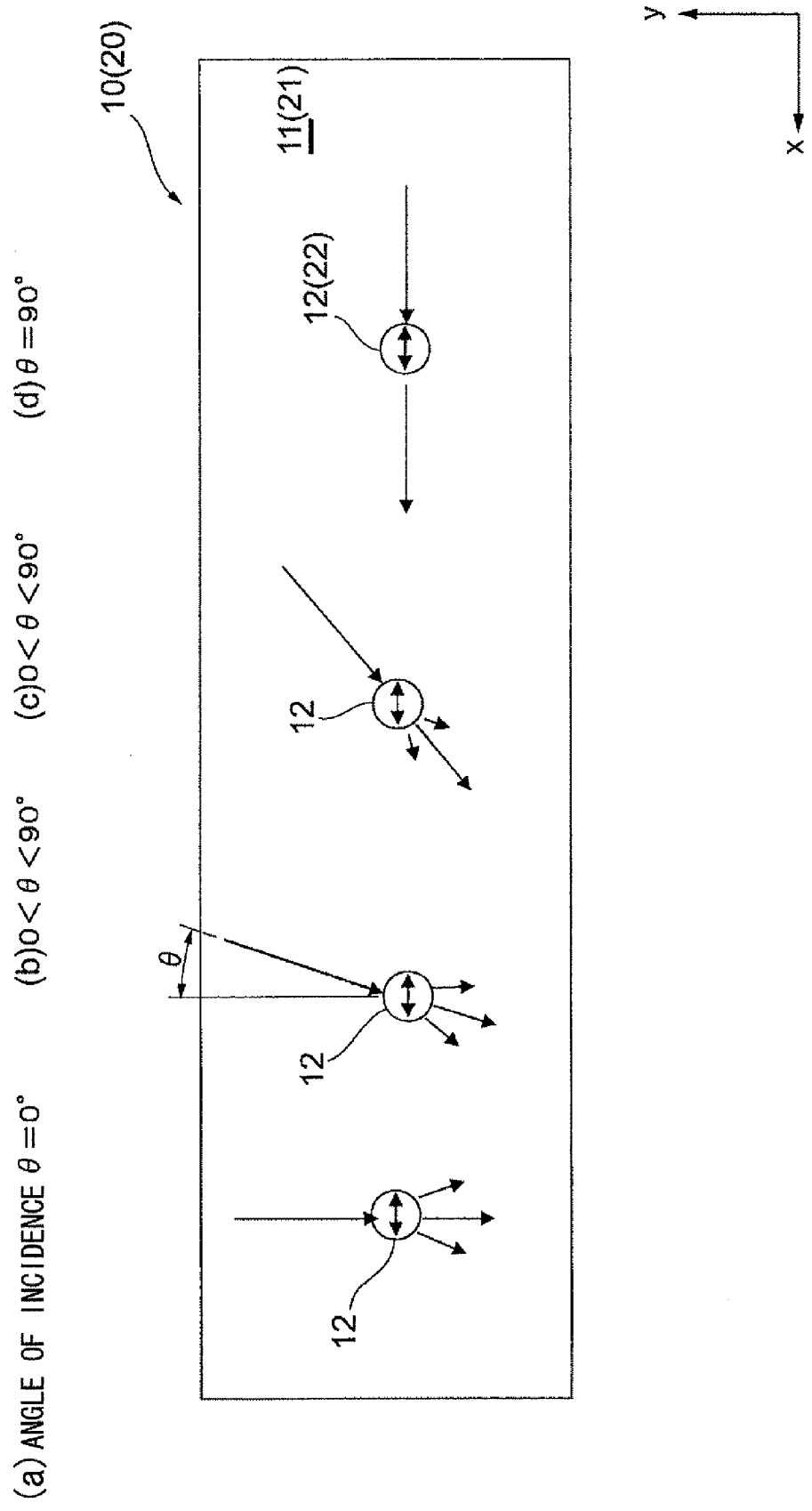

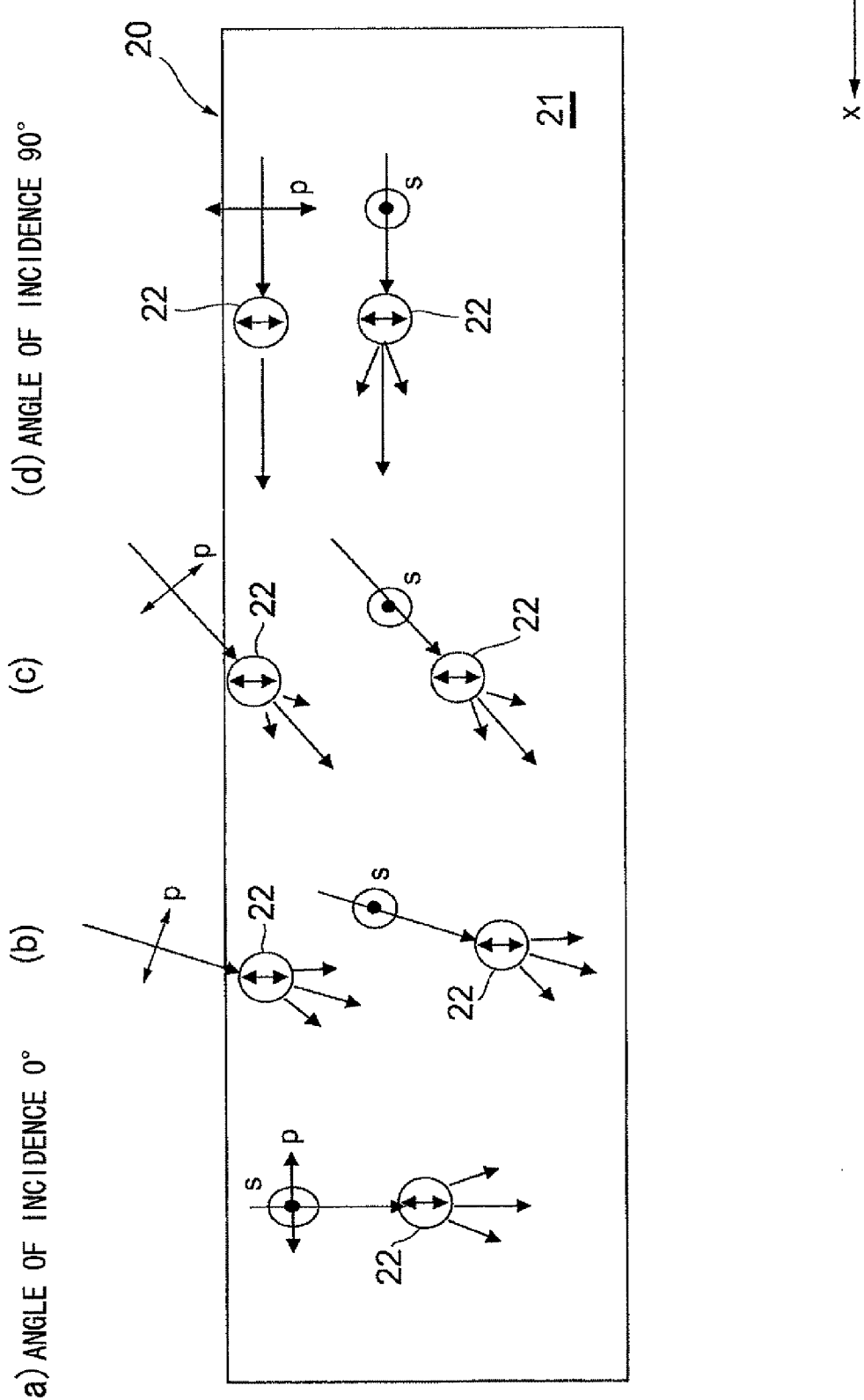

FIG.23

SHEET DRAWING DIRECTION → (90) ... VERTICAL ENTRY → (0)

| | 90 | 80 | 70 | 60 | 50 | 40 | 30 | 20 | 10 | 0 |
|---|---|---|---|---|---|---|---|---|---|---|
| ANGLE OF INCIDENCE (°) AT PARTICLES | 90 | 80 | 70 | 60 | 50 | 40 | 30 | 20 | 10 | 0 |
| PARTICLE DIAMETER (μm) | 1 | 1 | 1 | 1 | 1 | 1 | 1 | 1 | 1 | 1 |
| MEDIUM REFRACTIVE INDEX | 1.64 | 1.64 | 1.64 | 1.64 | 1.64 | 1.64 | 1.64 | 1.64 | 1.64 | 1.64 |
| BIREFRINGENT PARTICLE REFRACTIVE INDEX | 1.64 | 1.65 | 1.66 | 1.69 | 1.73 | 1.77 | 1.81 | 1.85 | 1.87 | 1.88 |
| WAVELENGTH (μm) | 0.6328 | 0.6328 | 0.6328 | 0.6328 | 0.6328 | 0.6328 | 0.6328 | 0.6328 | 0.6328 | 0.6328 |
| DENSITY (PARTICLES · μm$^{-3}$) | 0.1 | 0.1 | 0.1 | 0.1 | 0.1 | 0.1 | 0.1 | 0.1 | 0.1 | 0.1 |
| SIZE PARAMETER (π*DIAMETER *MEDIUM REFRACTIVE INDEX/WAVELENGTH) | 8.1419 | 8.1419 | 8.1419 | 8.1419 | 8.1419 | 8.1419 | 8.1419 | 8.1419 | 8.1419 | 8.1419 |
| SCATTERING EFFICIENCY | 4.85E-19 | 0.001674 | 0.028232 | 0.12676 | 0.36699 | 0.77509 | 1.297 | 1.802 | 2.155 | 2.2795 |
| SCATTERING CROSS SECTION (μm$^2$) | 3.81E-19 | 0.001315 | 0.020603 | 0.099557 | 0.28823 | 0.60875 | 1.0187 | 1.4153 | 1.6925 | 1.7903 |
| SCATTERING COEFFICIENT | 3.81E-17 | 0.13147 | 2.0602 | 9.9555 | 28.823 | 60.875 | 101.87 | 141.53 | 169.26 | 179.03 |
| SCATTERING PROBABILITY | 8.21E-20 | 0.000283 | 0.004439 | 0.021449 | 0.062097 | 0.131151 | 0.219472 | 0.304917 | 0.364638 | 0.385708 |

FIG.26

| ANGLE OF INCIDENCE (°) | 90 | 80 | 70 | 60 | 50 | 40 | 30 | 20 | 10 | 0 |
|---|---|---|---|---|---|---|---|---|---|---|
| PARTICLE DIAMETER (μm) | 1 | 1 | 1 | 1 | 1 | 1 | 1 | 1 | 1 | 1 |
| MEDIUM REFRACTIVE INDEX | 1.49 | 1.49 | 1.49 | 1.49 | 1.49 | 1.49 | 1.49 | 1.49 | 1.49 | 1.49 |
| BIREFRINGENT PARTICLE REFRACTIVE INDEX | 1.485 | 1.490 | 1.502 | 1.523 | 1.549 | 1.578 | 1.608 | 1.633 | 1.650 | 1.656 |
| CALCULATED WAVELENGTH (μm) | 0.6328 | 0.6328 | 0.6328 | 0.6328 | 0.6328 | 0.6328 | 0.6328 | 0.6328 | 0.6328 | 0.6328 |
| DENSITY (PARTICLES · μm$^{-3}$) | 0.1 | 0.1 | 0.1 | 0.1 | 0.1 | 0.1 | 0.1 | 0.1 | 0.1 | 0.1 |
| SIZE PARAMETER ($\pi$*DIAMETER *MEDIUM REFRACTIVE INDEX /WAVELENGTH) | 7.3972 | 7.3972 | 7.3972 | 7.3972 | 7.3972 | 7.3972 | 7.3972 | 7.3972 | 7.3972 | 7.3972 |
| SCATTERING EFFICIENCY | 0.001075 | 7.73E-06 | 0.007342 | 0.051494 | 0.16722 | 0.37408 | 0.65313 | 0.9419 | 1.1587 | 1.2389 |
| SCATTERING CROSS SECTION (μm$^2$) | 0.000845 | 6.07E-06 | 0.005766 | 0.040443 | 0.13133 | 0.2938 | 0.51297 | 0.73977 | 0.91004 | 0.97303 |
| SCATTERING COEFFICIENT | 0.084458 | 0.000607 | 0.5766 | 4.0443 | 13.133 | 29.38 | 51.296 | 73.977 | 91.004 | 97.302 |
| SCATTERING PROBABILITY | 0.00 | 0.00 | 0.00 | 0.01 | 0.03 | 0.06 | 0.11 | 0.16 | 0.20 | 0.21 |

FIG.28

| ANGLE OF INCIDENCE (°) | 90 | 80 | 70 | 60 | 50 | 40 | 30 | 20 | 10 | 0 |
|---|---|---|---|---|---|---|---|---|---|---|
| PARTICLE DIAMETER (μm) | 1 | 1 | 1 | 1 | 1 | 1 | 1 | 1 | 1 | 1 |
| MEDIUM REFRACTIVE INDEX | 1.49 | 1.49 | 1.49 | 1.49 | 1.49 | 1.49 | 1.49 | 1.49 | 1.49 | 1.49 |
| BIREFRINGENT PARTICLE REFRACTIVE INDEX | 1.6557 | 1.6557 | 1.6557 | 1.6557 | 1.6557 | 1.6557 | 1.6557 | 1.6557 | 1.6557 | 1.6557 |
| CALCULATED WAVELENGTH (μm) | 0.6328 | 0.6328 | 0.6328 | 0.6328 | 0.6328 | 0.6328 | 0.6328 | 0.6328 | 0.6328 | 0.6328 |
| DENSITY (PARTICLES · μm$^{-3}$) | 0.1 | 0.1 | 0.1 | 0.1 | 0.1 | 0.1 | 0.1 | 0.1 | 0.1 | 0.1 |
| SIZE PARAMETER ($\pi$*DIAMETER *MEDIUM REFRACTIVE INDEX /WAVELENGTH) | 7.3972 | 7.3972 | 7.3972 | 7.3972 | 7.3972 | 7.3972 | 7.3972 | 7.3972 | 7.3972 | 7.3972 |
| SCATTERING EFFICIENCY | 1.2389 | 1.2389 | 1.2389 | 1.2389 | 1.2389 | 1.2389 | 1.2389 | 1.2389 | 1.2389 | 1.2389 |
| SCATTERING CROSS SECTION (μm$^2$) | 0.97303 | 0.97303 | 0.97303 | 0.97303 | 0.97303 | 0.97303 | 0.97303 | 0.97303 | 0.97303 | 0.97303 |
| SCATTERING COEFFICIENT | 97.302 | 97.302 | 97.302 | 97.302 | 97.302 | 97.302 | 97.302 | 97.302 | 97.302 | 97.302 |
| SCATTERING PROBABILITY | 0.21 | 0.21 | 0.21 | 0.21 | 0.21 | 0.21 | 0.21 | 0.21 | 0.21 | 0.21 |

LIGHT CONCENTRATING OPTICAL ELEMENT, LIGHT CONCENTRATING DEVICE, PHOTOVOLTAIC POWER GENERATION DEVICE AND PHOTOTHERMAL CONVERSION DEVICE

INCORPORATION BY REFERENCE

This is a Continuation of International Patent Application No. PCT/JP2011/064092 filed Jun. 20, 2011, which claims priority of, Japanese Patent Application No. 2010-138838 filed Jun. 18, 2010, Japanese Patent Application No. 2010-176830 filed Aug. 5, 2010, Japanese Patent Application No. 2010-238217 filed Oct. 25, 2010 and Japanese Patent Application No. 2010-248856 filed Nov. 5, 2010.

BACKGROUND OF THE INVENTION

1. Field of the Invention

The present invention relates to a light concentrating optical element that concentrates light having entered one surface thereof toward a side surface ranging along a side of the entry surface. It also relates to a light concentrating device, a photovoltaic power generation device and a photothermal conversion device, each equipped with the light concentrating optical element.

2. Description of Related Art

A solar cell that converts light energy to electric energy is constituted of a silicon-based material, a compound-based material, an organic material, a dye-sensitized material or the like. A standard solar cell normally achieves a power conversion efficiency of approximately 10 to 20%. The multi-junction solar cells developed in recent years, which include a plurality of semiconductor layers with optimal band gaps for photoelectric conversion of light in a plurality of wavelength bands defined by dividing the solar radiation spectrum range into a plurality of wavelength segments, laminated one layer on top of another, on the other hand, assure a much improved power conversion efficiency of up to 40%.

However, high-efficiency solar cells such as those described above are very expensive and thus, are not readily available except for special applications such as aerospace applications. As alternatives to the expensive, high-efficiency solar cells, concentration-type solar battery modules, enabling high-efficiency solar power generation at reduced cost by concentrating incident sunlight into compact cells, have been proposed. Japanese Laid Open Patent Publication No. 2005-142373 and Japanese Laid Open Patent Publication No. 2005-217224 disclose that, at a concentration-type solar cell module, sunlight focused via a Fresnel lens, a reflecting mirror or the like may be taken into the solar cells. U.S. Patent Application Publication No. 2006/0107993 discloses that fluorescent light generated in a fluorescent collector plate with fluorescing particles dispersed therein as sunlight is absorbed into the fluorescent collector plate may be guided toward a side of the plate and concentrated. U.S. Pat. No. 6,274,860 discloses that light diffracted through holographic film at a plate assembly with the holographic film and a solar cell enclosed therein as sunlight enters the plate assembly, may be guided to the solar cell through a spectral concentration system.

SUMMARY OF THE INVENTION

The light concentrating device that focuses sunlight through a lens must assume a thickness along the optical axis that corresponds to the focal length of the lens and also requires a separate tracking device in order to align the optical axis with the azimuth of the sun. While the solar battery module in a light concentrating device that concentrates light through a fluorescent collector plate or a light concentrating device that concentrates light through spectral concentration is allowed to assume a smaller dimension along the direction in which the optical axis extends and does not always require a tracking device, it still leaves room for improvement with respect to wavelength dependency and conversion efficiency.

According to the 1st aspect of the present invention, a light concentrating optical element comprises: a substrate; and a plurality of micro-optical members dispersed inside the substrate. The plurality of micro-optical members each direct light having been transmitted through the substrate and having entered a micro-optical member along at least one entering direction, so that the light exits the micro-optical member along a matching direction matching the one entering direction, and direct light having entered the micro-optical member along an other entering direction different from the one entering direction, so that the light exits the micro-optical member along at least one exiting direction different from the other entering direction, resulting in an advancing direction of light having entered the substrate through a substrate front surface and advancing through the substrate being deflected via the plurality of micro-optical members to extend along the matching direction; and the light having been deflected via the plurality of micro-optical members so as to advance through the substrate along the matching direction is concentrated at an end area of the substrate.

According to the 2nd aspect of the present invention, in the light concentrating optical element according to the 1st aspect, it is preferred that at least either the substrate or the plurality of micro-optical members have a birefringence property; and a refractive index of the substrate and a refractive index of each of the micro-optical members are substantially equal to each other in relation to light advancing through the substrate along the matching direction.

According to the 3rd aspect of the present invention, in the light concentrating optical element according to the 1st aspect, it is preferred that the micro-optical members are each formed as a particle and are dispersed along a thickness-wise direction extending along a thickness of the substrate and along a first direction and a second direction each extending perpendicular to the thickness-wise direction; the micro-optical members each assume a particle diameter d, expressed as a diameter of an equivalent circle set to $0.1\lambda$ to $10\lambda$ with $\lambda$ representing a wavelength of light entering along the thickness-wise direction; and refractive indices achieve a relationship whereby $n_{axy}$ and $n_{bxy}$ are different from each other, $n_{ax\varnothing}$ and $n_{bx\varnothing}$ are equal to each other and $\sin \varnothing > (1/n_{ax\varnothing})$ is true, when; an axis extending along the thickness-wise direction is designated as a y-axis, an axis extending along the first direction is designated as an x-axis, an axis extending along the second direction is designated as a z-axis and a plane that contains both the x-axis and the y-axis is designated as an xy plane; a refractive index for light advancing through the substrate along the y-axis with an electric field component thereof vibrating within the xy plane is notated as $n_{axy}$, a refractive index for light advancing through the substrate along the x-axis with the electric field component thereof vibrating within the xy plane is notated as $n_{ayx}$ and a refractive index for light advancing through the substrate along an axial direction inclining from the y-axis toward the x-axis by an angle $\varnothing$ ($0<\varnothing \le 90°$) with the electric field component thereof vibrating within the xy plane is notated as and a refractive index for light advancing through each micro-optical member among the plurality of micro-optical members along the y-axis with an electric field component thereof vibrating within the xy plane is notated as $n_{bxy}$, a refractive index for light advancing through the micro-optical member along the x-axis with the electric field component thereof vibrating within the xy plane is notated as $n_{byx}$ and a refractive index for light advancing through the micro-optical member along the axial direction inclining from the y-axis toward the x-axis by the angle Ø with the electric field component thereof vibrating within the xy plane is notated as $n_{bxØ}$.

According to the 4th aspect of the present invention, in the light concentrating optical element according to the 3rd aspect, it is preferred that the refractive indices further achieve a relationship expressed as; $n_{bxy} > n_{bxØ} > n_{byx}$.

According to the 5th aspect of the present invention, in the light concentrating optical element according to the 3rd aspect, it is preferred that the refractive indices further achieve a relationship expressed as; $n_{bxy} < n_{bxØ} < n_{byx}$.

According to the 6th aspect of the present invention, in the light concentrating optical element according to the 3rd aspect, it is preferred that the refractive indices further achieve a relationship expressed as; $n_{axy} > n_{axØ} > n_{ayx}$.

According to the 7th aspect of the present invention, in the light concentrating optical element according to the 3rd aspect, it is preferred that the refractive indices further achieve a relationship expressed as; $n_{axy} < n_{axØ} < n_{ayx}$.

According to the 8th aspect of the present invention, in the light concentrating optical element according to the 3rd aspect, it is preferred that the refractive indices further achieve a relationship whereby $n_{azy}$ and $n_{bzy}$ are different from each other, $n_{ayz}$ and $n_{byz}$ are different from each other, $n_{azγ}$ and $n_{bzγ}$ are equal to each other and $\sin γ > (1/n_{azγ})$ is true, when; a plane that contains both the y-axis and the z-axis is designated as a zy plane; a refractive index for light advancing through the substrate along the y-axis with an electric field component thereof vibrating within the zy plane is notated as $n_{azy}$, a refractive index for light advancing through the substrate along the z-axis with the electric field component thereof vibrating within the zy plane is notated as $n_{ayz}$ and a refractive index for light advancing through the substrate along an axial direction inclining from the y-axis toward the z-axis by an angle γ ($0 < γ \leq 90°$) with the electric field component thereof vibrating within the zy plane is notated as $n_{azγ}$; and a refractive index for light advancing through each micro-optical member among the plurality of micro-optical members along the y-axis with an electric field component thereof vibrating within the zy plane is notated as $n_{bzy}$, a refractive index for light advancing through the micro-optical member along the z-axis with the electric field component thereof vibrating within the zy plane is notated as $n_{byz}$ and a refractive index for light advancing through the micro-optical member along the axial direction inclining from the y-axis toward the z-axis by the angle γ with the electric field component thereof vibrating within the zy plane, is notated as $n_{bzγ}$.

According to the 9th aspect of the present invention, in the light concentrating optical element according to the 3rd aspect, it is preferred that the refractive indices achieve a relationship whereby $n_{axØ}$ is equal to $n_{ayx}$, $n_{bxØ}$ is equal to $n_{byx}$, $n_{axy}$ and $n_{bxy}$ are different from each other and $n_{ayx}$ and $n_{byx}$ are substantially equal to each other when the angle Ø is 90°.

According to the 10th aspect of the present invention, in the light concentrating optical element according to the 9th aspect, it is preferred that the refractive indices further achieve a relationship expressed as; $n_{axy} < n_{bxy}$ and $n_{bxy} > n_{byx}$.

According to the 11th aspect of the present invention, in the light concentrating optical element according to the 9th aspect, it is preferred that the refractive indices further achieve a relationship expressed as; $n_{axy} < n_{bxy}$ and $n_{axy} < n_{ayx}$.

According to the 12th aspect of the present invention, in the light concentrating optical element according to the 9th aspect, it is preferred that the refractive indices further achieve a relationship expressed as; $n_{axy} > n_{bxy}$ and $n_{bxy} < n_{byx}$.

According to the 13th aspect of the present invention, in the light concentrating optical element according to the 9th aspect, it is preferred that the refractive indices further achieve a relationship expressed as; $n_{axy} > n_{bxy}$ and $n_{axy} > n_{ayx}$.

According to the 14th aspect of the present invention, in the light concentrating optical element according to the 9th aspect, it is preferred that the refractive indices further achieve a relationship whereby $n_{azy}$ and $n_{bzy}$ are substantially equal to each other when; a refractive index for light advancing through the substrate along the x-axis with an electric field component thereof vibrating within the zy plane is notated as $n_{azy}$; and a refractive index for light advancing through each micro-optical member among the plurality of micro-optical members along the x-axis with an electric field component thereof vibrating within the zy plane is notated as $n_{bzy}$.

According to the 15th aspect of the present invention, in the light concentrating optical element according to the 3rd aspect, it is preferred that a size parameter α defined as; $(π \times d \times n_{axy})/λ$ is within a range of $1.5 \leq α \leq 40$.

According to the 16th aspect of the present invention, in the light concentrating optical element according to the 3rd aspect, it is preferred that a size parameter α defined as; $(π \times d \times n_{axy})/λ$ is within a range of $2 \leq α \leq 20$.

According to the 17th aspect of the present invention, in the light concentrating optical element according to the 3rd aspect, it is preferred that the micro-optical members each assume a particle diameter d equal to or less than 20 μm.

According to the 18th aspect of the present invention, in the light concentrating optical element according to the 3rd aspect, it is preferred that a distribution density with which the micro-optical members are dispersed in the substrate is set so that light having entered the substrate through the front surface thereof along the thickness-wise direction, which is then multiply scattered via the plurality of micro-optical members to advance toward a back surface, is totally reflected at the back surface.

According to the 19th aspect of the present invention, in the light concentrating optical element according to the 1st aspect, it is preferred that the micro-optical members are disposed within the substrate along a thickness-wise direction extending along a thickness of the substrate and along a first direction and a second direction each extending perpendicular to the thickness-wise direction and each assume a wedge shape widening gradually along the first direction within a plane that contains the thickness-wise direction and the first direction and ranges perpendicular to the second direction; a measurement of each micro-optical member among the plurality of micro-optical members taken along the first direction is equal to or greater than 1/10 of a wavelength of light advancing through the substrate; and refractive indices achieve a relationship whereby $n_{ax}$ and $n_{bx}$ are different from each other, and $n_{ay}$ and $n_{by}$ are substantially equal to each other, when; a refractive index for light advancing through the substrate along the thickness-wise direction with an electric field component thereof vibrating along the first direction is notated as $n_{ax}$, and a refractive index for light advancing through the substrate along the first direction with the electric field component thereof vibrating along the thickness-wise direction is notated as $n_{ay}$; and a refractive index for light advancing through each micro-optical member among the plurality of micro-optical members along the thickness-wise direction with an electric field component thereof vibrating along the first direction is notated as $n_b$, and a refractive index for light advancing through the micro-optical member along the first direction with the electric field component thereof vibrating along the thickness-wise direction is notated as $n_{by}$.

According to the 20th aspect of the present invention, in the light concentrating optical element according to the 19th aspect, it is preferred that the plurality of micro-optical members each assume an isosceles triangle wedge shape within the plane containing the thickness-wise direction and the first direction and the micro-optical members are each disposed so that a vertical line extending from a vertex of the isosceles triangle toward a base side is aligned in the first direction.

According to the 21st aspect of the present invention, in the light concentrating optical element according to the 19th aspect, it is preferred that a vertex of the wedge shape assumed by each of the micro-optical members and a number of micro-optical members that overlap each other along the thickness-wise direction are set so that; light having entered the substrate through the front surface thereof along the thickness-wise direction and having been sequentially refracted within the plane containing the thickness-wise direction and the first direction via the plurality of micro-optical members to advance toward a back surface from one of the micro-optical members located closest to the back surface of the substrate, is totally reflected at the back surface of the substrate.

According to the 22nd aspect of the present invention, in the light concentrating optical element according to the 1st aspect, it is preferred that the substrate is formed as a plate or a sheet with an entry surface through which light enters the substrate having a greater area than side surfaces forming the end area of the substrate, and dimensions of the substrate taken along the first direction and along the second direction each running perpendicular to the thickness-wise direction are both greater than a dimension taken along the thickness-wise direction by a sufficient extent.

According to the 23rd aspect of the present invention, in the light concentrating optical element according to the 1st aspect, it is preferred that the substrate is formed so that an area of a side surface thereof forming the end area of the substrate is smaller by a sufficient extent compared to an area of an entry surface thereof through which light enters the substrate.

According to the 24th aspect of the present invention, a light concentrating device comprises: a light concentrating optical element according to the 1st aspect: a reflecting mirror disposed on a side where a back surface, facing opposite an entry surface of the substrate through which light enters the substrate of the light concentrating optical element, is located so as to range along the back surface; and a polarization plane rotating element disposed between the light concentrating optical element and the reflecting mirror, which causes a 90° rotation of a polarization plane of light transmitted through the polarization plane rotating element twice.

According to the 25th aspect of the present invention, a light concentrating device comprises: a first light concentrating optical element according to the 1st aspect; and a second light concentrating optical element according to the 1st aspect. The second light concentrating optical element is disposed on a side where a back surface, facing opposite an entry surface of the substrate through which light enters the substrate of the first light concentrating optical element, is located; and the first direction assumed at the second light concentrating optical element and the second direction assumed at the first light concentrating optical element extend parallel to each other.

According to the 26th aspect of the present invention, a light concentrating device comprises: a first light concentrating optical element according to the 1st aspect; and a second light concentrating optical element according to the 1st aspect. The second light concentrating optical element is disposed on a side where a back surface, facing opposite an entry surface of the substrate through which light enters the substrate of the first light concentrating optical element, is located; the first direction assumed at the second light concentrating optical element and the first direction assumed at the first light concentrating optical element extend parallel to each other; and a polarization plane rotating element, which causes a 90° rotation of a polarization plane of light transmitted through the polarization plane rotating element, is disposed between the first light concentrating optical element and the second light concentrating optical element.

According to the 27th aspect of the present invention, a light concentrating device comprises: a light concentrating optical element according to the 1st aspect and a light concentrating unit that concentrates light entering along a thickness-wise direction and outputs the concentrated light through an exit surface located at a side end thereof. An entry surface through which light enters the substrate is set so as to face opposite the exit surface and the matching direction extends along longer sides of the entry surface.

According to the 28th aspect of the present invention, in the light concentrating device according to the 24th aspect, it is preferred that the light concentrating device further comprises a light concentrating unit that concentrates light entering along a thickness-wise direction and outputs the concentrated light through an exit surface located at a side end thereof. An entry surface through which light enters the substrate is set so as to face opposite the exit surface and the matching direction extends along longer sides of the entry surface.

According to the 29th aspect of the present invention, a photovoltaic power generation device comprises: a light concentrating optical element according to the 1st aspect; and a photoelectric conversion element where light having advanced through the substrate and been concentrated at the end area of the substrate undergoes photoelectric conversion. The one entering direction is the first direction.

According to the 30th aspect of the present invention, a photovoltaic power generation device comprises: a light concentrating optical element according to the 1st aspect; and a photoelectric conversion element where light having advanced through the substrate and been concentrated at the end area of the substrate undergoes photoelectric conversion. The one entering direction is the first direction and the second direction.

According to the 31st aspect of the present invention, a photovoltaic power generation device comprises: a light concentrating device according to the 24th aspect; and a photoelectric conversion element where light having advanced through the substrate and been concentrated at the end area of the substrate undergoes photoelectric conversion. The one entering direction is the first direction.

According to the 32nd aspect of the present invention, a photovoltaic power generation device comprises: a light concentrating device according to the 25th aspect, a first photoelectric conversion element where light having advanced through the substrate of the first light concentrating optical element and concentrated at the end area of the substrate in the first light concentrating optical element undergoes photoelectric conversion; and a second photoelectric conversion element where light having advanced through the substrate of the second light concentrating optical element and concentrated at the end area of the substrate in the second light concentrating optical element undergoes photoelectric conversion. The one entering direction assumed at the first light concentrating optical element is the first direction taken at the first light concentrating optical element and the one entering direction assumed at the second light concentrating optical element is the first direction taken at the second light concentrating optical element.

According to the 33rd aspect of the present invention, a photothermal conversion device comprises: a light concentrating optical element according to the 1st aspect; and a photothermal conversion element where light having advanced through the substrate and been concentrated at the end area of the substrate undergoes photothermal conversion. The one entering direction is the first direction.

According to the 34th aspect of the present invention, a photothermal conversion device comprises: a light concentrating optical element according to the 1st aspect; and a photothermal conversion element where light having advanced through the substrate and been concentrated at the end area of the substrate undergoes photothermal conversion. The one entering direction is the first direction and the second direction.

According to the 35th aspect of the present invention, a photothermal conversion device comprises: a light concentrating device according to the 24th aspect; and a photothermal conversion element where light having advanced through the substrate and been concentrated at the end area of the substrate undergoes photothermal conversion. The one entering direction is the first direction.

According to the 36th aspect of the present invention, a photothermal conversion device comprises: a light concentrating device according to the 25th aspect, a first photothermal conversion element where light having advanced through the substrate of the first light concentrating optical element and concentrated at the end area of the substrate in the first light concentrating optical element undergoes photothermal conversion; and a second photothermal conversion element where light having advanced through the substrate of the second light concentrating optical element and concentrated at the end area of the substrate in the second light concentrating optical element undergoes photothermal conversion. The one entering direction assumed at the first light concentrating optical element is the first direction taken at the first light concentrating optical element and the one entering direction taken at the second light concentrating optical element is the first direction assumed at the second light concentrating optical element.

BRIEF DESCRIPTION OF THE DRAWINGS

FIG. 5 is a graph presenting an example of distribution of light scattered via particles with a particle diameter of 0.3 µm.

FIG. 17 is an illustration showing how the light advancing direction changes as light becomes scattered.

FIG. 20 is a schematic illustration of varying relationships between the angle of incidence at which light enters a micro-optical member and the scattering of light.

FIG. 21 is a schematic illustration of varying relationships between the angle of incidence at which light enters a micro-optical member and the scattering of light.

FIG. 23 presents a table indicating relationships between the angle of incidence at which light enters the micro-optical members and the individual indices.

FIG. 26 presents a table indicating relationships between the angle of incidence at which light enters the micro-optical members and the individual indices.

FIG. 28 presents a table indicating relationships between the angle of incidence at which light enters the micro-optical members and the individual indices.

DESCRIPTION OF PREFERRED EMBODIMENTS

First and Second Embodiments

Figure 1:
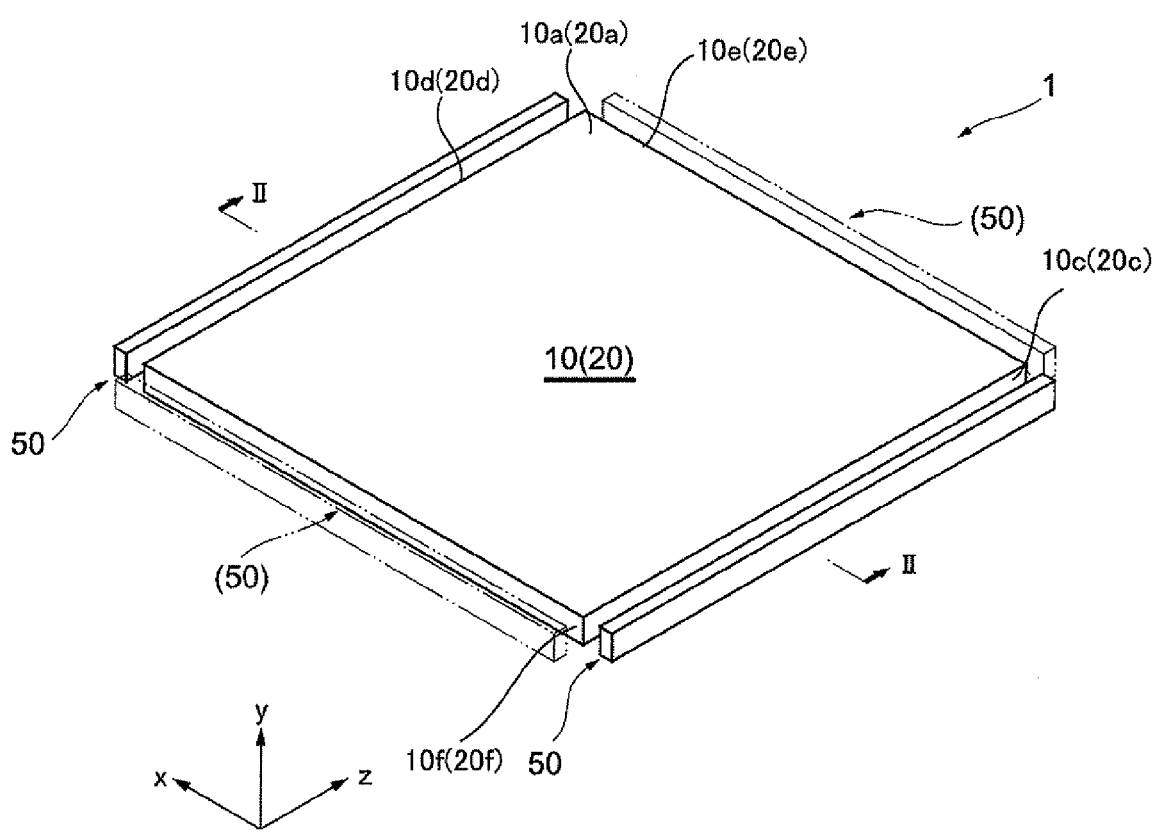
FIG. 1 is a perspective providing an external view of a photovoltaic power generation device.
Figure 2:
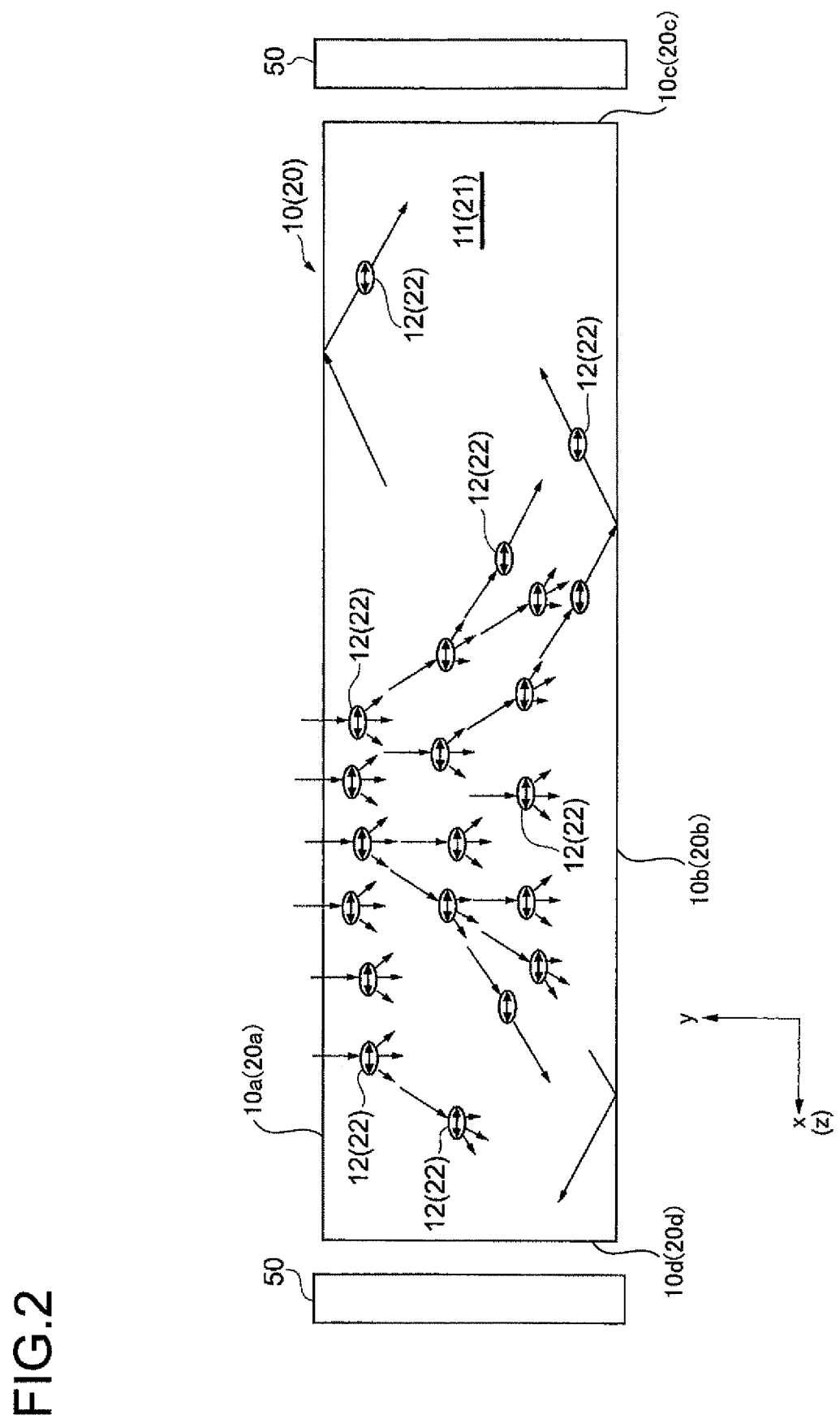
FIG. 2 is an illustration showing how the light advancing direction changes as light becomes scattered.

The following is a description of the first and second embodiments of the present invention given in reference to drawings. FIG. 1 is a perspective providing an external view of a photovoltaic power generation device 1 that includes a light concentrating optical element 10 achieved in the first embodiment of the present invention or a light concentrating optical element 20 achieved in the second embodiment of the present invention, whereas FIG. 2 provides a schematic sectional view taken as indicated by arrows II-II in FIG. 1. It is to be noted that in order to facilitate an explanation, a coordinate system configured with an x-axis, a y-axis and a z-axis, extending perpendicular to one another, is defined as shown in FIG. 1. The y-axis extends along the thickness of the light concentrating optical element 10, i.e., along the optical axis, whereas the x-axis and the z-axis intersect each other orthogonally within a plane parallel to the surface of the light concentrating optical element through which light enters. FIG. 2 is equivalent to a schematic view of a section sliced through a plane (an xy plane) containing the x-axis and y-axis and ranging perpendicular to the z-axis. It is to be noted that while the directional terms top/bottom/left/right may be used in relation to the orientation shown in FIG. 2 in the following description, this directional convention is used exclusively to facilitate the explanation and the actual photovoltaic power generation device may be installed with any orientation.

(Overview of the Photovoltaic Power Generation Device)

An overall structure that may be adopted in the photovoltaic power generation device 1 equipped with the light concentrating optical element 10 achieved in the first embodiment or the light concentrating optical element 20 achieved in the second embodiment is briefly described. The photovoltaic power generation device, the external view of which is provided in perspective in FIG. 1, may instead include a light concentrating optical element 10 achieved in a third embodiment of the present invention or a light concentrating optical element 20 achieved in a fourth embodiment of the present invention, as will be explained later. The photovoltaic power generation device 1 comprises a light concentrating optical element 10 (20) that concentrates light entering along the thickness-wise direction (along the direction in which the y-axis extends) and photoelectric conversion elements 50, where light, having been concentrated at the light concentrating optical element and guided to the ends of the light concentrating optical element along the x-axis and/or the z-axis, undergoes photoelectric conversion. The photovoltaic power generation device 1 shown in FIG. 1 is configured by using a light concentrating optical element 10 (20) assuming plate form. The photoelectric conversion elements 50, which may be any photoelectric conversion elements among various elements known in the related art, may be configured by using a specific type of solar cell among various types of solar cells constituted of a silicon-based material, a compound-based material, an organic material, a dye-sensitized material and the like as described earlier.

(Overview of the Light Concentrating Optical Element)

The light concentrating optical element 10 (20) in FIGS. 1 and 2 is formed by dispersing a plurality of micro-optical members inside a substrate assuming plate form (or a panel form). The substrate includes a flat surface 10a (20a) located on the front side of the substrate and a flat surface 10b (20b) located on the back side of the substrate, which face opposite each other, and four side surfaces 10c (20c), 10d (20d), 10e (20e) and 10f (20f). The sides forming the edges of the front flat surface 10a (20a) and the back flat surface 10b (20b), which range two dimensionally, each have a length greater than the distance between the front flat surface 10a (20a) and the back flat surface 10b (20b) facing opposite each other, i.e., greater than the thickness of the light concentrating optical element 10 (20), by a sufficient extent. The front flat surface 10a (20a) and the back flat surface 10b (20b) each have a square shape or a rectangular shape, and the front flat surface 10a (20a) in particular, which functions as a sunlight entry surface, ranges over a large area so as to take in the maximum possible amount of sunlight. The photoelectric conversion elements 50 are disposed by the side surface 10c (20c) and the side surface 10d (20d) facing opposite each other, with one photoelectric conversion element 50 positioned so as to face opposite the side surface 10c (20c) and another photoelectric conversion element 50 positioned so as to face opposite the side surface 10d (20d). At the photoelectric conversion elements 50, light having exited through the side surface 10e (20c) and the side surface 10d (20d) is received and the received light undergoes photoelectric conversion. Namely, the side surfaces 10c (20c) and 10d (20d) of the substrate defines the ends facing opposite each other along the x-axis and/or the z-axis mentioned earlier. Sunlight having entered through the front flat surface 10a (20a) is concentrated inside the substrate and then exits through the side surface 10c (20c) and the side surface 10d (20d). Since the areal size of the side surface 10c (20c) and the side surface 10d (20d) is smaller than that of the front flat surface 10a (20a), the installation space taken up by the photoelectric conversion elements 50 can be minimized.

The main components constituting the light concentrating optical element 10 (20) include a substrate 11 (21) through which sunlight is transmitted and particulate micro-optical members 12 (22) having a light transmitting property, which are dispersed throughout the substrate. In the following description, the "substrate" may be otherwise referred to as a "medium". In addition, the "particulate micro-optical members" may simply be referred to as "particles". The particle diameter of the micro-optical members is set to approximately $0.1\lambda$ through $10\lambda$ for the diameter d of an equivalent circle, with $\lambda$ representing the wavelength of light entering the light concentrating optical element. If there is a variance in the wavelength $\lambda$ of the target light to be concentrated via the light concentrating optical element within a specific wavelength bandwidth, the particle diameter d of the micro-optical members in the light concentrating optical element may be set within a range of $1/10$ of the shortest wavelength $\lambda$min through 10 times the longest wavelength $\lambda$max in the wavelength band. In more specific terms, when the target light to be concentrated is sunlight, the radiation spectrum of which is approximately 400 nm through 1800 nm, the particle diameter d of the micro-optical members may be set in the range of approximately 40 nm through 20 μm.

While the micro-optical members are dispersed evenly over the entire light concentrating optical element (in a macroscopic view) along the x-axis, the y-axis and the z-axis, only micro-optical members 12 present on light paths of scattered light are shown in the schematic illustration provided in FIG. 2, so as to facilitate an explanation of the scattering of light induced via the micro-optical members 12. It is to be noted that the density at which the micro-optical members are distributed is set to the optimal level in correspondence to the materials constituting the substrate and the micro-optical members, the shapes and dimensions of the substrate and the micro-optical members, the operating conditions and the like. This point will be described in further detail later.

The substrate 11 (21) and the micro-optical members 12 (22) at the light concentrating optical element 10 (20) demonstrate refractive index characteristics different from each other, with at least either the substrate or the micro-optical members having a birefringence property. Unless specially noted otherwise, the refractive index for light advancing along the y-axis (along both the positive direction and the negative direction) with the electric field component thereof vibrating within the xy plane, the refractive index for light advancing along the x-axis (along both the positive direction and the negative direction) with the electric field component thereof vibrating within the xy plane, the refractive index for light advancing along an axis (along both the positive direction and the negative direction), inclined from the y-axis toward the x-axis with an angle $\varnothing$ ($0<\varnothing<90°$) with the electric field component thereof vibrating within the xy plane, the refractive index for light advancing along the y-axis (along both the positive direction and the negative direction) with the electric field component thereof vibrating within the zy plane and the refractive index for light advancing along the z-axis (along both the positive direction and the negative direction) with the electric field component thereof vibrating within the zy plane will be respectively notated as $n_{axy}$, $n_{ayx}$, $n_{ax\varnothing}$, $n_{azy}$ and $n_{ayz}$ in the following description. Likewise, unless specially noted otherwise, the refractive index for light advancing along the y-axis (along both the positive direction and the negative direction) with the electric field component thereof vibrating within the xy plane, the refractive index for light advancing along the x-axis (along both the positive direction and the negative direction) with the electric field component thereof vibrating within the xy plane, the refractive index for light advancing along the axis (along both the positive direction and the negative direction) inclined from the y-axis toward the x-axis with an angle $\varnothing$ with the electric field component thereof vibrating within the xy plane, the refractive index for light advancing along the y-axis (along both the positive direction and the negative direction) with the electric field component thereof vibrating within the zy plane and the refractive index for light advancing along the z-axis (along both the positive direction and the negative direction) with the electric field component thereof vibrating within the zy plane will be respectively notated as $n_{bxy}$, $n_{byx}$, $n_{bx\varnothing}$, $n_{bzy}$ and $n_{byz}$ in the following description.

In addition, with regard to the states of polarization, light with the electric field component thereof vibrating within the xy plane (the light with the electric field component thereof vibrating over a plane parallel to the drawing sheet on which FIG. 2 is provided) will be referred to as p-polarized light and light with the electric field component thereof vibrating within the zy plane (the light with the electric field component thereof vibrating over a plane perpendicular to the drawing sheet on which FIG. 2 is provided) will be referred to as s-polarized light in the following description, unless specially noted otherwise. Namely, the light that advances along the y-axis with the electric field component thereof vibrating within the xy plane is p-polarized light advancing along the y-axis, whereas the light that advances along the x-axis with the electric field component thereof vibrating within the xy plane is p-polarized light advancing along the x-axis. In addition, the light that advances along the y-axis with the electric field component thereof vibrating within the zy plane is s-polarized light advancing along the y-axis, whereas the light that advances along the z-axis with the electric field component thereof vibrating within the zy plane is s-polarized light advancing along the z-axis.

The substrate and the micro-optical members in the light concentrating optical element in the embodiment are designed so that the refractive index $n_{axy}$ and the refractive index $n_{bxy}$ are different from each other, that the refractive index $n_{axy}$ and the refractive index $n_{byx}$ are different from each other, that the refractive index $n_{ayx}$ and that the refractive index $n_{bx\varnothing}$ are equal to each other and that $\sin \varnothing > (1/n_{ax\varnothing})$ is true.

The micro-optical members 12 (22) at such a light concentrating optical element 10 (20) act as particles for p-polarized light entering the light concentrating optical element 10 (20) from above in FIG. 2 and advancing through the light concentrating optical element along the y-axis, since the refractive index $n_{axy}$ and the refractive index $n_{bxy}$ are different. The micro-optical members 12 (22) act as particles for p-polarized light advancing through the light concentrating optical element along the x-axis, since the refractive index $n_{ayx}$ and the refractive index $n_{byx}$ are different. However, the micro-optical members 12 (22) do not act as particles for p-polarized light advancing through the light concentrating optical element along the axis inclined from the y-axis toward the x-axis with the angle $\varnothing$, as the refractive index $n_{ax\varnothing}$ and that the refractive index $n_{bx\varnothing}$ are equal to each other.

The p-polarized light advancing along the y-axis and the p-polarized light advancing along the x-axis are affected differently by the presence of the micro-optical members depending upon the wavelength of the p-polarized light ($\lambda/n_{axy}$) advancing through the medium (substrate) and the particle diameter d of the particles (micro-optical members) dispersed in the medium.

In more specific terms, if the particle diameter d of the micro-optical members is smaller than the wavelength of the light propagating through the substrate by a sufficient extent, the Rayleigh scattering theory is applicable. If the particle diameter d of the micro-optical members is in an order approximately equal to that of the wavelength of the light propagating through the substrate, the Mie scattering theory is applicable. If the particle diameter d of the micro-optical members is greater than the wavelength of light propagating through the substrate by a sufficient extent, the geometric-optics theory is applicable.

The particle diameter d of the micro-optical members 12 (22) in the embodiment is set to approximately 1λ to 10λ for the diameter of an equivalent circle, the order of which is approximately equal to the order of the wavelength of the light propagating through the substrate, i.e., the medium. This means that Mie scattering theory can be basically applied to the relationship between the light propagating through the substrate and the micro-optical members at the light concentrating optical element 10 (20).

However, at least either the substrate 11 (21) or the micro-optical members 12 (22) at the light concentrating optical element 10 (20) have a birefringence property, and the light scattering condition changes in relation to the birefringence property, the azimuth of the major axis (the orientation of the fast axis or the slow axis along which a ray of light becomes an extraordinary ray), the direction along which light advances through the light concentrating optical element and the polarized light component in the light, and the like.

For the sake of simplification, an example in which either the substrate 11 is birefringent or the micro-optical members 12 are birefringent and there is a single major axis of birefringence (hereafter may be referred to as an optic axis) of birefringence, i.e., a uniaxial birefringence, is examined. A simple structural example whereby the refractive index $n_{axy}$ and the refractive index $n_{bxy}$ are different, the refractive index $n_{ayx}$ and the refractive index $n_{byx}$ are different and the refractive index $n_{ax\varnothing}$ and the refractive index $n_{bx\varnothing}$ are equal in such an instance is presented in FIG. 3.

Figure 3:
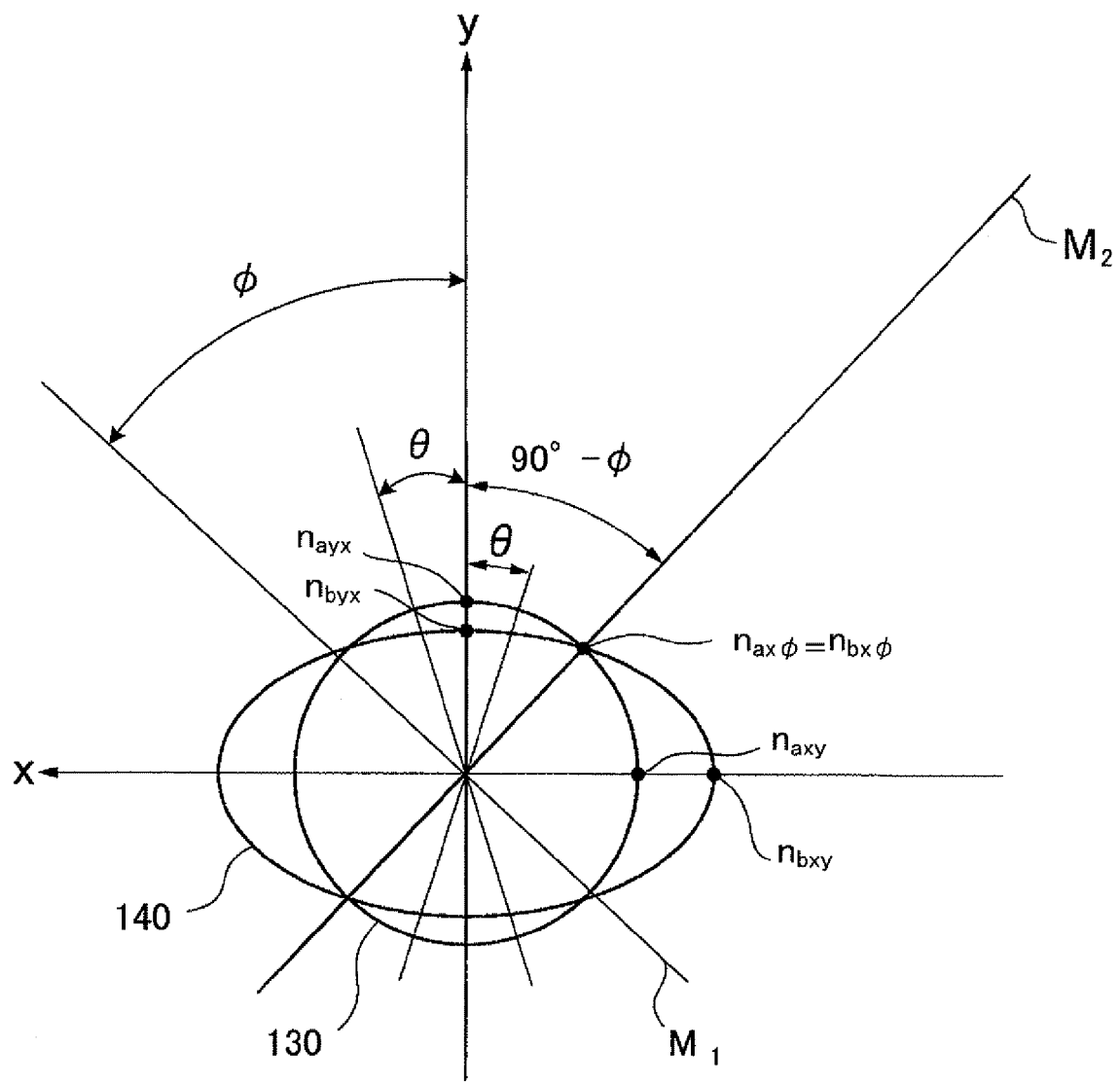
FIG. 3 provides a diagram illustrating an example of a relationship between the refractive index of the substrate and the refractive index of the micro-optical members.

FIG. 3 shows the refractive index characteristics (index ellipsoid) 130 of the substrate manifesting within the xy plane, the refractive index characteristics (index ellipsoid) 140 of birefringent micro-optical members manifesting within the xy plane, and the relationship between the refractive index characteristics 130 of the substrate and the reflective index characteristics 140 of the micro-optical members. As FIG. 3 indicates, the refractive index characteristics 130 of the substrate are represented by an index circle with a constant refractive index ($n_{axy}$=$n_{ax\varnothing}$=$n_{ayx}$) assumed in any direction, whereas the refractive index characteristics 140 (141 through 144) of the micro-optical members are represented by an index ellipsoid with varying refractive indices (e.g., $n_{bxy}$>$n_{bx\varnothing}$>$n_{byx}$) assumed along different directions. As FIG. 3 clearly indicates, $n_{axy}$≠$n_{bxy}$ and $n_{ayx}$≠$n_{byx}$. The index circle representing the refractive index characteristics of the substrate and the index ellipsoid representing the refractive index characteristics of the micro-optical members cross each other at angular positions inclined from the y-axis toward the x-axis by 90-Ø°. At these angular positions, the refractive index $n_{ax\varnothing}$ of the substrate and the refractive index $n_{bx\varnothing}$ of the micro-optical members are equal, i.e., $n_{ax\varnothing}$=$n_{bx\varnothing}$.

Since $n_{axy}$≠$n_{bxy}$, the micro-optical members act as particles for the p-polarized light advancing along the y-axis through the light concentrating optical element. Since $n_{ayx}$≠$n_{byx}$, the micro-optical members act as particles for the p-polarized light advancing along the x-axis through the light concentrating optical element. However, the micro-optical members do not act as particles for the p-polarized light advancing through the light concentrating optical element (substrate) along an index matching axis $M_1$ inclined from the y-axis toward the x-axis by the angle Ø, since the refractive index represented by the index circle (or ellipsoid) in FIG. 3 is assumed along the electric field component thereof vibrating direction, which is perpendicular to the light advancing direction, and the refractive index of the substrate and the refractive index of the micro-optical members match (are substantially equal to each other) with respect to light with the electric field component thereof vibrating along the direction in which the refractive index of the substrate and the refractive index of the micro-optical members match (along the direction in which an axis $M_2$ extends), i.e., with respect to light that advances along the index matching axis $M_1$ perpendicular to the axis $M_2$.

Figure 4B:
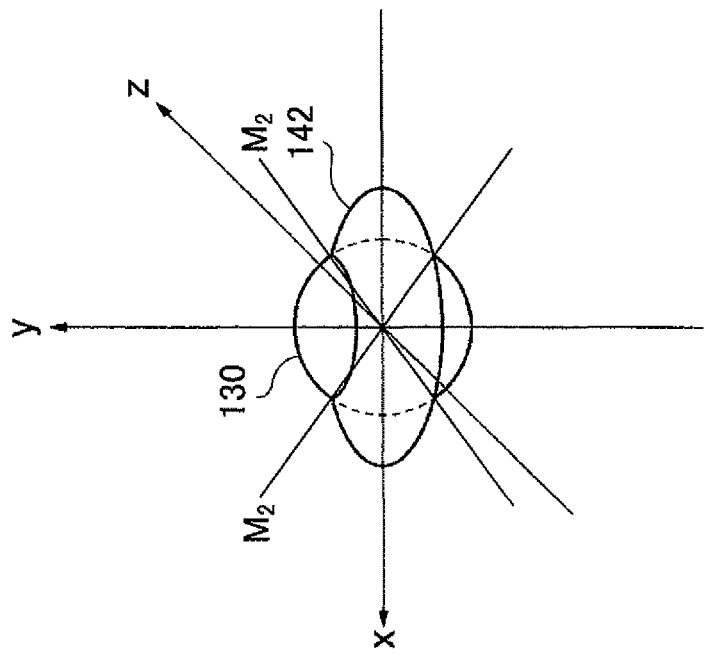
FIGS. 4A and 4B are illustrations each indicating a relationship that may exist between the index ellipsoid of the substrate and the index ellipsoid of the micro-optical members at a light concentrating optical element.
Figure 4A:
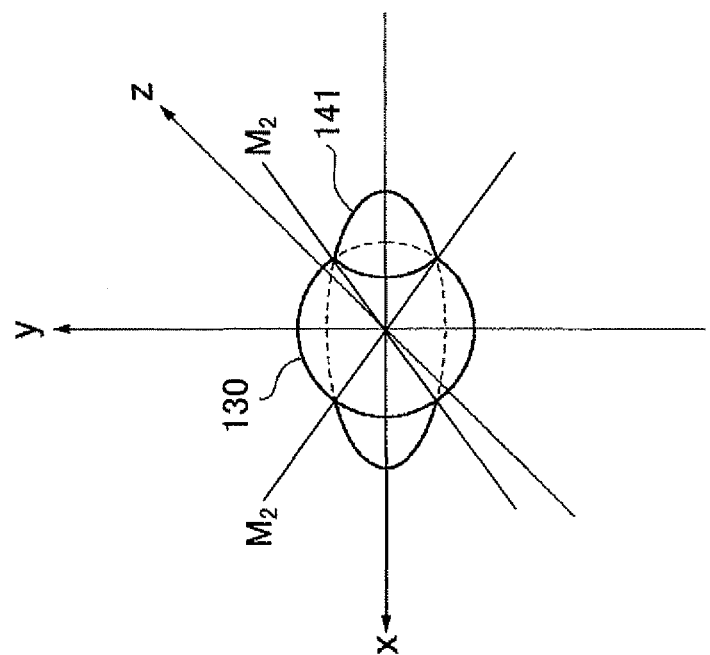

For the sake of simplicity, an explanation has been provided above on the relationship between the refractive indices in the xy plane. FIG. 4 provides conceptual diagrams of the index ellipsoids each indicating a relationship between the refractive indices in three-dimensional representation. FIG. 4A indicates the relationship between the index ellipsoid for the substrate and the index ellipsoid for the micro-optical members at a light concentrating optical element 10 with the micro-optical members manifesting positive birefringence (a birefringence property whereby the refractive index for an extraordinary ray is higher than the refractive index for an ordinary ray) 141 along the x-axis. FIG. 4B indicates the relationship between the index ellipsoid for the substrate and the index ellipsoid for the micro-optical members at a light concentrating optical element 10 with the micro-optical members manifesting negative birefringence (a birefringence property whereby the refractive index for an extraordinary ray is lower than the refractive index for an ordinary ray) 142 along the y-axis.

Figure 5A:
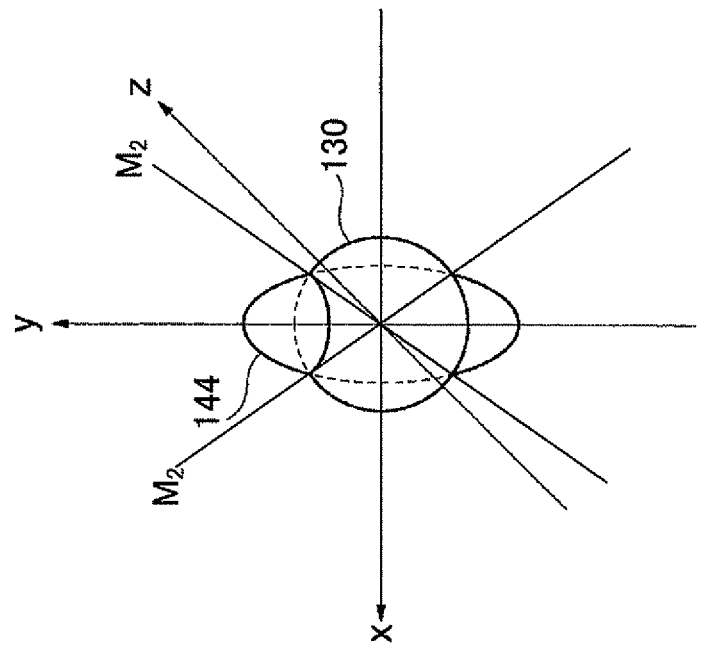
FIGS. 5A and 5B are illustrations each indicating a relationship that may exist between the index ellipsoid of the substrate and the index ellipsoid of the micro-optical members at a light concentrating optical element.
Figure 5B:
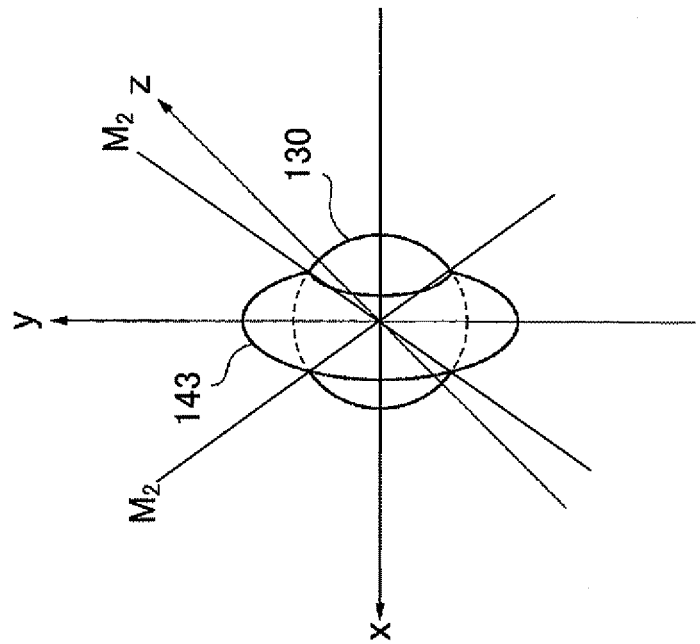

FIG. 5 presents other examples of relationships between the refractive indices that may be observed when $n_{axy}$≠$n_{bxy}$, $n_{ayx}$≠$n_{byx}$ and $n_{ax\varnothing}$≠$n_{bx\varnothing}$. FIG. 5A indicates the relationship between the index ellipsoid for the substrate and the index ellipsoid for the micro-optical members at a light concentrating optical element 20 with the micro-optical members manifesting negative birefringence 143 along the x-axis. FIG. 5B indicates the relationship between the index ellipsoid for the substrate and the index ellipsoid for the micro-optical members at a light concentrating optical element 20 with the micro-optical members manifesting positive birefringence 144 along the y-axis.

When the major axis of uniaxial anisotropic birefringence is oriented along the y-axis, a plurality of axes $M_2$, each connecting an intersection point at which the refractive index of the substrate and the refractive index of the micro-optical members are equal and the origin point of the xyz space to each other, are formed so as to achieve axial symmetry to each other around the y-axis, as indicated in FIG. 4B and FIG. 5B. In other words, the inclining angle of the axis $M_2$ extending within the xy plane, among the plurality of axes $M_2$, is equal to the inclining angle of the axis $M_2$ extending within the zy plane. Namely, the micro-optical members do not act as particles for p-polarized light advancing along an incline from the y-axis toward the horizontal axis (a direction perpendicular to the y-axis) by the angle Ø, i.e., p-polarized light advancing along the direction in which the index matching axis $M_1$ perpendicular to an axis $M_2$ extends, within any flat plane containing the y-axis. However, the micro-optical members do act as particles for light entering along the y-axis or light advancing along the horizontal direction.

When the major axis of uniaxial anisotropic birefringence is oriented along the x-axis, a plurality of axes $M_2$, each connecting an intersection point at which the refractive index of the substrate and the refractive index of the micro-optical members are equal and the origin point of the xyz space to each other, are formed so as to achieve axial symmetry to each other around the x-axis, as indicated in FIG. 4A and FIG. 5A. In other words, the inclining angle of the axis $M_2$ extending within the xy plane, among the plurality of axes $M_2$, is equal to the inclining angle of the axis $M_2$ extending within the xz plane. Namely, the micro-optical members do not act as particles for p-polarized light advancing along an incline from the x-axis toward the vertical axis (a direction perpendicular to the x-axis) by a predetermined angle, i.e., p-polarized light advancing along the direction in which the index matching axis $M_1$ perpendicular to an axis $M_2$ extends, within any flat plane containing the x-axis. However, the micro-optical members do act as particles for light entering along the x-axis or light advancing along the vertical direction.

While an explanation has been given on examples in which the light concentrating optical element includes birefringent micro-optical members, the principle of the theory described above is applicable to a light concentrating optical element having a birefringent substrate or a light concentrating optical element that includes a birefringent substrate and birefringent micro-optical members.

The following is a description of the light concentrating optical element 10, achieved in the first embodiment with the major axis of uniaxial anisotropic birefringence manifesting thereat oriented along the x-axis, as shown in FIG. 4A and FIG. 5A, and the light concentrating optical element 20 achieved in the second embodiment with the major axis of uniaxial anisotropic birefringence manifesting thereat oriented along the y-axis, as shown in FIG. 4B and FIG. 5B.

(Light Concentrating Optical Element Achieved in the First Embodiment)

Since $n_{axy} \neq n_{bxy}$, the micro-optical members 12 act as particles distinguishable from the medium (substrate 11) for p-polarized light advancing along the y-axis among rays of light having entered the light concentrating optical element 10 achieved in the first embodiment from above (as shown in FIG. 2) and advancing through the substrate. Since $n_{ayx} \neq n_{byx}$, the micro-optical members 12 also act as particles distinguishable from the medium for p-polarized light advancing along the x-axis among rays of light advancing through the substrate. However, since $n_{ax\varnothing} = n_{bx\varnothing}$, the micro-optical members 12 do not act as particles for p-polarized light advancing through the substrate along the index matching axis $M_1$ inclined from the y-axis toward the x-axis by the angle Ø. The state of the substrate in this instance is equivalent to one in which particles are nonexistent (i.e., equivalent to a state of homogeneity, in which there are no particles in the medium). In short, the micro-optical members 12 act as particles achieving a refractive index different from that of the substrate for p-polarized light advancing through the substrate along directions other than the direction in which the index matching axis $M_1$ extends.

As a result, rays of light in the light having entered the light concentrating optical element 10 and advancing through the substrate, except for p-polarized light (p-polarized light component) advancing through the substrate along the direction in which the index matching axis $M_1$ extends, become scattered through a Mie scattering phenomenon via the micro-optical members 12 acting as particles within the medium due to the difference between the refractive indices of the substrate and the micro-optical members. The p-polarized light advancing through the substrate along the index matching axis $M_1$, on the other hand, is allowed to continue to travel along the index matching axis $M_1$ without becoming scattered via the micro-optical members 12, since the micro-optical members 12 do not act as particles for the p-polarized light.

Figure 6:
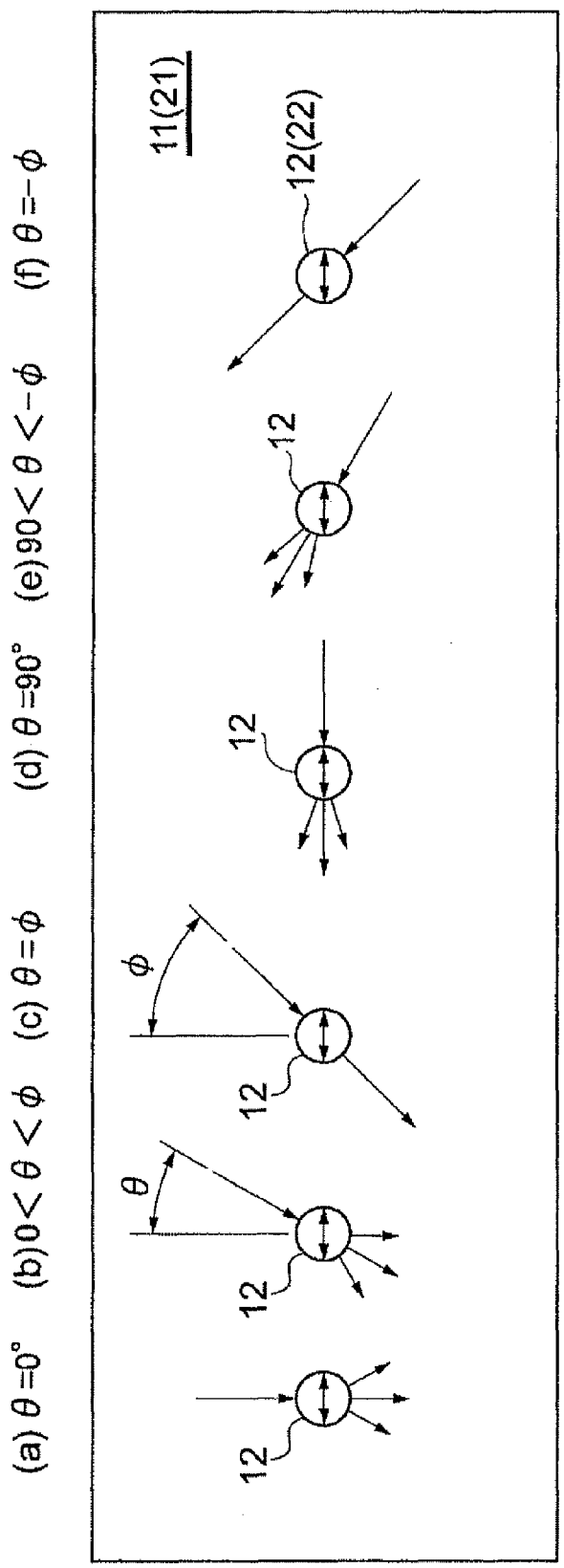
FIG. 6 is a schematic illustration of varying relationships between the angle of incidence at which light enters a light concentrating optical element and the scattering of light.

According to the present invention achieved by taking advantage of the difference in the refractive index resulting from the birefringence occurring as described above, the scattering cross section changes in correspondence to the angle of incidence at which light enters the micro-optical members 12, which, in turn, alters the scattering efficiency. FIG. 6 schematically illustrates the relationship between the angle of incidence at which light enters the micro-optical members 12 and the scattering of light.

As the example of the relationship between the refractive indices presented in FIG. 3 clearly indicates, a large extent of scattering occurs when the angle of incidence θ relative to the y-axis, at which light enters the micro-optical members 12 is equal to 0° or 90°, since the difference between the refractive indices of the substrate and the micro-optical members achieves a maximal value and the scattering cross section also achieves a maximal value under such circumstances (see (a) and (d) in FIG. 6). However, if the angle of incidence θ at which light enters the micro-optical members 12 is equal to the inclining angle Ø with which the index matching axis $M_1$ inclined, i.e., when θ=±Ø, there is no difference between the refractive index of the substrate and the refractive index of the micro-optical members and the scattering cross section assumes an infinitely small value. In this situation, no scattering of light occurs (see (c) and (f) in FIG. 6). The inclining angle of the axis $M_2$ is equal to the difference calculated by subtracting the index matching angle Ø formed by the index matching axis $M_1$ relative to the y-axis from 90°.

When the angle of incidence θ at the micro-optical member 12 is in a middle range, e.g. 0<θ<Ø or Ø<θ<90°, a scattering cross section corresponding to the difference between the refractive index of the substrate 11 and the refractive index of the micro-optical members 12 at the particular angle of incidence is assumed and the scattering efficiency is altered accordingly (see (b) and (e) in FIG. 6). FIG. 6 (also in FIG. 2), in which the light that is diffused through scattering is expressed with three vectors, i.e., one representing light advancing straight ahead along the axis of the incident light and the other two representing two light beams spreading to the left and right away from the axis of the incident light, indicates that the scattering efficiency decreases when the angle of incidence θ is closer to the inclining angle Ø of the index matching axis $M_1$, to result in a decrease in the rate at which scattered light spreads to the left or the right and that no scattering of light occurs when θ=Ø.

At the light concentrating optical element 10 structured as described above, light having entered the light concentrating optical element 10 from above and advancing as p-polarized light along the y-axis becomes scattered through a Mie scattering phenomenon via the micro-optical members 12 present in the substrate (medium) 11 acting as particles, as shown in FIG. 2. Through this process, 40% of the incident light, for instance, may be scattered via the micro-optical members 12 present near the surface. Even rays of light having bypassed these micro-optical members 12 are subsequently scattered at a rate of for instance, 40% by micro-optical members 12 disposed at the next stage among the micro-optical members 12 distributed along the thickness-wise direction. In other words, multiple light scattering, whereby light having been scattered by micro-optical members 12 becomes further scattered via micro-optical members present at the next stage among the micro-optical members distributed along the thickness-wise direction occurs.

As a result, the ratio of light continuing to advance along the y-axis (along the vertical direction in FIG. 2) through the light concentrating optical element 10, to all the light initially having entered the light concentrating optical element 10 along the y-axis, decreases and, instead, the ratio of light inclining downward along diagonal directions over the xy plane increases. The scattering efficiency with which light inclining toward the x-axis over the positive range or the negative range decreases as the angle of incidence θ at which light enters micro-optical members 12 becomes closer to the inclining angle Ø of the index matching axis $M_1$, leading to a smaller extent of change in the angle attributable to light scattering and an increase in the ratio of light advancing along the index matching axis $M_1$. When the angle of incidence θ is equal to the inclining angle Ø of the index matching axis $M_1$, light advancing along the index matching axis $M_1$ is allowed to continue to travel toward the bottom surface of the light concentrating optical element 10 without becoming scattered via the micro-optical members 12.

The substrate 11 and the micro-optical members 12 at the light concentrating optical element 10 are designed so as to achieve a condition expressed as; sin Ø>(1/$n_{ax\emptyset}$). Namely, they are designed so that the angle of incidence of light entering the bottom surface of the light concentrating optical element 10 with an inclination from the y-axis toward the x-axis by an extent matching the angle Ø will be greater than the critical angle of total reflection occurring at the interface between the substrate 11 and the air. For instance, the substrate 11 and the micro-optical members 12 may be designed so that the inclining angle Ø of the index matching axis $M_1$ is equal to or greater than 38° when the critical angle of total reflection occurring at the interface between the substrate 11 and the air is 38°.

With the substrate 11 and the micro-optical members 12 designed as described above, light having reached the bottom surface of the light concentrating optical element 10 with an inclination from the y-axis toward the x-axis at the angle Ø is totally reflected at the bottom surface. While the light totally reflected at the bottom surface of the light concentrating optical element 10 advances from the bottom surface toward the top surface side, it is bound to reenter micro-optical members 12. The light enters the micro-optical members 12 at this time with an angle of incidence θ=−Ø (θ=180−Ø) and thus, the light continues to travel toward the top surface of the light concentrating optical element 10 without becoming scattered via the micro-optical members 12. The angle of incidence of light having reached the top surface of the light concentrating optical element 10, too, will be equal to or greater than the critical angle of total reflection, as is the angle of incidence of light having reached the bottom surface of the light concentrating optical element 10. Thus, once light enters the light concentrating optical element 10, it is trapped inside the light concentrating optical element 10 and is repeatedly propagated through the light concentrating optical element as it is totally reflected at the top surface and at the bottom surface of the light concentrating optical element 10.

Through these measures, the light constituted with the p-polarized light component, having entered the light concentrating optical element 10 from above, is ultimately directed either to the left or to the right along the x-axis in its entirety. Light having been concentrated in this manner is guided to the photoelectric conversion elements 50 and 50 disposed at the ends of the light concentrating optical element 10 facing opposite each other along the x direction and then enters the photoelectric conversion elements 50 and 50 as concentrated light.

Light constituted with the s-polarized light component having entered the light concentrating optical element 10 through its top surface and advancing along the y-axis does not undergo a scattering process such as that described above, and instead, it exits the light concentrating optical element 10 through the bottom surface of the light concentrating optical element 10. By disposing another light concentrating optical element similar to the light concentrating optical element 10 further below relative to the bottom surface of the light concentrating optical element 10 with the lower light concentrating optical element rotated by 90° around the y-axis, the light constituted with the s-polarized light component having been transmitted through the upper light concentrating optical element can be concentrated with a high level of efficiency within the lower light concentrating optical element. A light concentrating device configured with two such light concentrating optical elements will be described in detail later.

(Light Concentrating Optical Element Achieved in the Second Embodiment)

The light concentrating optical element 20 in the second embodiment is structured by orienting the major axis of the uniaxial anisotropic birefringence manifesting therein along the y-axis (see FIG. 4B and FIG. 5B). The p-polarized light among rays of light entering such a light concentrating optical element 20 to advance through the substrate is scattered in much the same way as the p-polarized light scattered at the light concentrating optical element 10 in the first embodiment described earlier.

Namely, since $n_{axy} \neq n_{bxy}$, the micro-optical members 22 act as particles distinguishable from the medium for p-polarized light advancing along the y-axis among rays of light having entered the light concentrating optical element 20 from above and advancing through the substrate. Since $n_{ayx} \neq n_{byx}$, the micro-optical members 22 act as particles distinguishable from the medium for p-polarized light advancing along the x-axis among rays of light advancing through the substrate. However, since $n_{ax\emptyset} = n_{bx\emptyset}$, the micro-optical members 22 do not act as particles for p-polarized light advancing through the substrate along the index matching axis $M_1$ (a direction perpendicular to the axis $M_2$) inclined from the y-axis toward the x-axis by the angle Ø. The state of the substrate in this instance is equivalent to one in which particles are nonexistent.

A phenomenon similar to that described above also occurs involving s-polarized light having entered the light concentrating optical element 20 to advance through the substrate. At the light concentrating optical element 20, the major axis of the uniaxial anisotropic birefringence occurring therein is oriented along the y-axis, and axial symmetry centered on the y-axis is achieved by the refractive index of the substrate 21 and the refractive index of the micro-optical members 22. For this reason, a phenomenon similar to that described above also occurs in the zy plane ranging perpendicular to the xy plane.

In more specific terms, the micro-optical members 22 act as particles distinguishable from the medium (substrate 21) for light among rays of light having entered the light concentrating optical element 20 from above and advancing through the substrate, which advances along the y-axis with the electric field component thereof vibrating within the zy plane (i.e., p-polarized light advancing along the y-axis in the zy plane), since $n_{azy} \neq n_{bzy}$. The micro-optical members 20 also act as particles distinguishable from the medium (substrate 21) for light among rays of light advancing through the substrate, which advances along the z-axis with the electric field component thereof vibrating within the zy plane (i.e., p-polarized light advancing along the z-axis in the zy plane), since $n_{ayz} \neq n_{byz}$.

At the light concentrating optical element 20 achieved in the embodiment, in conjunction with which a plurality of axes $M_2$ are formed so as to achieve axial symmetry, centered on the y-axis, with respect to each other, the micro-optical members 22 do not act as particles for light advancing along an axis inclined from the y-axis toward the z-axis by an angle γ with the electric field component thereof vibrating within the zy plane (i.e., p-polarized light advancing along the index matching axis $M_1$) since $n_{az\gamma} = n_{bz\gamma}$. While the angle γ is set equal to the angle Ø in the embodiment, the angle γ does not need to match the angle Ø.

The p-polarized light having entered the light concentrating optical element 20 and advancing through the substrate along a direction other than the direction in which the index matching axis $M_1$ extends, becomes scattered through a Mie scattering phenomenon via the micro-optical members 22 acting as particles within the medium due to the difference between the refractive indices of the substrate and the micro-optical members. The p-polarized light advancing through the substrate along the index matching axis $M_1$, on the other hand, is allowed to continue to travel along the index matching axis $M_1$ without becoming scattered via the micro-optical members 22, since the micro-optical members do not act as particles for the p-polarized light. The scattering cross section at the micro-optical members 22 changes in correspondence to the angle of incidence at which light enters the micro-optical members 22 and scattering occurs in much the same way as that described in reference to FIG. 6, except that the change in the scattering cross section occurs with axial symmetry.

In more specific terms, a large extent of scattering occurs when the angle of incidence θ relative to the y-axis, at which light enters the micro-optical members 22 is equal to 0° or 90°, since the difference between the refractive indices of the substrate and the micro-optical members achieves a maximal value and the scattering cross section also achieves a maximal value under such circumstances (see FIG. 3 and (a) and (d) in FIG. 6). However, if the angle of incidence θ at which light enters the micro-optical members 22 is equal to the inclining angle Ø with which the index matching axis $M_1$ inclines, there is no difference between the refractive index of the substrate and the refractive index of the micro-optical members and the scattering cross section assumes an infinitely small value. In this situation, no scattering of light occurs (see FIG. 3 and (c) and (f) in FIG. 6). When the angle of incidence θ at the micro-optical members 22 is in a middle range, e.g., 0<θ<Ø or Ø<θ<90°, a scattering cross section corresponding to the difference between the refractive index of the substrate 21 and the refractive index of the micro-optical members 22 at the particular angle of incidence is assumed and the scattering efficiency is altered accordingly (see FIG. 3 and (b) and (e) in FIG. 6).

Thus, light having entered the light concentrating optical element 20 from above and advancing along the y-axis undergoes the process of multiple scattering via a plurality of micro-optical members 22 distributed through the substrate 21 along the thickness-wise direction, which act as particles within the substrate 21. The ratio of p-polarized light (light constituted with the p-polarized light component) advancing through the light concentrating optical element 20 along the y-axis (along the vertical direction in FIG. 2) decreases further into the light concentrating optical element 20 while the ratio of light inclining downward toward the positive range of the x-axis or the negative range of the x-axis within the xy plane increases. The ratio of s-polarized light (light constituted with the s-polarized light component) advancing along the y-axis through the light concentrating optical element 20 to the rays of s-polarized light in FIG. 2 decreases further into the light concentrating optical element 20, and the ratio of s-polarized light inclining downward along diagonal directions toward the positive range of the z-axis or the negative range of the z-axis within the zy plane increases.

The scattering efficiency with which these inclining light rays are scattered decreases as the angle of incidence θ at which light enters the micro-optical members 22 becomes closer to the inclining angle Ø of the index matching axis $M_1$, leading to a smaller extent of change in the angle attributable to light scattering and an increase in the ratio of light advancing along the index matching axis $M_1$. When the angle of incidence θ is equal to the inclining angle Ø of the index matching axis $M_1$, light advancing along the index matching axis $M_1$ is allowed to continue to travel toward the bottom surface of the light concentrating optical element 20 without becoming scattered via the micro-optical members 22.

The substrate 21 and the micro-optical members 22 at the light concentrating optical element 20 are designed so as to achieve conditions expressed as; sin Ø>$(1/n_{ax\varnothing})$ and sin Ø>$(1/n_{ax\varnothing})$. Namely, they are designed so that the angle of incidence of light entering the lower surface of the light concentrating optical element 20 with an inclination from the y-axis toward the z-axis by an extent matching the angle Ø will be greater than the critical angle of total reflection occurring at the interface between the substrate 21 and the air. While the angle γ is set equal to the angle Ø in the embodiment, the angle γ does not need to match the angle Ø, as explained earlier. In conjunction with the angle γ and the angle Ø taking different values, the substrate 21 and the micro-optical members 22 at the light concentrating optical element 20 should be designed so as to achieve conditions expressed as; sin γ>$(1/n_{ax\gamma})$ and sin γ>$(1/n_{az\gamma})$.

With the substrate 21 and the micro-optical members 22 designed as described above, light having reached the bottom surface of the light concentrating optical element 20 by inclining from the y-axis toward the z-axis at the angle Ø is totally reflected at the bottom surface. While light having been totally reflected at the bottom surface of the light concentrating optical element 20 advances from the bottom surface toward the top surface side, it is bound to reenter micro-optical members 22. The light enters the micro-optical member 22 at this time with an angle of incidence θ=−Ø (θ=180−Ø) and thus, the light continues to travel toward the top surface of the light concentrating optical element 20 without becoming scattered via the micro-optical members 22. The angle of incidence of light having reached the top surface of the light concentrating optical element 20, too, will be equal to or greater than the critical angle of total reflection, as is the angle of incidence of light having reached the bottom surface of the light concentrating optical element 20. Thus, once light enters the light concentrating optical element 20, it is trapped inside the light concentrating optical element 20 and is repeatedly propagated through the light concentrating optical element as it is totally reflected at the top surface and at the bottom surface of the light concentrating optical element 20.

As a result, the p-polarized light among the rays of light having entered the light concentrating optical element 20 along the y-axis, advances either to the left or to the right along the x-axis substantially in its entirety, whereas the s-polarized light among the rays of light having entered the light concentrating optical element 20 along the y-axis advances either to the front or to the back along the z-axis substantially in its entirety. The light having been concentrated as described above then enters, as concentrated rays, photoelectric conversion elements 50, 50, 50 and 50 disposed at the ends along the x-axis and at the ends along the z-axis.

Through this process, light having entered through the top surface of the light concentrating optical element 20 is scattered along the x-axis and the z-axis due to the difference between the refractive index of the substrate 21 and the refractive index of the micro-optical members 22, the scattered light is directed toward the photoelectric conversion elements and the scattered light is then guided as concentrated light rays into the photoelectric conversion elements 50 disposed at the ends located on the opposite sides along the x-axis and the z-axis. As a result, a light concentrating device, capable of concentrating light along the x-axis and the z-axis with a high level of efficiency, can be configured with a simple structure requiring only a single light concentrating optical element.

(Size Parameter)

Next, the optimal structures that may be adopted for the substrates 11 and 21 and the micro-optical members 12 and 22 are described in more specific detail based upon the Mie scattering theory. A detailed explanation of the Mie scattering theory itself, which is explained in detail in, for instance, Chapter 6, Volume 1 of the "Handbook of Optics" compiled by the OSA (Optical Society of America), published in 1995 (McGraw-Hill Inc.), is not included in this description. At the light concentrating optical element 10 (20), the particle diameter d of the micro-optical members is set in a range of 0.1λ through 10λ, i.e., in an order substantially matching the order of the wavelength λ of the incident light so as to induce scattering of light and guide light having undergone multiple forward scattering toward the sides of the light concentrating optical element. During this process, it is desirable to efficiently concentrate light at the light concentrating optical element assuming a thickness equal to or less than a predetermined thickness by suppressing backward scattering (loss) and thus allowing forward scattering to occur as the dominant phenomenon. In the Mie scattering theory, a size parameter α is used as an index pertaining to the distribution of the scattered light.

The size parameter α can normally be defined as expressed in (1) below by using the particle size (diameter) d of the micro-optical members, the wavelength (λ/n) of light advancing through the medium and the refractive index n of the medium (substrate). In this description, the particle diameter d of the micro-optical members is defined as the particle diameter detected most frequently in the frequency distribution (mode diameter), which is equivalent to the diameter of a circle as microscopically analyzed in conformance to Japanese Industrial Standards JIS-Z8901 "Test powders and test particles". At the light concentrating optical element 10 (20) achieved in the embodiment, the substrate 11 does not have a birefringence property and the refractive index of the medium n is constant, i.e., $n=n_{axy}=n_{ayx}=n_{azy}$.

$$\alpha=(\pi \times d)/(\lambda/n)=(\pi \times d \times n)/\lambda \tag{1}$$

Figure 7:
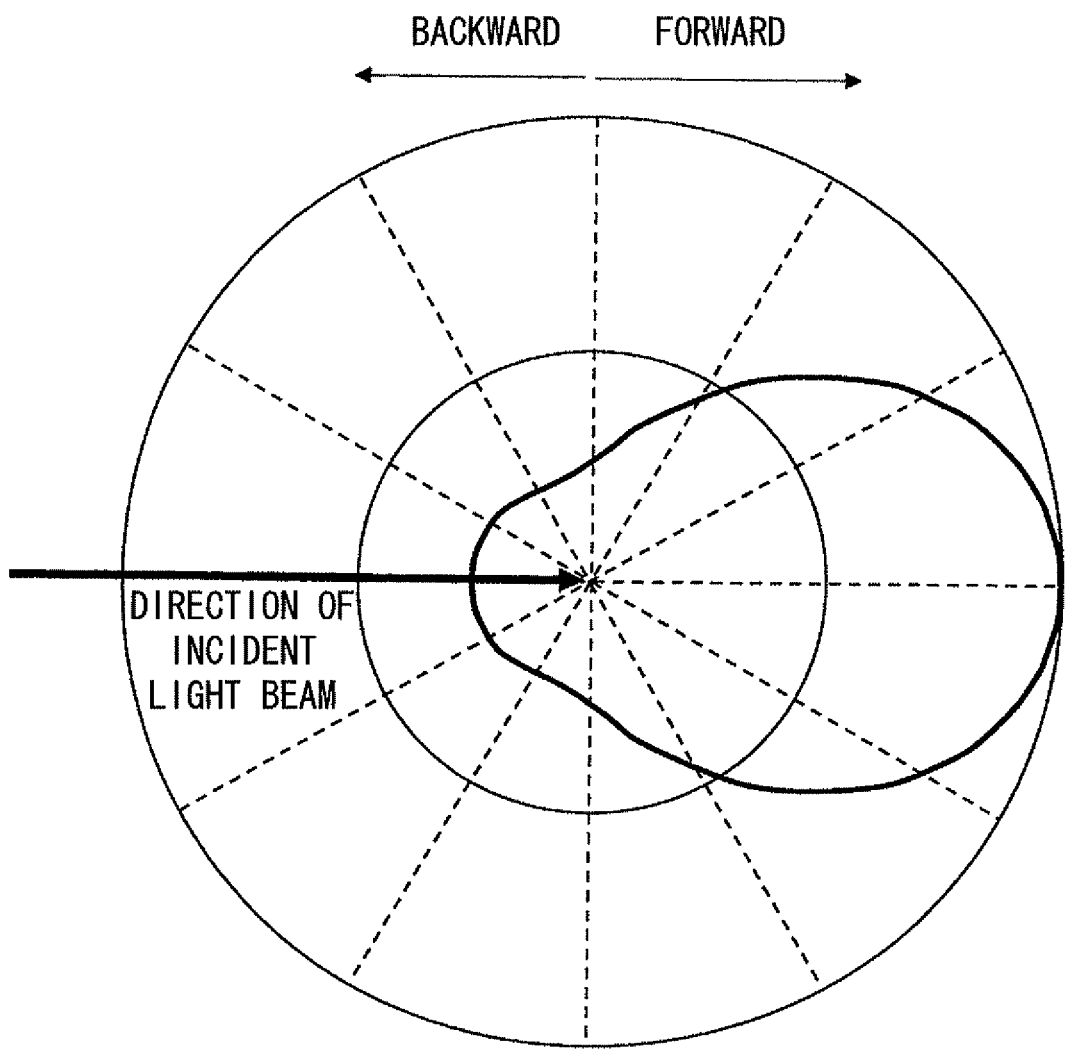
FIG. 7 is a graph presenting an example of distribution of light scattered via particles with a particle diameter of 0.15 µm.
Figure 8:
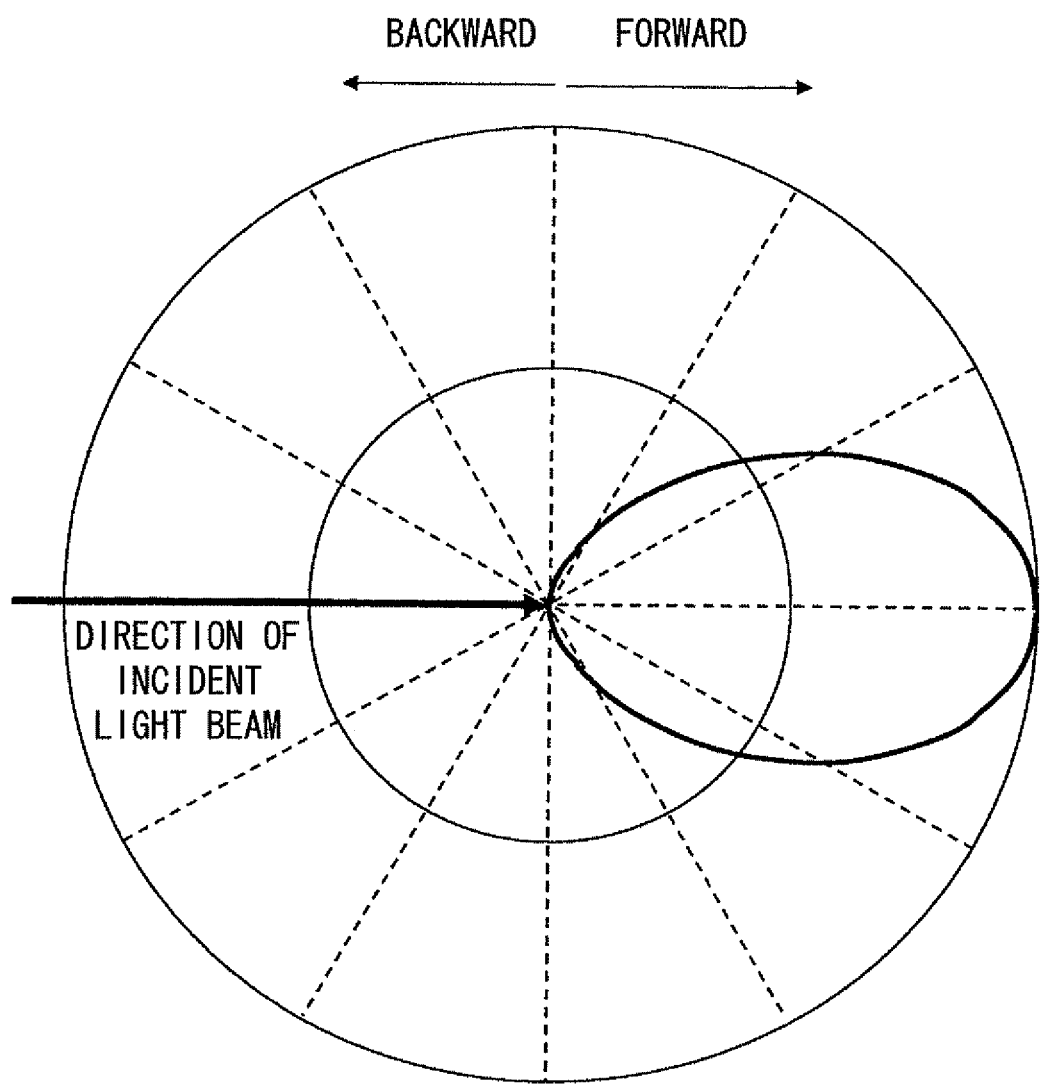

FIG. 7 and FIG. 8 each provide simulation obtained based upon the Mie scattering theory, indicating how light having entered from the left is scattered via a particle disposed at the center of the circle (how scattered light is distributed), as standardized distribution range along the forward 0° direction relative to the incident light. The half circle on the right side relative to the center of the circle represents the forward range, the half circle on the left side relative to the center of the circle represents the backward range and the dotted lines indicate angles of azimuth set over 30° intervals. Common conditions set with regard to the particles, the medium and the incident light, applicable to the data provided in the two figures are as follows.

the refractive index of the particles $n_{bxy}=1.88$
refractive index of the medium $n_{axy}=1.64$
wavelength of the incident light λ=633 nm The data provided in FIG. 7 and the data provided in FIG. 8 were obtained through simulation in correspondence to different particle diameters d, with the data in FIG. 7 having been obtained in correspondence to the particle diameter d set to 0.15 μm and the data in FIG. 8 having been obtained in correspondence to the particle diameter d set to 0.3 μm. Values for the size parameter α can be calculated as below by substituting these values for d in expression (1).

size parameter α=1.22 for the data presented in FIG. 7
size parameter α=2.44 for the data presented in FIG. 8

Figure 9:
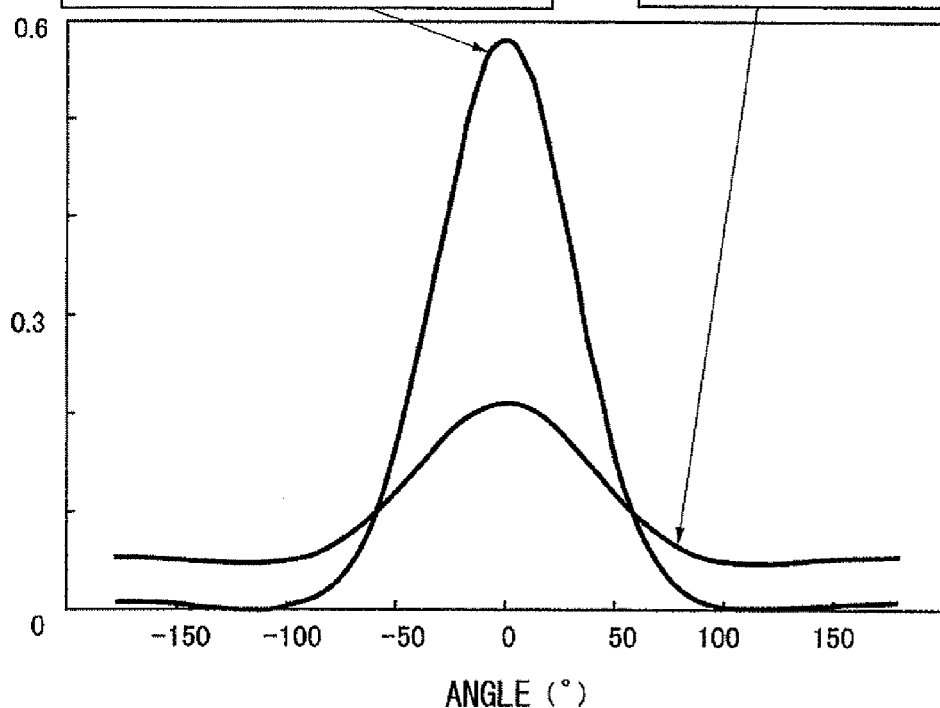
FIG. 9 is a graph indicating the scattered light distributions in FIG. 7 and FIG. 8 in an alternative mode of presentation.

FIG. 9 presents a diagram of the scattered light distribution in FIG. 7 and the scattered light distribution in FIG. 8, re-plotted in a graph with the horizontal axis thereof ranging through 180° to the left and through 180° to the right with 0° representing the angle of incidence and the vertical axis thereof representing the ratio of distribution.

FIGS. 7 through 9 indicate that scattered light is distributed very differently when the size parameter α is 1.22 (see FIG. 7) and when the size parameter α is 2.44 (see FIG. 8), and that the light is scattered with wide-ranging scattering angles in the forward direction and the backward direction and light scattered forward is dispersed over a greater range when the size parameter α is equal to 1.22, whereas hardly any backward scattering occurs and light scattered forward is dispersed to a lesser extent when the size parameter α is equal to 2.44.

Figure 10A:
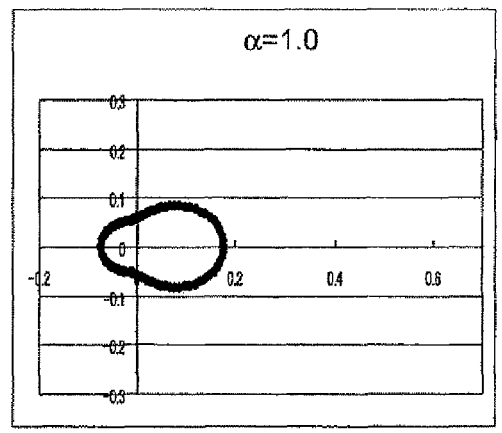
FIGS. 10A, 10B, 10C and 10D are graphs showing how the scattered light distribution may change as the size parameter is altered.
Figure 10B:
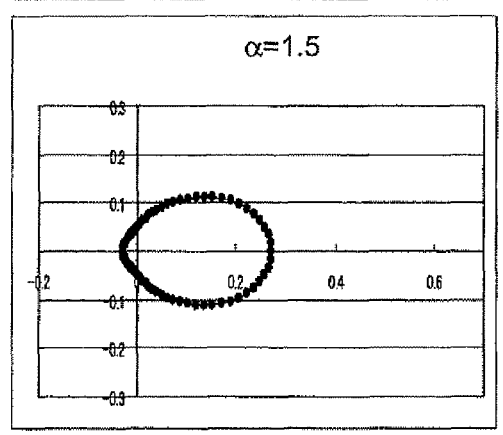
Figure 10C:
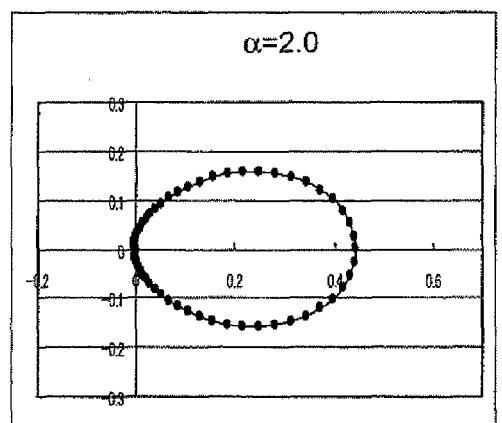
Figure 10D:
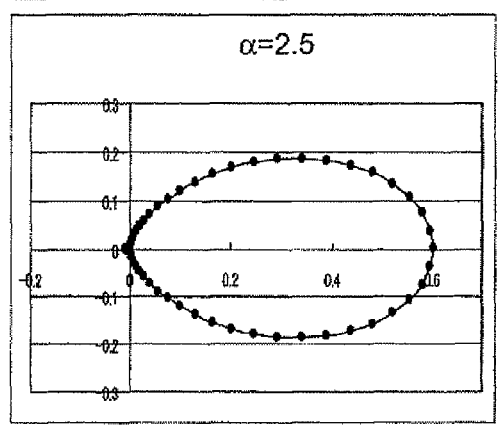
Figure 11:
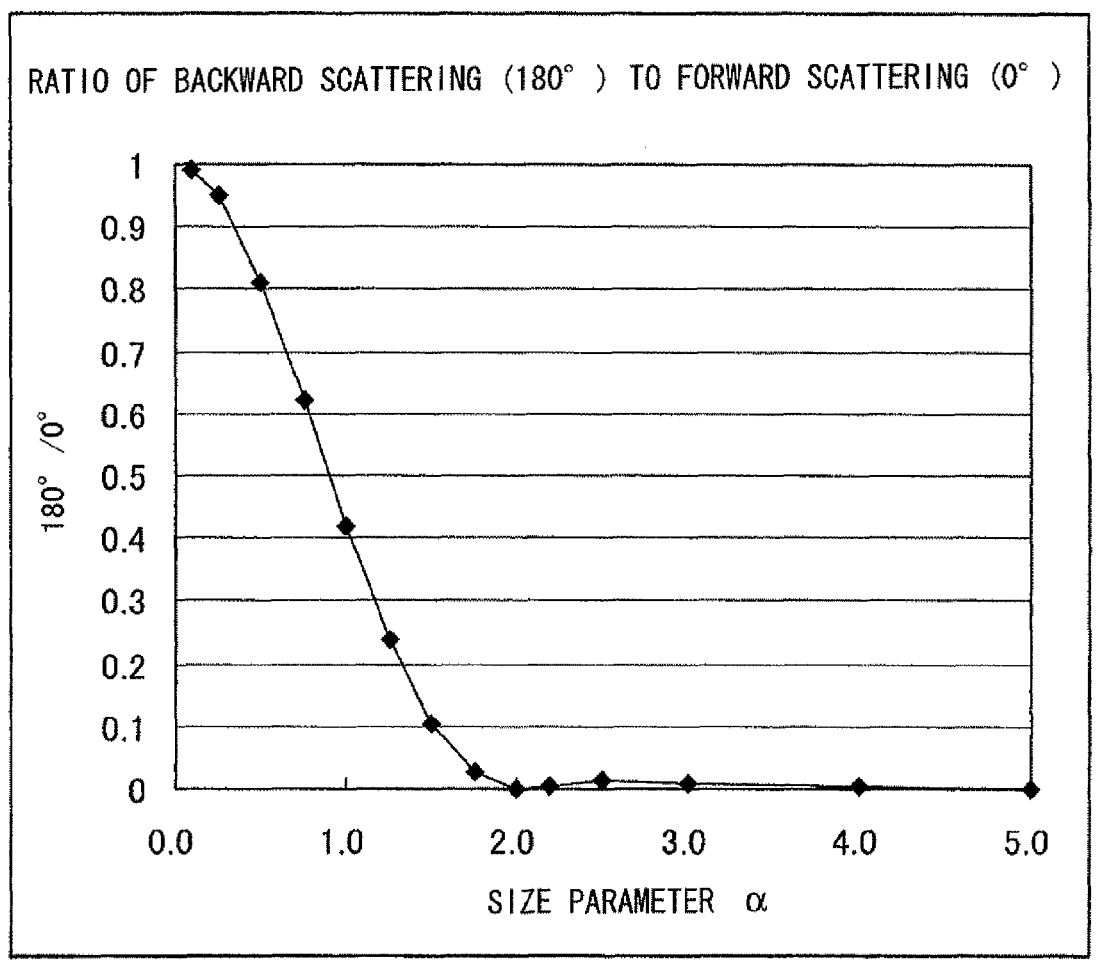
FIG. 11 is a graph indicating the relationship between the size parameter and the ratio of backward scattering to forward scattering.

FIGS. 10A through 10D indicate distributions of scattered light that may occur as the size parameter α is varied (i.e., as the particle diameter d is altered) under the common conditions outlined earlier, without standardizing the state of light scattering. FIG. 10A indicates a scattered light distribution occurring when α=1.0, FIG. 10B indicates a scattered light distribution occurring when α=1.5, FIG. 10C indicates a scattered light distribution occurring when α equals 2.0 and FIG. 10D indicates a scattered light distribution occurring when α=2.5. FIG. 11 is a graph achieved by plotting the ratio of light scattered along the backward 180° direction relative to the ratio of light scattered along the forward 0° direction as the size parameter α is altered under the common conditions outlined earlier.

FIGS. 10A, 10B, 10C and 10D and FIG. 11 indicate that when the size parameter α is equal to or greater than 1.5, the ratio of forward scattering exceeds approximately 90 percent and thus, forward scattering becomes the dominant phenomenon. In addition, once the size parameter α takes on a value equal to or greater than 2, the ratio of backward scattering to forward scattering becomes almost equal to 0.

However, while the ratio of forward scattering along the 0° direction increases when the size parameter α takes on a greater value, the scattering angle becomes smaller (narrower) at a greater size parameter value. The smaller scattering angle is bound to work as a negative factor against assurance of a sufficiently high level of orientation accuracy for a birefringent member when manufacturing the light concentrating optical element 10 (20) and against optimization of the dimension along the thickness-wise direction required in order to fulfill total reflection conditions for light reaching the bottom surface of the light concentrating optical element. In other words, the most desirable balance between maximization of forward scattering and the scattering angle cannot be achieved simply by setting the size parameter α to the maximum value equal to or greater than a predetermined value, but instead, the size parameter α needs to take on a value within a specific range so as to strike the best balance in practical application.

Figure 12:
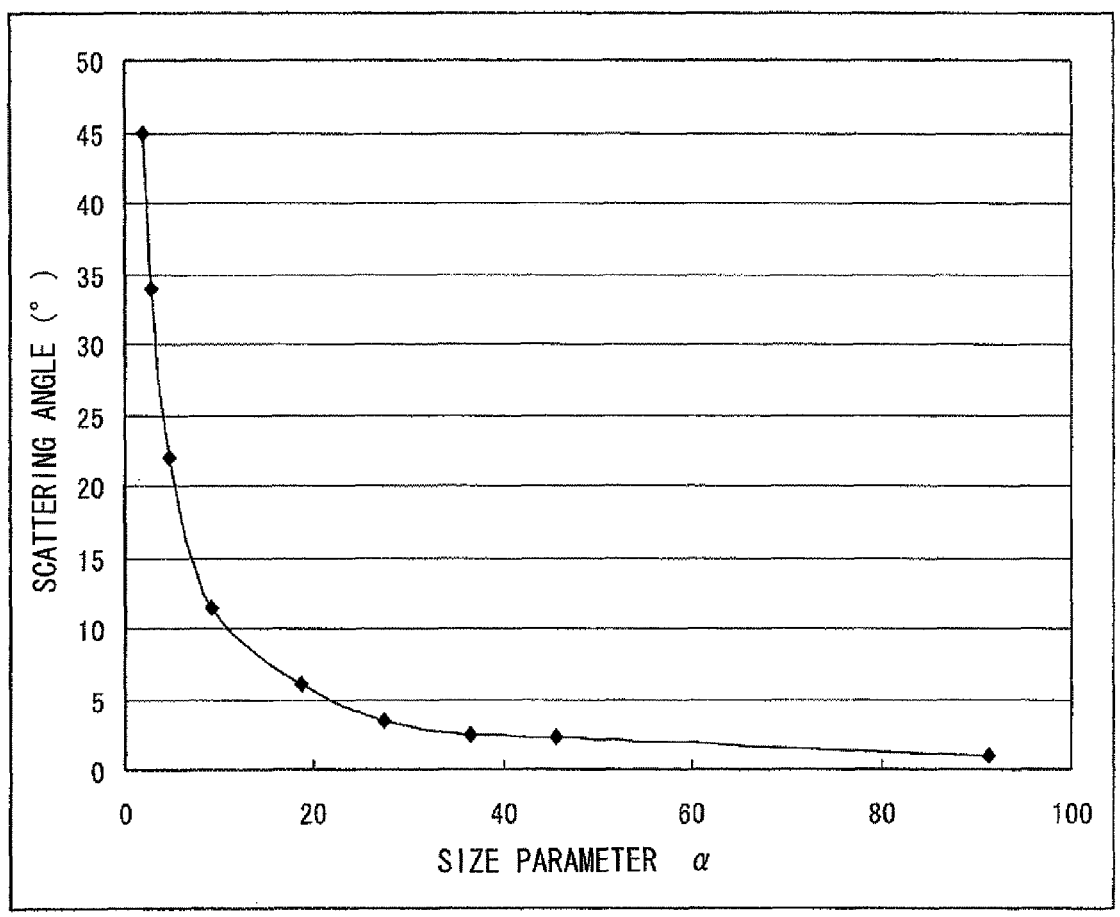
FIG. 12 is a graph indicating the relationship between the size parameter and the scattering angle.

FIG. 12 presents a graph indicating the relationship between the size parameter α and the scattering angle observed under the common conditions explained earlier. An angular accuracy (the angular accuracy in the manufacturing process) of approximately 1 to 2° is usually assured while manufacturing a birefringent member (the substrate or the micro-optical members), and the scattering angle achieved via the particles must exceed this. FIG. 12 indicates that the upper limit to the value taken for the size parameter α, calculated based upon the manufacturing angular accuracy currently accepted as the norm, is around 50.

Figure 13:
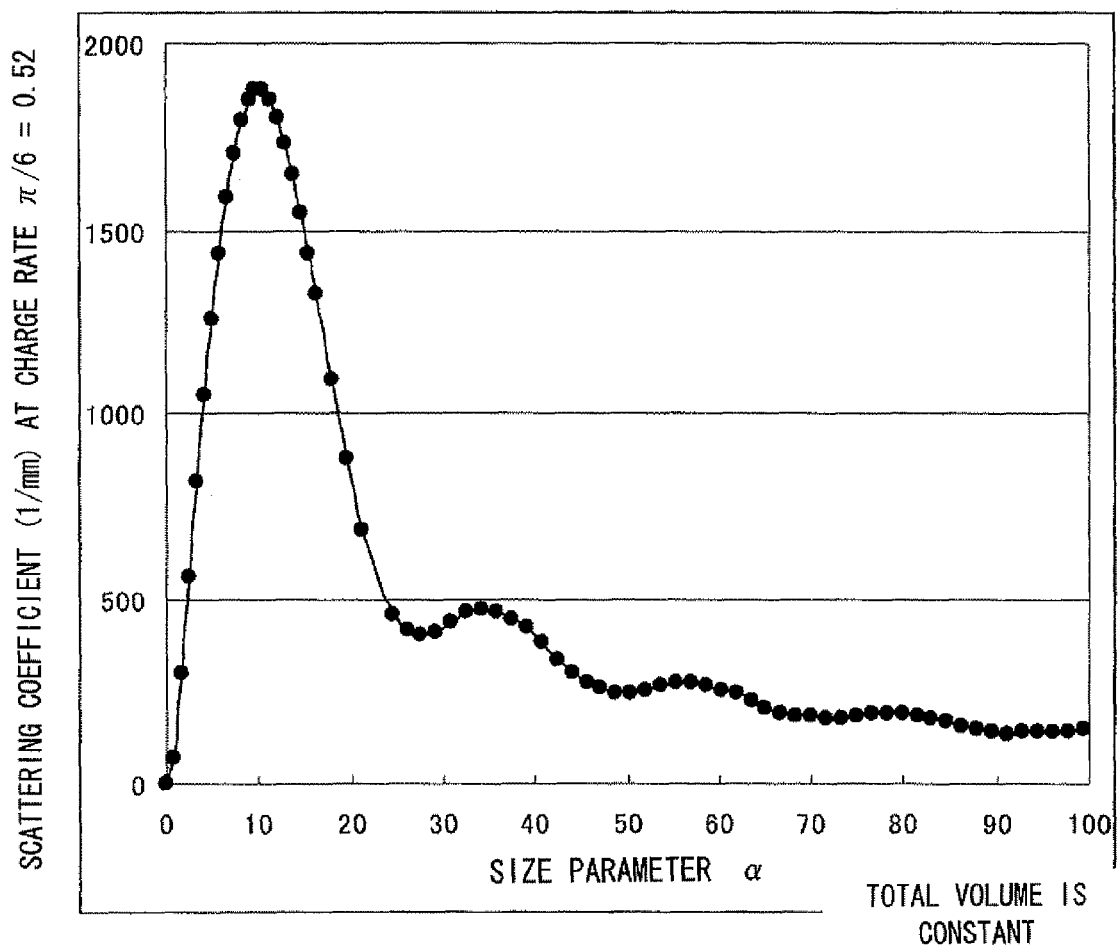
FIG. 13 is a graph indicating the relationship between the size parameter and the scattering coefficient manifesting when the volume remains constant.

FIG. 13 indicates the relationship between the size parameter α and the scattering coefficient observed at a light concentrating optical element assuming a constant volume and filled with particles at a constant charge rate ($\pi/6$). At a greater scattering coefficient, the light concentrating optical element is allowed to assume a smaller thickness and, in such a case, a smaller quantity of birefringent material is required. FIG. 13 indicates that the scattering coefficient takes on the largest value when the size parameter α is equal to approximately 10, as long as the particle charge rate remains constant. The scattering coefficient should never take a value less than $\frac{1}{5}$ (20%) of the maximum value, and accordingly, the upper limit to the size parameter α is approximately 40 in FIG. 13.

From the viewpoint of manufacturing accuracy assurance, it is desirable that the size parameter α is set equal to or less than 20 so as to be able to guarantee a manufacturing accuracy of 5°, i.e., more than twice the current standard of manufacturing accuracy (see FIG. 12). In consideration of the scattering coefficient set in correspondence to a constant total volume, too, it is desirable to ensure that the size parameter α never exceeds 20, i.e., the size parameter value at which the scattering efficiency is sustained at a level equal to or greater than $\frac{1}{4}$ of the peak value (see FIG. 13).

It is desirable that the thickness of the light concentrating optical element never exceeds 10 mm. In order to allow light having entered the light concentrating optical element through the top surface thereof to be scattered 500 times before it reaches the bottom surface side of the light concentrating optical element, the particles need to be distributed over 20 μm intervals or less, and the maximum particle diameter that such particles may assume is 20 μm. However, it is desirable that the particle diameter be set equal to or less than 10 μm when the particle charge rate is to be kept down to 5% or less. Under the common conditions outlined earlier, the value taken for the size parameter α in correspondence to a particle diameter d set to 10 μm is approximately 80, whereas the value taken for the size parameter in correspondence to a particle diameter d of 10 μm in incident light wavelength λ of 1.3 μm is approximately equal to 40.

With all the factors discussed above taken into consideration, the size parameter α for the light concentrating optical element, comprising a substrate and micro-optical members, should be set in the range $1.5 \leq \alpha \leq 40$, and it is even more desirable to set the size parameter α in the range $2 \leq \alpha \leq 20$. In addition, the particle diameter d of the micro-optical members should be set equal to or less than 20 μm and even more desirably to a value equal to or less than 10 μm.

Next, an example of a light concentrating optical element manufacturing process is briefly described. Through this manufacturing process, the light concentrating optical element 10, which includes the substrate 11 and the micro-optical members 12 as explained earlier, may be manufactured. The substrate 11 is formed by using a monomer constituted of a naphthalate 70/terephthalate 30 copolyester (coPEN). The micro-optical members 12 are birefringent particles assuming a polarization axis along a specific direction, manufactured through photo-polymerization achieved via polymerization UV photo-polymerizing apparatus, of rod crystals (E9 (registered trademark) available from Merck Japan) with a photo-polymerization initiator (Irgacure 907 (registered trademark) manufactured by Ciba Geigy) added thereto. The substrate 11 with the micro-optical members 12 mixed therein is uniaxially drawn along the x-axis, so as to form a light concentrating optical element 10 in the form of a sheet. The particle diameter d of the micro-optical members 12 is approximately 1.0 μm and the micro-optical members are dispersed with a distribution density of approximately 0.1 particle/μm$^3$.

At the substrate 11 (coPEN) which does not have a birefringence property, a uniform refractive index is applied to rays of light advancing in all directions, i.e., $n_{axy}$, $n_{ayx}$ and $n_{azy}$ are all equal to each other at approximately 1.64. The micro-optical members 12 are oriented along the drawing direction, and thus, the refractive index of a micro-optical members 12 taken along the drawing direction (along the x-axis) does not match the refractive index taken along another direction, with $n_{axy}$=1.73 and $n_{byx}$=$n_{bzy}$ at approximately 1.53. The light scattering theory supports micro-optical members that are not spherical and the micro-optical members should be manufactured so as to fulfill the conditions set forth above in correspondence to the dimensions of the drawn micro-optical members (particles) converted to the diameter of an equivalent circle.

The micro-optical members 12 are uniaxial anisotropic birefringent members (equivalent to those manifesting the birefringence property shown in FIG. 4A) with the major axis of birefringence oriented along the x-axis. This means that the refractive index at which p-polarized light having entered a micro-optical member 12 is refracted, changes in correspondence to the angle of incidence of the light within the xy plane, resulting in a change in the difference between the refractive index of the micro-optical member 12 and the refractive index of the substrate 11. This, in turn, alters the scattering cross section in the Mie scattering theory, leading to a change in the scattering efficiency.

As has been described in reference to FIG. 3, a large extent of scattering occurs when the angle of incidence θ, at which light enters the micro-optical members 12 is equal to 0° or 90°, since the difference between the refractive indices of the substrate and the micro-optical members achieves a maximal value and the scattering cross section also achieves a maximal value under such circumstances. However, if the angle of incidence θ at which light enters the micro-optical members 12 is equal to the inclining angle Ø with which the index matching axis $M_1$ inclined, i.e., when θ=±Ø, there is no difference between the refractive index of the substrate and the refractive index of the micro-optical member and the scattering cross section assumes an infinitely small value. In this situation, no scattering of light occurs. When the angle of incidence θ at the micro-optical members 12 is in a middle range, e.g., 0<θ<Ø or Ø<θ<90°, a scattering cross section corresponding to the difference between the refractive index of the substrate 11 and the refractive index of the micro-optical members 12 at the particular angle of incidence is assumed and the scattering efficiency is altered accordingly.

At the light concentrating optical element 10 structured as described above, light having entered the light concentrating optical element 10 through the top surface at normal incidence and advancing as p-polarized light along the y-axis becomes scattered through a Mie scattering phenomenon via the micro-optical members 12 present in the medium (substrate 11) acting as particles. Assuming that the particle diameter of the micro-optical members 12 is 1 μm and the particles are dispersed with a density of 0.1 particle/m³, approximately 40% of the incident light will be scattered during the initial stage of scattering occurring near the surface with approximately 60% of the incident light allowed to advance straight ahead without being scattered. Then, approximately 40% of the light having been allowed to advance straight ahead is scattered via micro-optical members 12 present at the next stage among the micro-optical members 12 dispersed along the thickness-wise direction. In this way, all the light entering the element is eventually scattered. The scattered light inclines relative to the y-axis.

Some of the light having been caused to incline relative to the y-axis is bent at the next stage so as to advance with an even greater incline (so as to increase the angle of incidence) and some other part of the light is bent so as to resume the vertical orientation (to decrease the angle of incidence), while the remainder of the light continues to advance with no change in the angle of incidence (see FIG. 2). The scattering probability of inclining light is lowered when the angle of incidence θ is closer to the inclining angle Ø of the index matching axis $M_1$. In other words, when the angle of incidence θ is closer to the inclining angle Ø of the index matching axis $M_1$, the ratio of light that is scattered decreases and, furthermore, the ratio of light becoming further inclined and the ratio of light bent so as to resume the vertical orientation also decrease.

Once the inclining angle (angle of incidence) of light advancing through the medium becomes equal to the inclining angle Ø of the index matching axis $M_1$, the refractive index $n_{bxØ}$ of the particles matches the refractive index $n_{axØ}$ of the medium. Under this condition, the scattering probability is low enough to be disregarded. Thus, as the scattering process continues through numerous stages, the light is made to advance toward the positive range or the negative range of the x-axis along the index matching axis $M_1$ inclining relative to the y-axis with the angle Ø.

The index ellipsoid for the substrate 11, the index circle for the micro-optical members and the inclining angle Ø of the index matching axis $M_1$ perpendicular to each axis $M_s$ at which the index ellipsoid and index circle intersect each other may be expressed as in (2), (3) and (4) below respectively with $n_{xy}$ ($n_{axy}$ and $n_{bxy}$) representing the refractive index with which light advancing along the y-axis within the xy plane is refracted and $n_{yx}$ ($n_{ayx}$ and $n_{byx}$) representing the refractive index with which light advancing along the x-axis within the xy plane is refracted.

$$(n_{xy})^2/(1.73)^2+(n_{yx})^2/(1.53)^2=1 \quad (2)$$

$$(n_{xy})^2+(n_{yx})^2=(1.64)^2 \quad (3)$$

$$\tan Ø = n_{yx}/n_{xy} \quad (4)$$

Through expressions (2) through (4), the inclining angle Ø of the index matching axis $M_1$ is calculated to be 50.5°. The inclining angle Ø calculated for the index matching axis $M_1$ is greater than the critical angle (37.6°) of the total reflection occurring at the interface between the substrate 11, i.e., the medium, and the air, and as a result, light in the medium is totally reflected at the interface between the substrate 11 and the air. While the totally reflected light is bound to encounter micro-optical members 12 again as it advances through the medium toward the top surface side, the light is not scattered via the micro-optical members 12, since the angle of incidence at which the light enters the micro-optical members is equal to the inclining angle of the index matching axis $M_1$. The light is instead transmitted through the micro-optical members 12 as though advancing through a homogeneous medium. Subsequently, the light undergoes total reflection at the top surface and the bottom surface of the light concentrating optical element and is allowed to concentrate over the positive range or the negative range along the x-axis (see FIGS. 14 and 15).

By designing the substrate 11 and the micro-optical members 12 so as to ensure that the inclining angle with which light, having passed through a layer of micro-optical members 12 dispersed closest to the bottom surface inside the light concentrating optical element advances toward the bottom surface of the light concentrating optical element is greater than the critical angle of total reflection occurring at the interface between the substrate 11 and the air, the light constituted with the p-polarized light component having entered the light concentrating optical element 10 can be guided in its entirety as concentrated light to the ends present in the positive range and the negative range along the x-axis, even without having to incline the whole of the light by an extent matching the inclining angle Ø of the index matching axis $M_1$. The light concentrating optical element 10 adopting this structure, which allows light trapped inside the element to propagate over a long distance with little loss, is capable of efficiently concentrating light over a wide concentration area.

The presence of a protective film or the like having a refractive index different from that of the substrate 11, formed at the bottom surface of the light concentrating optical element, will induce refraction of light corresponding to the refractive index of the film at the interface between the substrate 11 and the film. However, Snell's law of refraction is in effect at the interface between the substrate 11 and the film and at the interface between the film and the air. Accordingly, the total reflection conditions will be fulfilled at least at the interface between the film and the air as long as the inclining angle of light having reached the bottom surface of the light concentrating optical element is greater than the critical angle of total reflection occurring at the interface between the substrate and the air. Consequently, the light constituted with the p-polarized light component having entered the light concentrating optical element 10 will be directed in its entirety as concentrated light to the ends in the positive range and the negative range along the x-axis.

In addition, if the inclining angle of light having reached the bottom surface of the light concentrating optical element that includes the protective film or the like as described above is greater than the critical angle of total reflection at the interface between the substrate and the film, the total reflection conditions will be fulfilled at the interface between the substrate and the film, and in such a case, the light having reached the bottom surface of the light concentrating optical element will be totally reflected into the substrate without being allowed to advance into the film. Thus, the light constituted with the p-polarized light component having entered the light concentrating optical element 10 will be concentrated in its entirety at the ends in the positive range and the negative range along the x-axis even if the total reflection conditions do not exist at the interface between the film and the air with the film having, for instance, an uneven outer surface.

While the explanation has been given on an example in which, for the sake of simplification, the wavelength of light entering the light concentrating optical element is uniform, the particle diameter d of the micro-optical members can be set to an optimal value corresponding to the wavelength band of the target light to be concentrated if the incident light assumes various wavelengths within a limited wavelength range. In more specific terms, the particle diameter d may be set in conjunction with target light in a wavelength band ranging from 400 to 1800 nm corresponding to the sunlight radiation spectrum, target light in a wavelength band ranging from 400 to 800 nm corresponding to an intense radiation spectrum or target light in a wavelength band assuring a high level of conversion efficiency for the photoelectric conversion elements 50 in the photovoltaic power generation device to be described next. The particle diameter d of the micro-optical members may be set based upon the center, the gravitational center or the like of such a wavelength band, or a plurality of particle diameters d1, d2, d3 . . . , each corresponding to a specific wavelength band segment among the wave band segments obtained by dividing the whole wavelength range into a plurality of segments (i.e., particle diameters of a plurality of micro-optical members in a mixture made up with micro-optical members having different particle diameters) may be set.

(Structural Examples for a Light Concentrating Device 60a and a Photovoltaic Power Generation Device 1a)

A light concentrating device that includes a light concentrating optical element such as that explained above is now described. As a typical example of the light concentrating device according to the present invention, a light concentrating device equipped with the light concentrating optical element 10 achieved in the first embodiment will be described. As has already been explained, the light constituted with the s-polarized light component in the light entering the light concentrating optical element 10 from above is not concentrated along the x-axis and instead, the s-polarized light exits the light concentrating optical element 10 through the bottom surface of the light concentrating optical element 10. A light concentrating device 60a, 70a or 80a, equipped with the light concentrating optical element 10, is configured so as to be able to concentrate all the light entering the light concentrating optical element from above, including the light constituted with the s-polarized light component. The following is a description, given in reference to drawings, of structural examples that may be typically adopted for such a light concentrating device. In each figure, p-polarized light with the electric field component thereof vibrating along a direction parallel to the drawing sheet is marked with double-ended arrows and s-polarized light with the electric field component thereof vibrating along a direction perpendicular to the drawing sheet is marked with circles, each having a dot set at the center thereof.

Figure 14:
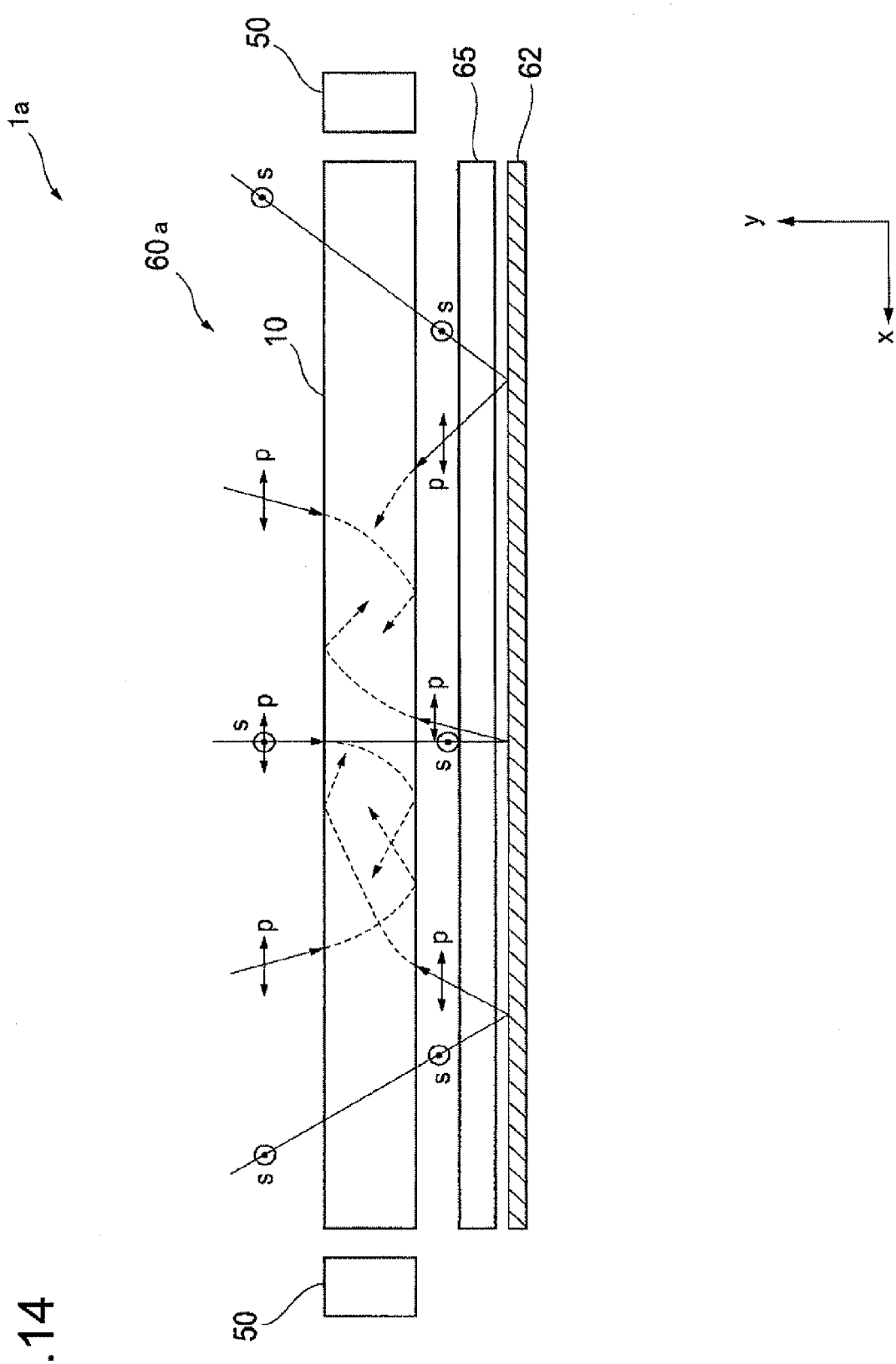
FIG. 14 is a schematic diagram showing the structure of a light concentrating device.

FIG. 14 schematically illustrates the structure of the light concentrating device 60a. The light concentrating device 60a in the figure comprises a light concentrating optical element 10, a reflecting mirror 62 disposed on the bottom surface of the light concentrating optical element 10 so as to range along the bottom surface and a polarization plane rotating element 65 disposed between the light concentrating optical element 10 and the reflecting mirror 62. The polarization plane rotating element 65 is an optical element that causes a 90° rotation of the polarization plane of light having been transmitted twice. An optimal polarization plane rotating element fulfilling such a function may be, for instance, a wide-band quarter wavelength plate, at which s-polarized light is converted to circularly polarized light as light in the sunlight wavelength band is first transmitted and the circularly polarized light is then converted to p-polarized light as the light is transmitted for a second time.

At the light concentrating device 60a configured as described above, p-polarized light in the light having entered the light concentrating optical element 10 along the thickness thereof through the top surface side of the light concentrating optical element 10 becomes scattered via numerous micro-optical members 12, evenly dispersed through the substrate 11. The direction along which the scattered light advances (light vector) is oriented toward the inclining direction in which the index matching axis $M_1$ extends with the inclining angle Ø. The scattered light is concentrated at either of the two ends of the light concentrating optical element 10, one located on the positive side and the other located on the negative side along the x-axis. Unlike the p-polarized light, most of the light constituted with the s-polarized light component in the light having entered the light concentrating optical element 10 along the thickness thereof through the top surface of the light concentrating optical element 10 exits the light concentrating optical element 10 through the bottom surface of the light concentrating optical element 10 without being scattered.

The s-polarized light having exited the light concentrating optical element 10 through the bottom surface of the light concentrating optical element 10 is transmitted through the polarization plane rotating element 65, is reflected at the reflecting mirror 62, is transmitted through the polarization plane rotating element 65 again and reenters the light concentrating optical element 10 through the bottom surface of the light concentrating optical element 10. The light reentering the light concentrating optical element 10 at this time, having been transmitted through the polarization plane rotating element 65 twice, is light constituted with the p-polarized light component, since the polarization plane of the light has been rotated by 90°. Thus, the p-polarized light having reentered the light concentrating optical element through the bottom surface thereof to advance along the thickness of the light concentrating optical element 10 is scattered via the micro-optical members 12 as it advances from the bottom surface toward the top surface side, and the advancing direction of the scattered light is oriented toward the inclining direction, in which the index matching axis $M_1$ inclines with the inclining angle Ø, thereby causing the scattered light to be concentrated at either of the two ends of the light concentrating optical element 10, one located on the positive side and the other located on the negative side along the x-axis.

At the light concentrating device 60a configured with a single light concentrating optical element 10, the light entering the light concentrating optical element 10 from above can be concentrated in its entirety at the two ends of the light concentrating optical element 10 facing opposite each other along the x-axis. In addition, by disposing photoelectric conversion elements 50 for converting the light concentrated at the ends of the light concentrating optical element 10 to electricity, i.e., by adopting a simple and low cost structure that includes a single set of the light concentrating optical element 10 and the photoelectric conversion elements 50, a photovoltaic power generation device 1a, capable of photoelectric conversion of all the light having entered the light concentrating optical element 10, can be configured.

(Structural Examples for a Light Concentrating Device 70a and a Photovoltaic Power Generation Device 1b)

A light concentrating device 70a (not shown) adopting a structure different from that of the light concentrating device 60a will be described briefly. The light concentrating device 70a includes two light concentrating optical elements, each configured as described earlier. The following is a description of a light concentrating device 70a equipped with two light concentrating elements, each identical to the light concentrating optical element 10 achieved in the first embodiment, i.e., a light concentrating optical element 10a and a light concentrating optical element 10b.

The light concentrating device 70a comprises the light concentrating optical element 10a and the light concentrating optical element 10b disposed on the bottom surface of the light concentrating optical element 10a, with the x-axis at the light concentrating optical element 10b set so as to extend parallel to the z-axis at the light concentrating optical element 10a. More succinctly, the light concentrating device 70a is configured by disposing the light concentrating optical element 10b on the bottom side of the light concentrating optical element 10a with a 90° turn around the y-axis relative to the light concentrating optical element 10a.

Light traveling as s-polarized light in the coordinate system assumed at the light concentrating optical element 10a is equivalent to p-polarized light in the coordinate system assumed at the light concentrating optical element 10b. This means that the light constituted with the p-polarized light component in the light having entered the light concentrating optical element 10a from above the light concentrating device 70a is scattered at the light concentrating optical element 10a and becomes concentrated at the two ends of the light concentrating optical element 10a facing opposite each other along the x-axis. Light constituted with the s-polarized light component transmitted through the light concentrating optical element 10a enters the light concentrating optical element 10b as p-polarized light, is scattered at the light concentrating optical element 10b and is concentrated at the two ends of the light concentrating optical element 10b facing opposite each other along the x-axis at the light concentrating optical element 10b.

At the light concentrating device 70a adopting a simple structure that includes two light concentrating optical elements disposed one on top of the other, with one light concentrating optical element rotated around the y-axis by 90° relative to the other light concentrating optical element, all the light entering the light concentrating optical element 10a from above can be concentrated at the light concentrating optical elements 10a and 10b. In addition, by disposing, near the light concentrating optical element 10a and 10b, photoelectric conversion elements 50 for converting the light concentrated at the ends of the individual light concentrating optical element 10a and 10b to electricity, a photovoltaic power generation device 1b (not shown), capable of converting all the light entering the light concentrating optical element 10a from above to electricity can be configured with a simple structure. Furthermore, since the upper photoelectric conversion elements disposed in conjunction with the light concentrating optical element 10a and the lower photoelectric conversion elements disposed in conjunction with the light concentrating optical element 10b do not need to assume matching positions along the horizontal direction, the structures of the photoelectric conversion elements can be designed with a higher level of freedom and such photoelectric conversion elements can be disposed with a positional arrangement affording a higher level of lay-out freedom.

(Structural Examples for a Light Concentrating Device 80a and a Photovoltaic Power Generation Device 1c)

Figure 15:
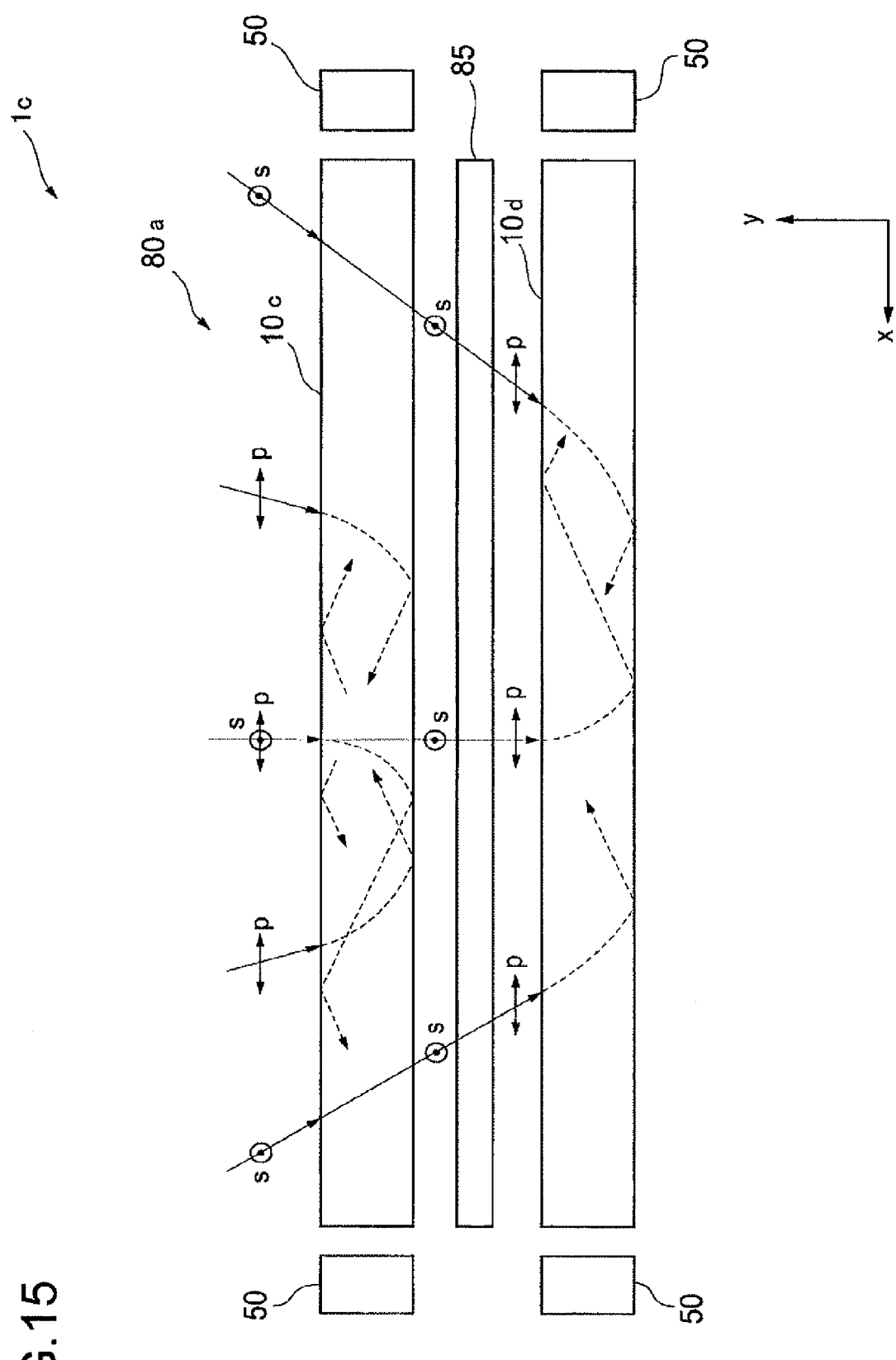
FIG. 15 is a schematic diagram showing the structure of a light concentrating device.

A light concentrating device 80a configured by adopting a structure different from that of the light concentrating device 60a or the light concentrating device 70a will now be described in reference to FIG. 15. The light concentrating device 80a comprises two light concentrating optical elements, each structured as has been described earlier, and a polarization plane rotating element 85. The light concentrating device 80a to be described in reference to FIG. 15 includes two light concentrating optical elements, each identical to the light concentrating optical element 10 achieved in the first embodiment, i.e., a light concentrating optical element 10c and the light concentrating optical element 10d.

The light concentrating device 80a comprises the light concentrating optical element 10c, the light concentrating optical element 10d disposed on the bottom surface of the light concentrating optical element 10c and the polarization plane rotating element 85 disposed between the light concentrating optical element 10c and the light concentrating optical element 10d. The light concentrating optical element 10c and the light concentrating optical element 10d are disposed by aligning the x-axis at the light concentrating optical element 10c and the x-axis at the light concentrating optical element 10d so that they extend parallel to each other. The polarization plane rotating element 85 is an optical element that rotates the polarization plane of light transmitted through the polarization plane rotating element 85 by 90°. An optimal polarization plane rotating element fulfilling such a function may be, for instance, a wide-band half wavelength plate via which s-polarized light is converted to p-polarized light as light in the sunlight wavelength band is transmitted once.

At the light concentrating device 80a configured as described above, p-polarized light in the light having entered the light concentrating optical element 10c along the thickness thereof through the top surface side of the light concentrating optical element 10c becomes scattered via numerous micro-optical members 12, evenly dispersed through the substrate 11 in the light concentrating optical element 10c. The direction along which the scattered light advances (light vector) is oriented toward the inclining direction in which the index matching axis $M_1$ extends with the inclining angle Ø. The scattered light is concentrated at either of the two ends of the light concentrating optical element 10c, one located on the positive side and the other located on the negative side along the x-axis. The light constituted with the s-polarized light component transmitted through the light concentrating optical element 10c, exits the light concentrating optical element 10c through the bottom surface thereof and then enters the polarization plane rotating element 85.

As the s-polarized light, having entered the polarization plane rotating element 85, is transmitted through the polarization plane rotating element 85, the polarization plane of the light is rotated by 90° and, as a result, the light having entered the polarization plane rotating element 85 as s-polarized light is converted to light constituted with the p-polarized light component, which then exits the polarization plane rotating element 85. As a result, the light having been converted to p-polarized light through the rotation of the polarization plane enters the light concentrating optical element 10d and the light having entered the light concentrating optical element 10d becomes scattered at the light concentrating optical element 10d via numerous micro-optical members 12, uniformly dispersed through the substrate 11. The direction along which the scattered light advances is oriented toward the inclining direction in which the index matching axis $M_1$ extends with the inclining angle Ø. The scattered light is concentrated at either of the two ends of the light concentrating optical element 10d, one located on the positive side and the other located on the negative side along the x-axis.

At the light concentrating device 80a adopting a simple structure that includes two light concentrating optical elements disposed one on top of the other, all the light entering the light concentrating optical element 10c from above can be concentrated at the light concentrating optical elements 10c and 10d. In addition, by disposing, near the ends of the light concentrating optical element 10c and 10d, photoelectric conversion elements 50 for converting the light concentrated at the ends of the individual light concentrating optical element 10c and 10d to electricity, a photovoltaic power generation device 1c, capable of converting all the light entering the light concentrating optical element 10c from above to electricity, can be configured with a simple structure.

In this configuration, the positive-side end of the first light concentrating optical element 10c and the positive-side end of the second light concentrating optical element 10d along the x-axis, set side-by-side along the top/bottom direction, take matching positions along the horizontal direction, and the negative-side end of the first light concentrating optical element 10c and the negative-side end of the second light concentrating optical element 10d along the x-axis, set side-by-side along the top/bottom direction, also take matching positions along the horizontal direction. In conjunction with such light concentrating optical elements, a light guide that connects the two positive-side ends along the x-axis and guides the connected ends to a single photoelectric conversion element 50 and a light guide that connects the two negative-side ends along the x-axis and guides the connected ends to another photoelectric conversion element 50 may be disposed. Such a structure makes it possible to reduce the number of photoelectric conversion elements, which are relatively expensive, included in the system.

The light concentrating devices 60a, 70a and 80a described above are each achieved by using the light concentrating optical element 10 in the first embodiment. At a light concentrating device that includes just one light concentrating optical element 20 achieved in the second embodiment, all the light entering the light concentrating optical element 20 can be concentrated at the light concentrating optical element 20 as at the light concentrating devices 60a, 70a and 80a described earlier. Namely, light constituted with the p-polarized light component in light having entered the light concentrating optical element 20 along the thickness thereof through the top surface side of the light concentrating optical element 20 becomes scattered via the micro-optical members 22 uniformly dispersed through the substrate 21 and is concentrated at the positive-side end and the negative-side end facing opposite each other along the x-axis. Light constituted with the s-polarized light component in the light having entered the light concentrating optical element 20 is scattered via the micro-optical members 22 and is concentrated at the positive-side end and the negative side end facing opposite each other along the z-axis.

At this light concentrating device adopting a very simple structure configured with a single light concentrating optical element 20, the light entering the light concentrating optical element 20 from above can be concentrated in its entirety. By disposing photoelectric conversion elements 50 at the two ends of the light concentrating optical element 20 facing opposite each other along the x-axis and at the two ends of the light concentrating optical element 20 facing opposite each other along the z-axis, a photovoltaic power generation device 1d (not shown) assuming an extremely simple structure but capable of photoelectric conversion of all the light having entered the light concentrating optical element 20 from above can be configured.

(Methods of Light Energy Extraction at End Areas of Light Concentrating Optical Elements)

The concepts of typical methods that may be adopted when extracting the energy of light concentrated in the end areas of the light concentrating optical element 10 (the light concentrating optical elements 10a, 10b, 10c and 10d) achieved in the first embodiment and the light concentrating optical element 20 achieved in the second embodiment are briefly described in reference to FIGS. 16A through 16E.

Figure 16A:
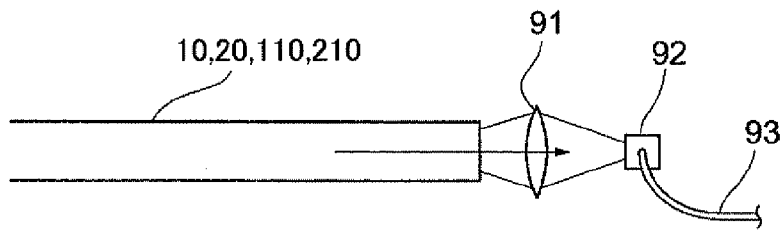
FIGS. 16A, 16B, 16C, 16D and 16E are conceptual diagrams showing how light energy may be extracted from a light concentrating optical element.

FIG. 16A is a conceptual diagram of a structural example that may be adopted when directly utilizing light extracted from an end of a light concentrating optical element where light has been concentrated. In the structural example presented in FIG. 16A, light output from the end of the light concentrating optical element is condensed via a cylindrical lens 91, a condenser rod 92 and the like, along the direction in which light will advance straight ahead and the light thus condensed is guided via an optical fiber 93 to a desired position.

Figure 16B:
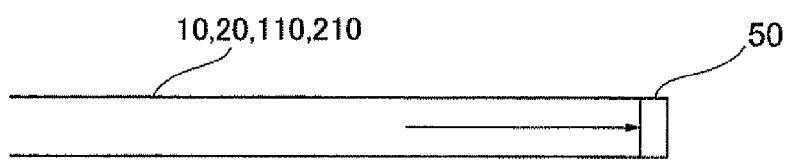

FIG. 16B is a conceptual diagram of a structural example that may be adopted when utilizing light having been concentrated at an end of a light concentrating optical element by converting the concentrated light to electric energy or thermal energy. In the example presented in FIG. 16B, a photoelectric conversion element 50 is coupled with a light concentration-side end of the light concentrating optical element 10 (20) and the energy of the concentrated light is extracted as electric energy via the photoelectric conversion element 50 where the light energy undergoes photoelectric conversion. In addition, it is desirable to extract the energy of the concentrated light as thermal energy via a heat pipe or the like that includes a light absorber, where the concentrated light is converted to heat through photothermal conversion. Any light concentrating optical element and light concentrating device among those described earlier may be used to configure a photothermal conversion device used to extract the energy of the concentrated light as thermal energy.

Figure 16C:
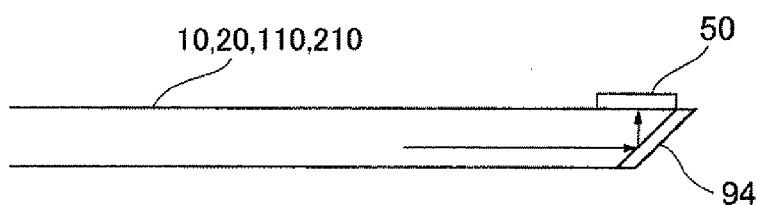

FIG. 16C is a conceptual diagram of a structural example that may be adopted when utilizing light having been concentrated at an end of a light concentrating optical element by converting the concentrated light to electric energy or thermal energy. In the example presented in FIG. 16C, a mirror 94 (or a reflecting film) is disposed at an end (inclined surface) of the light concentrating optical element 10 (20), formed by slicing off a side surface of the light concentrating optical element 10 (20) diagonally relative to the top surface (or the bottom surface) of the light concentrating optical element 10 (20), so as to concentrate light at a photoelectric conversion element 50 disposed on the top surface side (or the bottom surface side) of the light concentrating optical element 10 (20). This structure allows a photoelectric conversion element 50 taking up a specific area to be attached in a reliable and stable manner to a light concentrating optical element 10 (20) assuming the form of a thin sheet. It is desirable to extract the energy of the concentrated light as thermal energy via a heat pipe or the like that includes a light absorber, as in the example presented in FIG. 16B. Any light concentrating optical element and light concentrating device among those described earlier may be used to configure a photothermal conversion device used to extract the energy of the concentrated light as thermal energy.

Figure 16D:
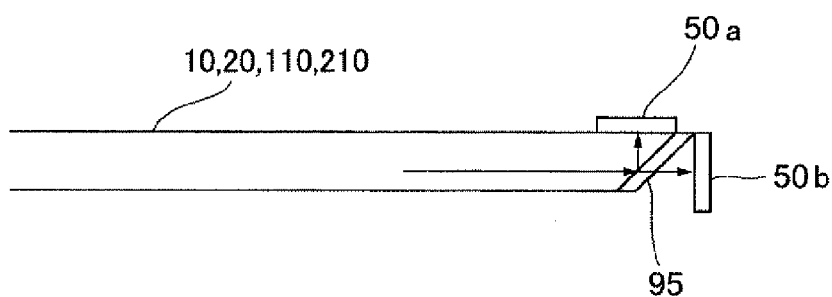

FIG. 16D is a conceptual diagram of a structural example that may be adopted when utilizing light having been concentrated at an end of a light concentrating optical element by converting the concentrated light to electric energy or thermal energy. In the example presented in FIG. 16D, a dichroic mirror 95 (or a reflecting film with wavelength selectivity) is disposed at an end (inclined surface) of the light concentrating optical element 10 (20), formed by slicing off a side surface of the light concentrating optical element 10 (20) diagonally relative to the top surface (or the bottom surface) of the light concentrating optical element 10 (20). The light having been concentrated at the end is split and the split light portions are individually directed as concentrated light to photoelectric conversion elements 50a and 50b respectively disposed at the top and end surface side (or the bottom and end surface side) of the light concentrating optical element 10 (20) (with the end photoelectric conversion element placed further outside relative to the end of the light concentrating optical element 10 (20)). This structure allows highly efficient photoelectric conversion elements, each capable of photoelectric conversion corresponding to the specific wavelength band of a split light portion, to be utilized as the photoelectric conversion elements 50a and 50b, making it possible to provide a photovoltaic power generation device assuring a high degree of conversion efficiency at relatively low cost. Ideal examples of application for this structure include a system in which one of the split light portions (e.g., light in the infrared range) is input to a heat pipe or the like with a light absorber so as to enable utilization of thermal energy obtained through photothermal conversion and the other split light portion (e.g., light in the visible range and in the ultraviolet range) is input to a photoelectric conversion element 50 to enable utilization of electric energy obtained through photoelectric conversion.

Figure 16E:
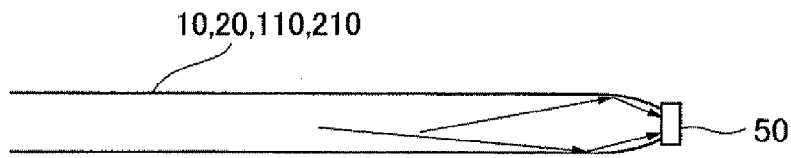

FIG. 16E is a conceptual diagram of a structural example that may be adopted when extracting light concentrated at an end of a light concentrating optical element while allowing the light concentrating optical element to assume a smaller thickness. The light concentrating optical element 10 (20) in FIG. 16E has a thickness that is gradually reduced toward the light concentration-side end. Light advancing along the x-axis through the light concentrating optical element is totally reflected at the top surface or the bottom surface of the light concentrating optical element and thus, the light is concentrated effectively while the light concentrating optical element is allowed to assume a smaller thickness. This structure allows the concentrated light to be directly utilized as light energy without necessitating the use of a cylindrical lens or the like, and also makes it possible to raise the power density of the concentrated light input to a photoelectric conversion element 50 or a heat pipe without requiring complicated structural features.

In order to simplify the explanation, the light concentrating optical elements achieved in the first and second embodiments are described as those assuming a plate form. In addition, the functions of the light concentrating optical elements achieved in the embodiments are described in specific detail by quoting specific materials used to constitute the substrate and the micro-optical members and defining values taken for their refractive indices accordingly. However, embodiments of the present invention are not limited to such substructure modes or structural examples. For instance, the present invention may be adopted in a light concentrating optical element formed as a thin sheet or a light concentrating optical element formed as a rod (a bar shape or a linear shape) such as the shape of a prismatic column or circular column. In addition, the present invention may be adopted in a light concentrating optical element comprising a substrate and micro-optical members constituted of optimal materials selected from various resin materials, inorganic materials and the like. Furthermore, the light concentrating optical element according to the present invention may include another member in addition to the substrate 11 and the micro-optical members 12, as long as the presence of the additional member does not cause a departure from the spirit of the invention.

As described above, particulate micro-optical members, with a particle diameter set in an order substantially matching the order of the wavelength of the light to be concentrated, are dispersed in a substrate (base member) at the light concentrating optical element 10 achieved in the first embodiment and the light concentrating optical element 20 achieved in the second embodiment. The refractive indices of the substrate and the micro-optical members are set so as to achieve a relationship whereby p-polarized light advancing along the y-axis is refracted with different refractive indices at the substrate and the micro-optical members, p-polarized light advancing along the x-axis is refracted with different refractive indices at the substrate and the micro-optical members, the refractive index of the substrate and the refractive index of the micro-optical members are equal to each other with respect to p-polarized light advancing along an axis inclining from the y-axis toward the x-axis by the angle Ø and sin Ø>(1/$n_{ax\varnothing}$) is true. The light concentrating devices 60a, 70a and 80a, the photovoltaic power generation device 1 (the photovoltaic power generation devices 1a, 1b, 1c and 1d) and the photothermal conversion devices described above are all configured with such light concentrating optical elements.

The light concentrating optical element 10 and the light concentrating optical element 20 respectively achieved in the first embodiment and in the second embodiment as described earlier and the light concentrating devices 60a, 70a and 80a make it possible to provide a new system with a low-profile and a simple structure, capable of fulfilling a light concentrating function that enables efficient utilization of light energy such as sunlight. In addition, the photovoltaic power generation device 1 (the photovoltaic power generation devices 1a, 1b, 1c or 1d) configured by adopting the light concentrating optical element 10 or 20 and the light concentrating device 60a, 70a or 80a, is a compact, lightweight device with the light concentrating unit assuming a reduced thickness along the optical axis. In addition, the photovoltaic power generation device 1 does not always require a tracking device used to track the movement of the sun. Such a photovoltaic power generation device 1 will be ideal in applications in which it is used as a new system that provides an effective solar power generation function. Similar advantages will be achieved when the present invention is adopted in photothermal conversion devices.

Third and Fourth Embodiments

A light concentrating optical element 10 achieved in the third embodiment is equivalent to the light concentrating optical element 10 in the first embodiment with the inclining angle Ø of the index matching axis $M_1$ set equal to 90°. A light concentrating optical element 20 achieved in the fourth embodiment is equivalent to the light concentrating optical element 20 in the second embodiment with the inclining angle Ø of the index matching axis $M_1$ and γ both set equal to 90°. The photovoltaic power generation device 1, an external view of which is provided in a perspective in FIG. 1, may include the light concentrating optical element 10 achieved in the third embodiment of the present invention or the light concentrating optical element 20 achieved in the fourth embodiment of the present invention. FIG. 17 is a schematic sectional view taken along the direction indicated by arrows in FIG. 1. The following is a description of the third and fourth embodiments of the present invention, given in reference to drawings.

(Overview of the Light Concentrating Optical Element)

The light concentrating optical element 10 (20) in FIGS. 1 and 17 is formed by dispersing a plurality of micro-optical members inside a substrate assuming a plate form (or a panel form). The substrate includes a flat surface 10a (20a) located on the front side of the substrate and a flat surface 10b (20b) located on the back side of the substrate, which face opposite each other, and four side surfaces 10c (20c), 10d (20d), 10e

(20e) and 10f (20f). The sides forming the edges of the front flat surface 10a (20a) and the back flat surface 10b (20b), which range two dimensionally, each have a length greater than the distance between the front flat surface 10a (20a) and the back flat surface 10b (20b) facing opposite each other, i.e., greater than the thickness of the light concentrating optical element 10 (20), by a sufficient extent. The front flat surface 10a (20a) and the back flat surface 10b (20b) each have a square shape or a rectangular shape, and the front flat surface 10a (20a) in particular, which functions as a sunlight entry surface, ranges over a large area so as to take in the maximum possible amount of sunlight. Photoelectric conversion elements 50 are disposed by the side surface 10c (20c) and the side surface 10d (20d) facing opposite each other, with one photoelectric conversion element 50 positioned so as to face opposite the side surface 10c (20c) and another photoelectric conversion element 50 positioned so as to face opposite the side surface 10d (20d). At the photoelectric conversion elements 50, light having exited through the side surface 10c (20c) and the side surface 10d (20d) is received and the received light undergoes photoelectric conversion. Namely, the side surfaces 10c (20c) and 10d (20d) of the substrate defines the ends facing operator each other along the x-axis and/or the z-axis mentioned earlier, as has been explained in the overview of the photovoltaic power generation device achieved in the first and second embodiments. Sunlight having entered through the front flat surface 10a (20a) is concentrated inside the substrate and then exits through the side surface 10c (20c) and the side surface 10d (20d). Since the areal size of the side surface 10c (20c) and the side surface 10d (20d) are smaller than that of the front flat surface 10a (20a), the installation space taken up by the photoelectric conversion elements 50 can be minimized.

As shown in FIG. 17, the main components constituting the light concentrating optical element 10 (20) include a substrate 11 (21) through which sunlight is transmitted and particulate micro-optical members 12 (22) having a light transmitting property, which are dispersed throughout the substrate. The particle diameter of the micro-optical members is set so as to achieve approximately 0.1λ through 10λ, for the diameter d of an equivalent circle, with λ representing the wavelength of light entering the light concentrating optical element, as in the first and second embodiments.

While the micro-optical members are dispersed evenly over the entire light concentrating optical element (in a macroscopic view) along the x-axis, the y-axis and the z-axis, only micro-optical members 12 present on light paths of scattered light are shown in the schematic illustration provided in FIG. 17 so as to facilitate an explanation of the scattering of light induced via the micro-optical members 12. It is to be noted that the density at which the micro-optical members are distributed is set to the optimal level in correspondence to the materials constituting the substrate and the micro-optical members, the shapes and the dimensions of the substrate and the micro-optical members, the operating conditions and the like, as in the first and second embodiments.

The substrate 11 (21) and the micro-optical members 12 (22) at the light concentrating optical element 10 (20) demonstrate refractive index characteristics different from each other, with at least either the substrate or the micro-optical members having a birefringence property.

The substrate and the micro-optical members in the embodiment are designed so that different values are taken for $n_{axy}$ and $n_{bxy}$, and that the values taken for $n_{ayx}$ and $n_{byx}$ are substantially equal to each other. It is to be noted that when the values taken for $n_{ayx}$ and $n_{byx}$ are "substantially equal to each other", the refractive indices achieve a relationship whereby p-polarized light advancing along the x-axis is not scattered or refracted to any significant extent via the micro-optical members. In more specific terms, when $n_{ayx}$ and $n_{byx}$ are substantially equal to each other, the difference between the refractive indices may be equal to or less than 0.05.

The micro-optical members 12 (22) at such a light concentrating optical element 10 (20) act as particles for p-polarized light entering the light concentrating optical element from above and advancing along the y-axis, since $n_{axy}$ and $n_{bxy}$ are not equal to each other. The particle diameter d of the micro-optical members 12 (22) is set at approximately equal to 0.1λ to 10λ representing the diameter of an equivalent circle. The order of such a particle diameter d matches the order of the wavelength of light to propagate through the substrate, i.e., the medium. This means that Mie scattering theory can be basically applied to the relationship between the light propagating through the substrate and the micro-optical members at the light concentrating optical element 10 (20).

However, at least either the substrate 11 (21) or the micro-optical members 12 (22) at the light concentrating optical element 10 (20) assume a birefringence property. Thus, the azimuth of the major axis (the orientation of the fast axis or the slow axis along which a ray of light becomes an extraordinary ray) of birefringence and the direction of polarization along which light advances through the light concentrating optical element determine whether or not light is scattered and affect the direction in which light is scattered.

For the sake of simplification, an example in which either the substrate or the micro-optical members are positively birefringent (a birefringence property whereby an extraordinary ray is refracted with a refractive index higher than the refractive index with which an ordinary ray is refracted) and there is a single major axis of birefringence, i.e., birefringence manifests uniaxially, is examined. Under such circumstances, $n_{axy}$ and $n_{bxy}$ take values different from each other ($n_{axy} \neq n_{bxy}$) and $n_{ay}$ and $n_{by}$ take values substantially equal to each other ($n_{ayx} \approx n_{byx}$) with the major axis of birefringence oriented either along the x-axis or along the y-axis.

Figure 18A:
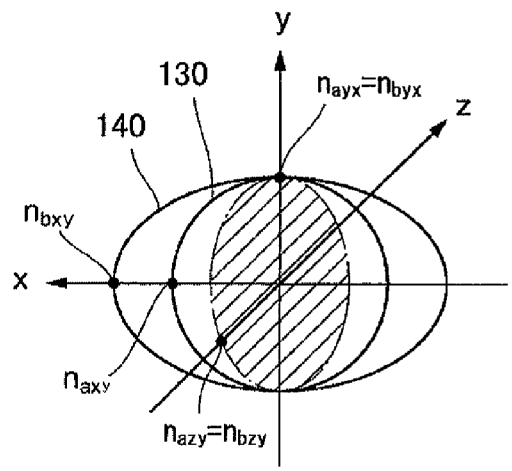
FIGS. 18A, 18B and 18C are illustrations each indicating a relationship that may exist between the index ellipsoid of the substrate and the index ellipsoid of the micro-optical members.
Figure 18B:
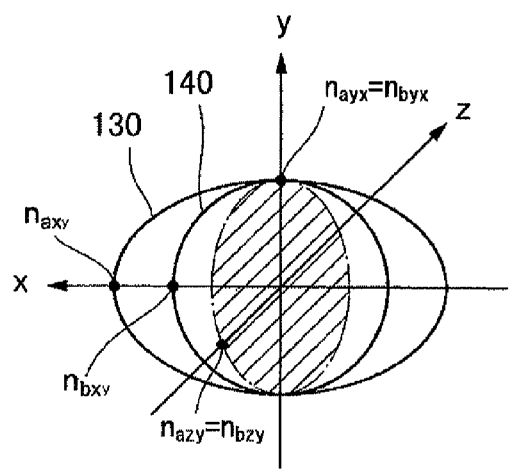
Figure 18C:
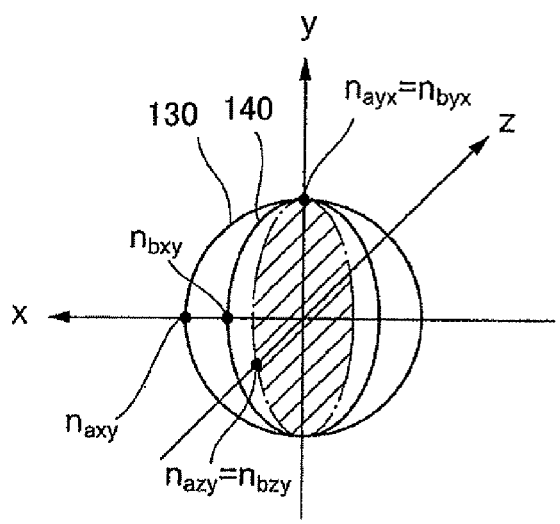

Relationships that may be assumed by an index ellipsoid 130 of the substrate and an index ellipsoid 140 of the micro-optical members when the major axis of birefringence is oriented along the x-axis are shown in FIGS. 18A, 18B and 18C. FIG. 18A shows a relationship that may be observed when the micro-optical members have a positive birefringence property, FIG. 18B shows a relationship that may be observed when the substrate has a positive birefringence property and FIG. 18C shows a relationship that may be observed when the micro-optical members have a negative birefringence property. The hatched area in each illustration represents the index ellipsoid of the substrate or the micro-optical member within the yz plane. As the figures indicate, $n_{azy}$ and $n_{bzy}$, as well as $n_{ayx}$ and $n_{byx}$, are substantially equal to each other ($n_{ayx}=n_{azy}\approx n_{byx}=n_{bzy}$) when the major axis of birefringence is oriented along the x-axis. The light concentrating optical element 10 achieved in the third embodiment with the micro-optical members thereof manifesting positive birefringence, as shown in FIG. 18A, represents a typical instance in which the major axis of uniaxial anisotropic birefringence is oriented along the x-axis.

Figure 19A:
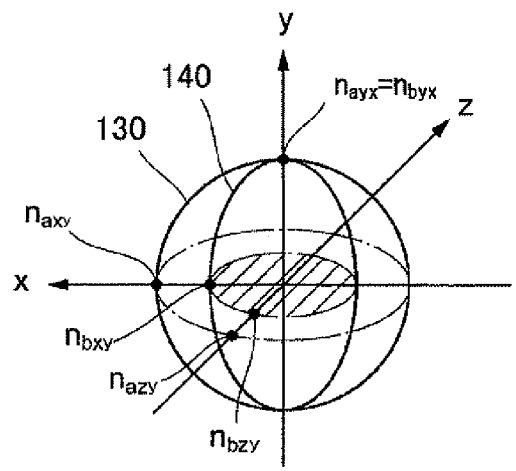
FIGS. 19A, 19B and 19C are illustrations each indicating a relationship that may exist between the index ellipsoid of the substrate and the index ellipsoid of the micro-optical members.
Figure 19B:
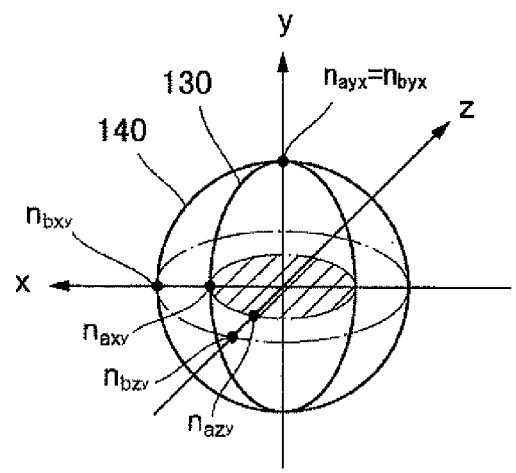
Figure 19C:
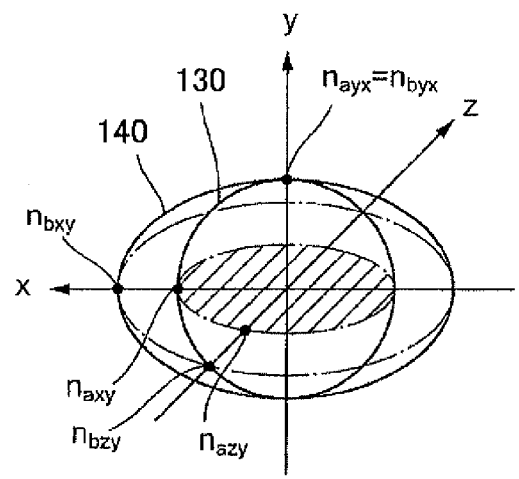

Relationships that may be assumed by the index ellipsoid 130 of the substrate and the index ellipsoid 140 of the micro-optical members when the major axis of birefringence is oriented along the y-axis are shown in FIGS. 19A, 19B and 19C. FIG. 19A shows a relationship that may be observed when the micro-optical members have a positive birefringence property, FIG. 19B shows a relationship that may be observed when the substrate has a positive birefringence property and FIG. 19C shows a relationship that may be observed when the micro-optical members have a negative birefringence property. The hatched area in each illustration represents the index ellipsoid of the substrate or the micro-optical members within the xz plane. As the figures indicate, only $n_{ayx}$ and $n_{byx}$ take values substantially equal to each other ($n_{axy} \neq n_{bxy}$ and $n_{azy} \neq n_{bzy}$) when the major axis of birefringence is oriented along the y-axis. The light concentrating optical element 20 achieved in the fourth embodiment with the micro-optical members thereof manifesting negative birefringence, as shown in FIG. 19C, represents a typical instance in which the major axis of uniaxial anisotropic birefringence is oriented along the y-axis.

(Light Concentrating Optical Element Achieved in the Third Embodiment)

Since $n_{axy} \neq n_{bxy}$, the micro-optical members 12 act as particles distinguishable from the medium (substrate 11) for p-polarized light advancing along the y-axis (extraordinary rays of light) among rays of light having entered the light concentrating optical element 10 achieved in the third embodiment from above and advancing through the substrate. However, since $n_{ayx} \approx n_{byx}$, the micro-optical members 12 do not act as particles for p-polarized light advancing along the x-axis (ordinary rays of light). The state of the substrate is equivalent to one in which particles are nonexistent (as if the medium were homogeneous with no micro-optical members 12 therein).

For this reason, while the p-polarized light (p-polarized light component) having entered the light concentrating optical element 10 from above and advancing along the y-axis undergoes Mie scattering via the micro-optical members 12 acting as particles in the medium due to the difference between the refractive indices, the p-polarized light advancing along the x-axis continues to advance along the x-axis without being scattered via the micro-optical members, which do not act as particles distinguishable from the medium with respect to the p-polarized light advancing along the x-axis.

According to the present invention achieved by taking advantage of the difference in the refractive index resulting from the birefringence occurring as described above, the scattering cross section changes in correspondence to the angle of incidence at which light enters the micro-optical members 12, which, in turn, alters the scattering efficiency. FIG. 20 schematically illustrates varying relationships between the angle of incidence at which light enters the micro-optical members 12 and the scattering of light. As the figures indicate, light is scattered to a great extent when it enters the micro-optical members 12 with an angle of incidence of 0° relative to the y-axis, resulting in a maximum difference between the refractive indices and a maximum scattering cross section (see (a) in FIG. 20 but light is not scattered when the angle of incidence is 90°, since there is no difference between the refractive indices and the scattering cross section value is infinitely small (see (d) in FIG. 20).

When the angle of incidence at the micro-optical members 12 is within the range of 0 to 90°, a scattering cross section corresponding to the difference between the refractive index of the substrate 11 and the refractive index of the micro-optical members 12 at the particular angle of incidence is assumed and the scattering efficiency is altered accordingly (see (b) and (c) in FIG. 20). FIG. 20 (also FIG. 17), in which the light that is diffused through scattering is expressed with three vectors, i.e., one representing light advancing straight ahead along the axis of the incident light and the other two representing two light beams spreading to the left and right away from the axis of the incident light, indicates that the scattering efficiency decreases as the angle of incidence increases to result in a decrease in the rate at which scattered light spreads to the left or the right and that no scattering of light occurs when the angle of incidence is 90°.

At the light concentrating optical element 10 structured as described above, light having entered the light concentrating optical element 10 from above and advancing as p-polarized light along the y-axis becomes scattered through a Mie scattering phenomenon via the micro-optical members 12 present in the substrate (medium) 11 acting as particles, as shown in FIG. 17. Through this process, 40% of the incident light, for instance, may be scattered via the micro-optical members 12 present near the surface. Even rays of light having bypassed these micro-optical members 12 are subsequently scattered by micro-optical members 12 disposed at the next stage among the micro-optical members 12 distributed along the thickness-wise direction at a rate of, for instance, 40%. Namely, the p-polarized light advancing along the y-axis is bound to become scattered at one point or another. In addition, multiple light scattering occurs, in which light having been scattered by micro-optical members 12 becomes further scattered via by micro-optical members present at the next stage among the micro-optical members distributed along the thickness-wise direction.

As a result, the ratio of light continuing to advance along the y-axis (along the vertical direction) through the light concentrating optical element 10 after having entered the light concentrating optical element 10 along the vertical direction decreases, and instead, the ratio of light inclining diagonally downward in the xy plane increases. While the scattering efficiency with which light inclining toward the x-axis over the positive range or the negative range is scattered decreases as the angle of incidence at which light enters the micro-optical members 12 becomes greater, a smaller extent of shift toward the horizontal direction, the ratio of light inclining toward the x-axis by a large extent (i.e., light advancing as rays of light with almost horizontal orientation) increases. Light that advances along the x-axis as horizontal rays is not scattered via the micro-optical members 12 and continues to advance toward the positive-side end or the negative-side end along the x-axis.

In this situation, if the inclining angle of light reaching the bottom surface of the light concentrating optical element as rays of light inclined toward the x-axis exceeds the critical angle of total reflection occurring at the interface between the substrate 11 and the air, the light having entered the light concentrating optical element 10 can be trapped within the element. For instance, light reaching the interface between the substrate 11, with the refractive index thereof set so that $n_{axy}=1.64$, and the air with an angle of incidence equal to or greater than 37.6° is totally reflected at the interface and is trapped inside the light concentrating optical element 10. Light having been totally reflected at the bottom surface of the light concentrating optical element 10 is scattered via the micro-optical members 12 as it advances from the bottom surface toward the top surface side and thus, its advancing direction is deflected toward the x-axis.

Through these measures, the light constituted with the p-polarized light component, having entered the light concentrating optical element 10 from above, is directed either to the left or to the right along the x-axis substantially in its entirety. The light having been concentrated in this manner is guided to the photoelectric conversion elements 50 and 50 disposed at the ends of the light concentrating optical element 10 along the x direction and then enters the photoelectric conversion elements 50 and 50 as concentrated light.

Light having entered the light concentrating optical element 10 structured as described above through its top surface is scattered along the x-axis due to the difference between the refractive index of the substrate 11 and the refractive index of the micro-optical members 12 while minimizing the loss occurring as light is scattered along the z-axis, along which no difference in the refractive index manifests. In this structure, light constituted with the s-polarized light component (ordinary light) having entered the light concentrating optical element through the top surface thereof and advancing along the y-axis will be simply transmitted through the light concentrating optical element 10. By disposing another light concentrating optical element 10, similar to the first light concentrating optical element 10, further below relative to the bottom surface of the first light concentrating optical element 10 with a 90° rotation around the y-axis, the light constituted with the s-polarized light component having been transmitted through the upper light concentrating optical element can be concentrated with a high level of efficiency within the lower light concentrating optical element. A light concentrating device configured with two such light concentrating optical elements will be described in detail later.

(Light Concentrating Optical Element Achieved in the Fourth Embodiment)

The light concentrating optical element 20 in the fourth embodiment is configured by distributing birefringent micro-optical members 22 so as to align the major axis of birefringence to allow it to extend along the y-axis (see FIG. 19C). In the light having entered the light concentrating optical element 20 from above and advancing through the substrate, $n_{axy} \ne n_{bxy}$ is true for p-polarized light (ordinary light) advancing along the y-axis. In addition, $n_{azy} \ne n_{bzy}$ is true for s-polarized light (ordinary light) advancing along the y-axis in the light having entered the light concentrating optical element 20 from above and advancing through the substrate. This means that the micro-optical members 22 act as particles distinguishable from the medium (substrate 21) for both p-polarized light and s-polarized light in the light advancing along the y-axis. However, since $n_{ayx} \approx n_{byx}$, the micro-optical members 12 do not act as particles for p-polarized light (extraordinary light) advancing along the x-axis. The state of the substrate in this instance is equivalent to one in which particles are nonexistent (as if the medium were homogeneous with no micro-optical members 22 therein).

For this reason, while the light having entered the light concentrating optical element 20 from above and advancing along the y-axis undergoes Mie scattering via the micro-optical members 22 acting as particles in the medium due to the difference between the refractive indices, the p-polarized light advancing along the x-axis continues to advance along the x-axis without being scattered via the micro-optical members, which do not act as particles distinguishable from the medium with respect to the p-polarized light advancing along the x-axis.

According to the present invention achieved by taking advantage of the difference in the refractive index resulting from the birefringence occurring as described above, the scattering cross section changes in correspondence to the direction of polarization along which light entering the micro-optical members 22 is polarized and the angle of incidence at which light enters the micro-optical members 22. The change in the scattering cross section, in turn, alters the scattering efficiency. FIG. 21 schematically illustrates varying relationships between the angle of incidence at which light enters the micro-optical members 22 and the scattering of light, with the light diffused through scattering represented by three vectors as in FIG. 20. In addition, p-polarized light with the electric field amplitude ranging parallel to the drawing sheet is marked with double-ended arrows and s-polarized light with the electric field amplitude ranging perpendicular to the drawing sheet is marked with circles, each having a dot set at the center thereof, in FIG. 21.

The p-polarized light (the p-polarized light component) in the light having entered the light concentrating optical element 20 from above and advancing along the y-axis is scattered to a great extent when it enters the micro-optical members 22 with an angle of incidence of 0° relative to the y-axis, resulting in a maximum difference between the refractive indices and a maximum scattering cross section (see (a) in FIG. 21). When it enters the micro-optical members 22 with an angle of incidence in the range between 0° and 90°, the scattering efficiency varies with the scattering cross section corresponding to the difference between the refractive index of the substrate and the refractive index of the micro-optical member at the particular angle of incidence (see (b) and (c) in FIG. 21). However, light entering the micro-optical members 22 at an angle of incidence of 90° is not scattered, since there is no difference in the refractive indices and the scattering cross section becomes infinitely small (see (d) in FIG. 21). In addition, the scattering efficiency remains unchanged (see FIG. 21) for the s-polarized light (the s-polarized light component) in the light having entered the light concentrating optical element 20 from above and advancing along the y-axis, since the difference between the refractive indices remains constant regardless of the angle of incidence relative to the y-axis at which it enters the micro-optical member 22.

Both the p-polarized light and the s-polarized light in the light having entered the light concentrating optical element 20 from above and advancing along the y-axis are subjected to Mie scattering via the micro-optical members 22 acting as particles in the medium (substrate 21) and thus become multiply scattered.

As a result, the ratio of light continuing to advance along the y-axis (along the vertical direction) through the light concentrating optical element 20 after having entered the light concentrating optical element 20 along the vertical direction decreases, and instead, the ratio of light inclining diagonally downward in the xy plane increases and the ratio of light inclining diagonally downward in the yz plane both increase. The ratio of light inclining by a greater extent (ratio of light traveling as almost horizontal level rays) becomes greater further toward the bottom surface. In particular, the p-polarized light advancing along the x-axis (extraordinary light) continues to advance toward the positive-side end or the negative-side end along the x-axis, without becoming scattered via the micro-optical members 22. Light inclining downward along a diagonal direction by a large extent in the yz plane advances toward the positive-side end or the negative-side end along the z-axis as it is scattered via the micro-optical members 22.

If the inclining angle of light inclining toward the x-axis or the z-axis exceeds the critical angle of total reflection occurring at the interface between the substrate 21 and the air, light having entered the light concentrating optical element 20 is totally reflected at the bottom surface and is trapped within the light concentrating optical element 20. Light totally reflected at the bottom surface of the light concentrating optical element 20 is scattered via the micro-optical members 22 as it advances from the bottom surface toward the top surface side and thus, its advancing direction is deflected toward the x-axis or the z-axis.

Through these measures, the light constituted with the p-polarized light component having entered the light concentrating optical element 20 from above, is directed either to the left or to the right along the x-axis substantially in its entirety, whereas much of the s-polarized light, having entered the light concentrating optical element 20 from above, advances either forward or backward along the z-axis. Light having been concentrated in this manner is guided to the photoelectric conversion elements 50 and 50 disposed at the two ends of the light concentrating optical element 20 along the x-axis and photoelectric conversion elements 50 and 50 disposed at the two ends facing opposite each other along the z-axis. The light directed to the ends of the light concentrating optical element 20 then enters the photoelectric conversion elements 50 as concentrated light.

At the light concentrating optical element 20 structured as described above, light having entered the light concentrating optical element 20 through the top surface thereof is scattered along the x-axis and the z-axis due to the difference between the refractive index of the substrate 21 and the refractive index of the micro-optical members 22 and is input as concentrated light into the photoelectric conversion elements 50 disposed at the ends along the x-axis and the z-axis. While some of the s-polarized light advancing through the light concentrating optical element 20 may exit the light concentrating optical element 20 through its top surface or bottom surface, a light concentrating device and a photovoltaic power generation device, each capable of concentrating light along both the x-axis and the z-axis through a simple structure that includes only a single light concentrating optical element, can be configured.

(Size Parameter)

The optimal structures that may be adopted for the substrates 11 and 21 and the micro-optical members 12 and 22 can be described in more specific detail based upon the Mie scattering theory, as with the substrates and the micro-optical members in the first and second embodiments. Accordingly, the size parameter α defined as in (1) is used in the third and fourth embodiments, as in the first and second embodiments. Namely, the substrate 11 at the light concentrating optical element 10 (20) is not a birefringent member, and the medium has a constant refractive index; $n=n_{axy}=n_{ayx}=n_{azy}=1.64$. In addition, the refractive index $n_{bxy}$ of the particles is 1.88, and the wavelength λ of the incident light is equal to 633 nm.

The size parameter α for the light concentrating optical element, comprising a substrate and micro-optical members, should be set in a range; $1.5 \leq \alpha \leq 40$, and it is even more desirable to set the size parameter α in a range; $2 \leq \alpha \leq 20$, as in the first and second embodiments. In addition, the particle diameter d of the micro-optical members should be set equal to or less than 20 μm and even more desirably to a value equal to or less than 10 μm.

The following is a description of specific examples of the light concentrating optical element 10 in the third embodiment and the light concentrating optical element 20 in the fourth embodiment, manufactured through specific manufacturing processes. It is to be noted that for purposes of comparison, a description of a specific example of a light concentrating optical element comprising a substrate and micro-optical members with neither the substrate nor the micro-optical members having a birefringence property, will be provided following the description of the examples of the light concentrating optical elements 10 and 20.

(A Specific Example of a Light Concentrating Optical Element Achieved in the Third Embodiment)

The substrate 11 and the micro-optical members 12 in the light concentrating optical element 10 in the third embodiment may be designed to fulfill the following conditions.

refractive index of the substrate: $n_{axy}=n_{ayx}=n_{azy}=1.64$ refractive index of the micro-optical members: $n_{bxy}=1.88$ (refractive index for extraordinary rays) $n_{byx}=n_{bzy}=1.64$ (refractive index for ordinary rays)

particle diameter of the micro-optical members: d=1.0 μm (particle diameter following the drawing step)

distribution density of the micro-optical members: 0.1 particles/μm³

The size parameter α is calculated to be 8.14 when the wavelength λ of the incident light is 633 nm.

The conditions set as listed above represent a manufacturing process through which the light concentrating optical element 10 is manufactured by using a naphthalate 70-terephthalate 30 copolyester (coPEN) monomer for the substrate 11, using polyethylene naphthalate (PEN) particles for the micro-optical members 12, forming a sheet with the micro-optical members 12 evenly dispersed within the substrate 11 and uniaxially drawing the sheet along the x-axis. At the substrate 11 (coPEN) which does not have a birefringence property, a uniform refractive index is applied to rays of light advancing in all directions, i.e., $n_{axy}$, $n_{ay}$, and $n_{azy}$ are all equal to each other at approximately 1.64. The micro-optical members 12, on the other hand, assume a refractive index along the drawing direction (along the x-axis) different from that assumed along other directions. Namely, they have a refractive index of approximately 1.88 for light polarized in a plane ranging along the drawing direction and a refractive index of approximately 1.64 for light polarized in a plane ranging along another direction. It is to be noted that light scattering theory supports micro-optical members that are not spherical and that the micro-optical members in this light concentrating optical element should be manufactured so as to fulfill the conditions set forth above in correspondence to the dimensions of the drawn micro-optical members (particles) converted to the diameter of an equivalent circle.

The micro-optical members 12 in the light concentrating optical element are uniaxial anisotropic birefringent members with the major axis of birefringence oriented along the x-axis. This means that the refractive index at which p-polarized light having entered a micro-optical member 12 is refracted changes in correspondence to the angle of incidence of the light within the xy plane, resulting in a change in the difference between the refractive index of the micro-optical member 12 and the refractive index of the substrate 11. This, in turn, alters the scattering cross section in Mie scattering theory, leading to a change in the scattering efficiency. More specifically, the scattering cross section decreases as the angle of incidence measured in reference to the y-axis (0°) increases.

Figure 22:
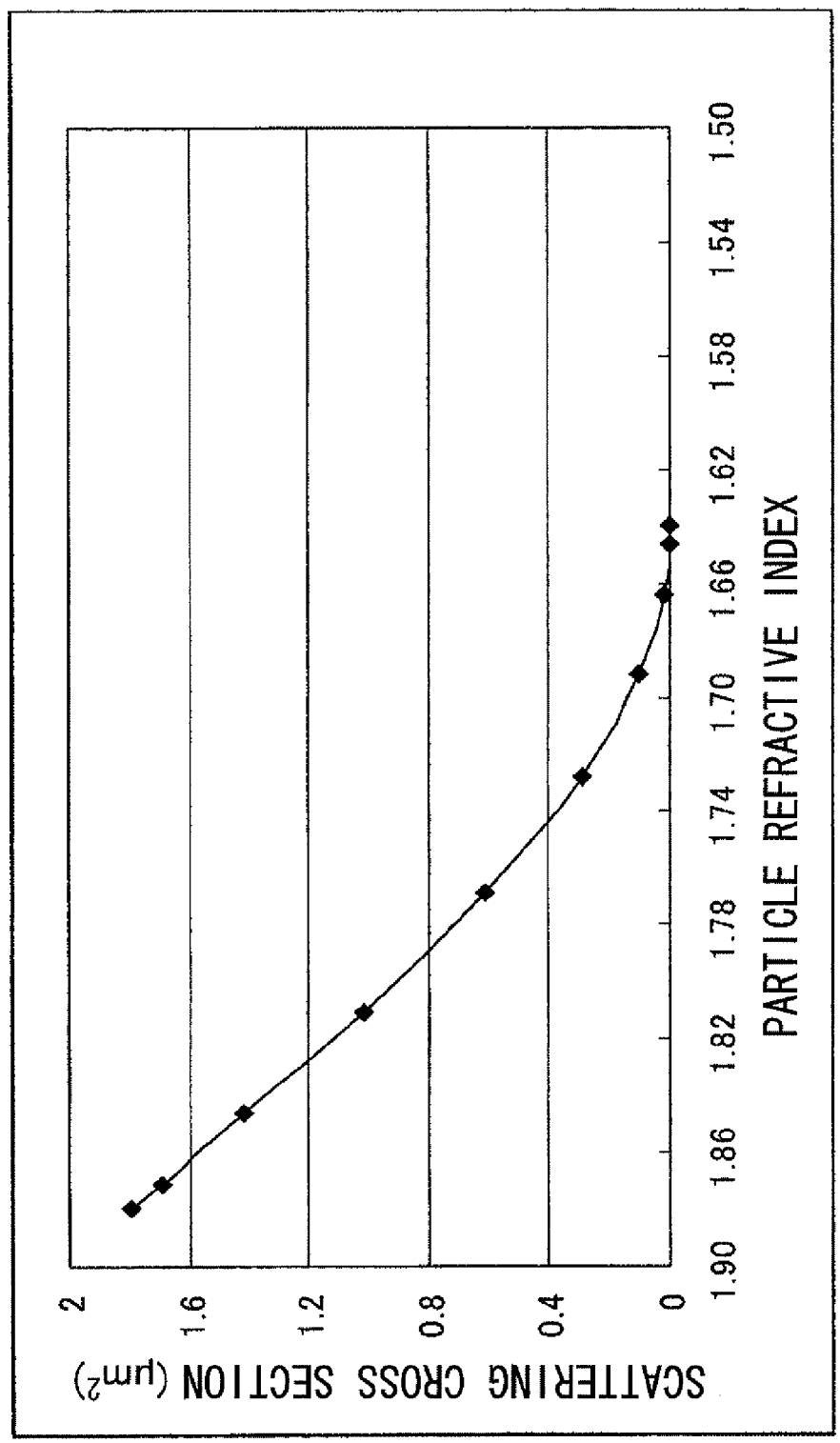
FIG. 22 is a graph indicating a relationship observed between the refractive index of the micro-optical members and the scattering cross section.

FIG. 22 is a graph indicating how the scattering cross section changes as the refractive index of the micro-optical members (particles) 12 changes in correspondence to a change in the angle of incidence at which light enters the micro-optical members, with the refractive index of the micro-optical members 12 indicated along the horizontal axis and the scattering cross section indicated along the vertical axis. In the graph, the value calculated for an angle of incidence of 0° (vertical entry) at the micro-optical members 12 is represented by the filled square at the upper left end, the value calculated for an angle of incidence of 90° (horizontal entry) at the micro-optical members 12 is represented by the filled square at the lower right end and values calculated in increments of 10° in the angle of incidence are plotted. The graph in FIG. 22 indicates that the scattering cross section changes substantially in proportion to the change in the refractive index of the micro-optical members over the range in which the refractive index of the micro-optical member 12 is high (i.e., the difference between the refractive index of the micro-optical members and the refractive index of the substrate is significant) and that the scattering cross section changes to a lesser extent relative to the change in the refractive index of the micro-optical members over the range in which the refractive index of the micro-optical members 12 is low (i.e., the difference between the refractive index of the micro-optical member and the refractive index of the substrate is small).

FIG. 23 presents a table indicating how the angle of incidence at micro-optical members affects various indices including the scattering cross section and the scattering probability calculated by taking into consideration the distribution density with which the micro-optical members are dispersed. The table includes angles of incidence at particles, each taking a specific value at which light enters the micro-optical members with the x-axis forming a 90° angle relative to the y-axis (0°) in the xy plane. The scattering efficiency is calculated by dividing the scattering cross section determined based upon Mie scattering theory by the geometric area ($\pi d^2/4$) of the micro-optical members. In addition, the scattering coefficient is calculated by multiplying the scattering cross section by the micro-optical member density (i.e., the number of particles per unit volume), whereas the scattering probability is calculated by multiplying the scattering cross section by $\frac{2}{3}$ power of the micro-optical member density.

At the light concentrating optical element 10 structured as described above, light having entered the light concentrating optical element 10 through the top surface along the vertical direction and advancing as p-polarized light along the y-axis becomes scattered through a Mie scattering phenomenon via the micro-optical members 12 present in the medium (substrate 11) acting as particles. Assuming that the particle diameter of the micro-optical members 12 is 1 µm and the particles are dispersed with a density of 0.1 particles/µm³, approximately 40% of the incident light will be scattered during the initial stage of scattering occurring near the surface with approximately 60% of the incident light allowed to advance straight ahead without being scattered. Then, approximately 40% of the light having been allowed to advance straight ahead is scattered via micro-optical members 12 present at the next stage among the micro-optical members 12 dispersed along the thickness-wise direction. In this way, all the light having entered the element is eventually scattered. The scattered light inclines downward along a diagonal direction, forming an angle relative to the y-axis.

Some of the light having been caused to incline diagonally downward relative to the y-axis is bent at the next stage so as to advance with an even greater incline (so as to increase the angle of incidence) and some other part of the light is bent so as to resume the vertical orientation (so as to decrease the angle of incidence), while the remainder of the light continues to advance with no change in the angle of incidence (see FIG. 17). However, the scattering probability of light inclining along the diagonal direction is lowered as the angle of incidence increases (becomes closer to horizontal). The decrease in the scattering probability is attributed to a sudden and acute decrease in the scattering cross section due to a reduced difference between the refractive index of the medium (substrate 11) and the refractive index of the particles (micro-optical members 12) (see FIGS. 22 and 23). As a result, the ratio of light with large angles of incidence subjected to scattering is lowered and the ratio of light reverting to the initial orientation, too, decreases.

As the inclining angle (angle of incidence) of light advancing through the medium becomes close to 90°, the refractive index $n_{bxy}$ of the particles and the refractive index $n_{axy}$ of the medium become substantially equal to each other, resulting in the scattering probability taking on a value small enough to be disregarded. Thus, as light advances through numerous stages, it is directed toward the positive-side end or the negative-side end along the 90° direction, i.e., along the x-axis and becomes trapped along the planar direction.

It is to be noted that even light advancing through the medium and reaching the bottom surface of the light concentrating optical element at an angle other than exactly 90° will be trapped within the plane as long as the inclining angle exceeds the critical angle of total reflection occurring at the interface between the medium and the air. In the light concentrating optical element manufactured through the manufacturing process described above, light will be totally reflected at the interface as long as it enters the interface between the substrate 11 and the air at an angle of incidence equal to or greater than 37.6°. As the light having been totally reflected advances through the medium toward the top surface side, it is multiply scattered via the micro-optical members 12 and is ultimately directed as concentrated light to the positive-side end or the negative-side end along the 90° direction, i.e., along the x-axis (see FIGS. 30 and 31).

Accordingly, by designing the substrate 11 and the micro-optical members 12 so as to allow light traveling toward the bottom surface through a layer of micro-optical members 12 dispersed closest to the bottom surface to be totally reflected at the bottom surface, the p-polarized light having entered the light concentrating optical element 10 can be directed in its entirety as concentrated light toward the positive-side end of the light concentrating optical element 10. The light concentrating optical element 10 structured as described above can assume a low-profile.

Figure 24:
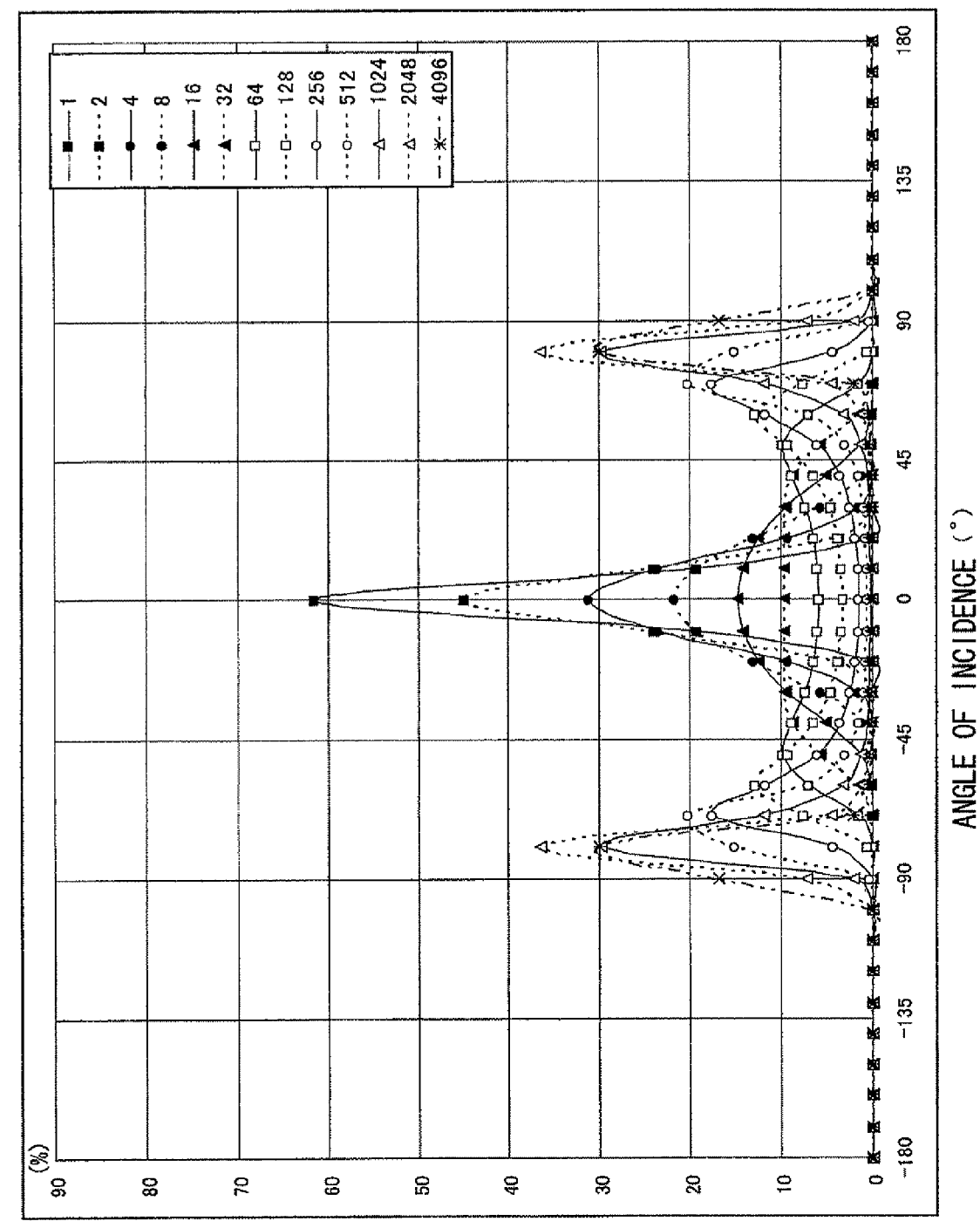
FIG. 24 is simulation obtained through calculation, indicating various angle distributions achieved at different stages of scattering of light having entered a light concentrating optical element at normal incidence.

FIG. 24 provides simulation obtained through calculation executed by using the indices listed in FIG. 23, indicating how the angle distribution of light having entered the light concentrating optical element 10 along the vertical direction changes as it is scattered. In FIG. 24, the horizontal axis indicates the angle of light (the angle of incidence at which it enters particles) with the angle of light entering the light concentrating optical element 10 along the vertical direction set at 0° and the x-axis forming ±90° within the xy plane, whereas the ratios (percentages) of light oriented along various angular directions indicated along the vertical axis. The parameters represented by squares, circles, triangles and the like in the figure each indicate a specific number of scattering stages through which light is scattered via the particles (micro-optical members 12) and data are plotted every $2^n$ times.

These simulation clearly indicate that more of the light, having initially entered the light concentrating optical element along the vertical direction, becomes inclined toward the positive range and the negative range of the x-axis as the scattering process, achieved via the particles, continues on to a more advanced stage. A thorough examination of the data reveals that up to approximately the 16th stage in the scattering process achieved via the particles, the amount of light traveling along the 0° direction keeps decreasing, resulting in an increased width in the angle distribution. However, the ratio of light advancing along the 0° direction remains the highest through the initial phase and thus, a cresting distribution pattern with a single peak is assumed during the initial phase. A relatively flat distribution pattern with hardly any peak manifests at the 32nd stage, and this relatively flat distribution pattern changes into a distribution pattern with a gentle dip at the center at the 64th stage and the 128th stage. Beyond the 256th stage, a clear double peak pattern having left/right symmetry manifests, and practically no light in the range of 20° to +20° is observed at the 512th stage. Beyond the 1024th stage, the extent of change in the angle assuming a peak value decreases with clear peaks occurring at approximately ±80°, with hardly any light observed in the range of −40° to +40°.

Based upon the simulation, it can be safely assumed that by the time the scattering process achieved via the particles advances to approximately the 1000th stage, most of the light propagates through the element with angles equal to and greater than +40° and angles equal to and less than −40°, i.e., with angles exceeding the critical angle of total reflection occurring at the interface between the substrate 11 and the air. Accordingly, incident light can be trapped within the light concentrating optical element 10 and the light thus trapped can be input as concentrated light to the photoelectric conversion elements 50 and 50 disposed at the two ends facing opposite each other along the x-axis by configuring the light concentrating optical element 10 so as to induce multiple scattering via the micro-optical members 12 of light entering the substrate 11 along the vertical direction through 1000 stages or more.

(A Specific Example of a Manufacturing Process Through which the Light Concentrating Optical Element Achieved in the Fourth Embodiment)

The substrate 21 and the micro-optical members 22 in the light concentrating optical element 20 in the fourth embodiment may be designed to fulfill the following conditions.

refractive index of the substrate: $n_{axy}=n_{ayx}=n_{azy}=1.49$
refractive index of the micro-optical members: $n_{bxy}=1.49$ (refractive index for extraordinary rays)
$n_{bxy}=n_{bzy}=1.66$ (refractive index for ordinary rays)
particle diameter of the micro-optical members: d=1.0 μm
distribution density of the micro-optical members: 0.1 particles/μm$^3$ The size parameter α is calculated to be 7.40 when the wavelength λ of the incident light is 633 nm. It is to be noted that the light concentrating optical element 20 in the fourth embodiment manufactured in this example includes micro-optical members with a negative birefringence property (whereby the refractive index for extraordinary rays of light is lower than the refractive index for ordinary rays).

The conditions set as listed above represent a manufacturing process through which the light concentrating optical element 20 is manufactured by using a thermosetting polymer, prepared so as to achieve a refractive index of 1.49 after the polymer is set, to constitute the substrate 21, using calcite particles with dimensions equal to a diameter of 1 μm of an equivalent circle for the micro-optical members 22, pouring a solution of the thermosetting polymer to constitute the substrate 21, mixed with the calcite particles to constitute the micro-optical members 22, which are dispersed uniformly therein, into a mold used to form a flat plate and hardening the solution through heat application with a 3 kV/mm voltage applied to the top side and the bottom side of the mold. At the substrate 21 (hardened polymer) which does not have a birefringence property, a uniform refractive index is applied to rays of light advancing in all directions, i.e., $n_{axy}$, $n_{ayx}$ and $n_{azy}$ are all equal to each other at approximately 1.49. The micro-optical members 22, on the other hand, assume a refractive index along the direction in which the voltage is applied (along the y-axis) aligned with the extraordinary axis of the dielectric constant, which is different from the values taken for the refractive index along other directions. Namely, a refractive index of approximately 1.49 is assumed for light, the polarization plane of which ranges along the direction of the voltage application, whereas a refractive index of approximately 1.66 is assumed along the other directions.

The micro-optical members 22 in this light concentrating optical element are uniaxial anisotropic birefringent members with the major axis of birefringence oriented along the y-axis. This means that the refractive index at which light entering a micro-optical member 22 is refracted, changes in correspondence to the angle of incidence of the light at the micro-optical member 22, resulting in a change in the difference between the refractive index of the micro-optical member 12 and the refractive index of the substrate 21. This, in turn, alters the scattering cross section in Mie scattering theory, leading to a change in the scattering efficiency. In the xy plane, the scattering cross section decreases as the angle of incidence measured in reference to the y-axis (0°) increases.

Figure 25:
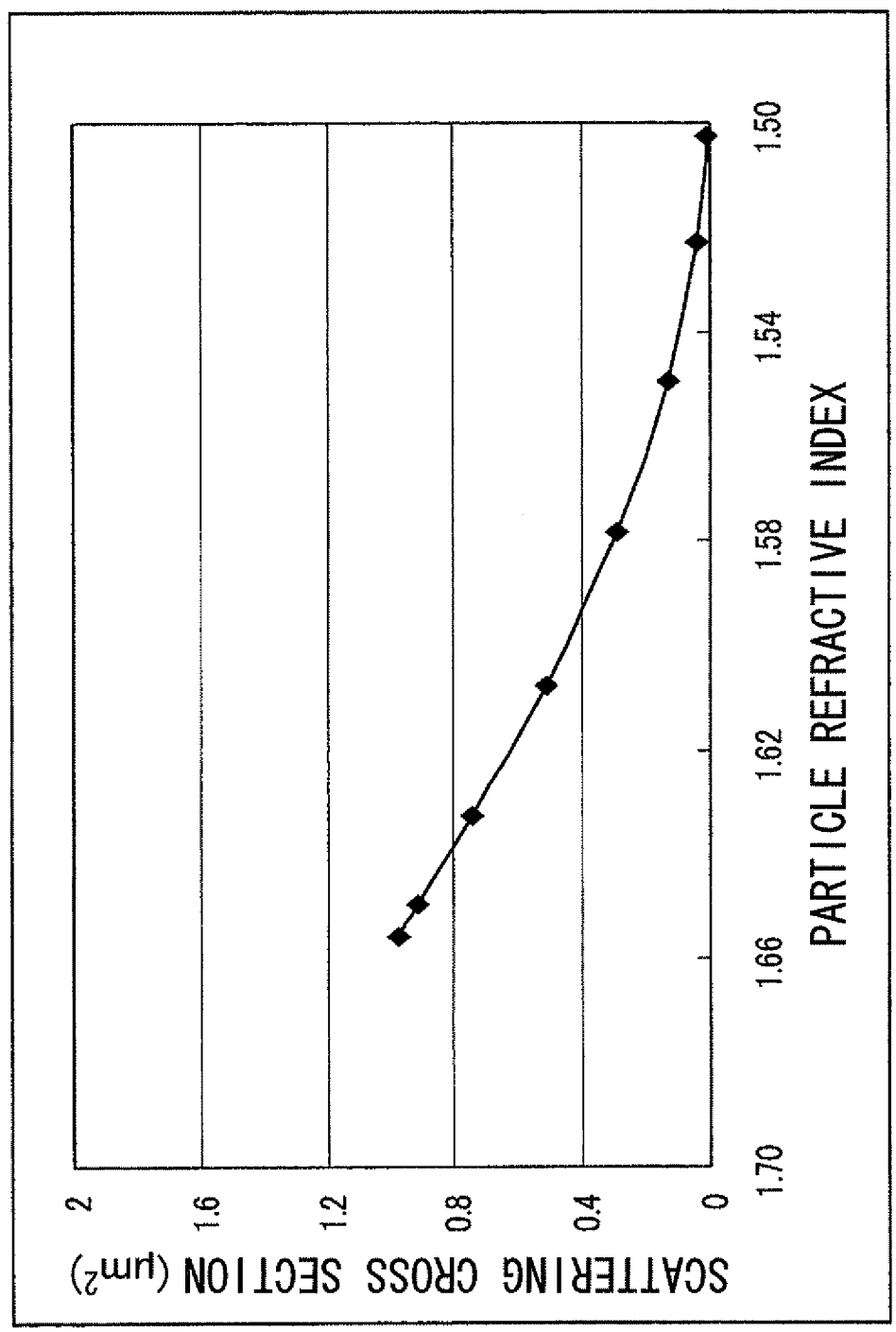
FIG. 25 is a graph indicating a relationship observed between the refractive index of the micro-optical members and the scattering cross section.

FIG. 25 is a graph indicating how the scattering cross section changes as the refractive index at the micro-optical members (particles) 22 changes in correspondence to a change in the angle of incidence at which light enters the micro-optical members in the xy plane, with the refractive index of the micro-optical members 22 indicated along the horizontal axis and the scattering cross section indicated along the vertical axis. In the graph, the value calculated for an angle of incidence of 0° (vertical entry) at the micro-optical members 22 is represented by the filled square at the upper left end, the value calculated for an angle of incidence of 90° (horizontal entry) at the micro-optical members 22 is represented by the filled square at the lower right end and values calculated in increments of 10° in the angle of incidence are plotted. The graph in FIG. 25 indicates that the scattering cross section changes substantially in proportion to the change in the refractive index of the micro-optical member over the range in which the refractive index of the micro-optical members 22 is high (i.e., the difference between the refractive index of the micro-optical members and the refractive index of the substrate is significant) and that the scattering cross section changes to a lesser extent relative to the change in the refractive index of the micro-optical members over the range in which the refractive index of the micro-optical members 22 is low (i.e., the difference between the refractive index of the micro-optical members and the refractive index of the substrate is small).

FIG. 26 presents a table indicating how the angle of incidence at the micro-optical members affects the various indices including the scattering cross section and the scattering probability calculated by taking into consideration the distribution density with which the micro-optical members are dispersed. The table includes angles of incidence at particles, each taking a specific value at which light enters the micro-optical members with the x-axis forming a 90° angle relative to the y-axis (0°) in the xy plane. The includes of the scattering efficiency, the scattering coefficient and the scattering probability are all calculated as has been described in reference to the specific example of the light concentrating optical element 10 in the third embodiment (see FIG. 23).

At the light concentrating optical element 20, light having entered the light concentrating optical element 20 through the top surface along the vertical direction and advancing as p-polarized light along the y-axis becomes scattered through a Mie scattering phenomenon via the micro-optical members 22 present in the medium acting as particles. Assuming that the particle diameter of the micro-optical members 22 is 1 μm and the particles are dispersed with a density of 0.1 particles/μm$^3$, scattering occurs much as has been described in reference to the third embodiment, with approximately 40% of the incident light scattered at the initial stage of scattering effected near the surface and then the 40% of the light having been allowed to advance straight ahead is scattered via micro-optical members 12 present at the next stage. In this way, all the light having entered the element is eventually scattered.

The scattered light becomes inclined relative to the y-axis and the inclining angle increases gradually.

Figure 27:
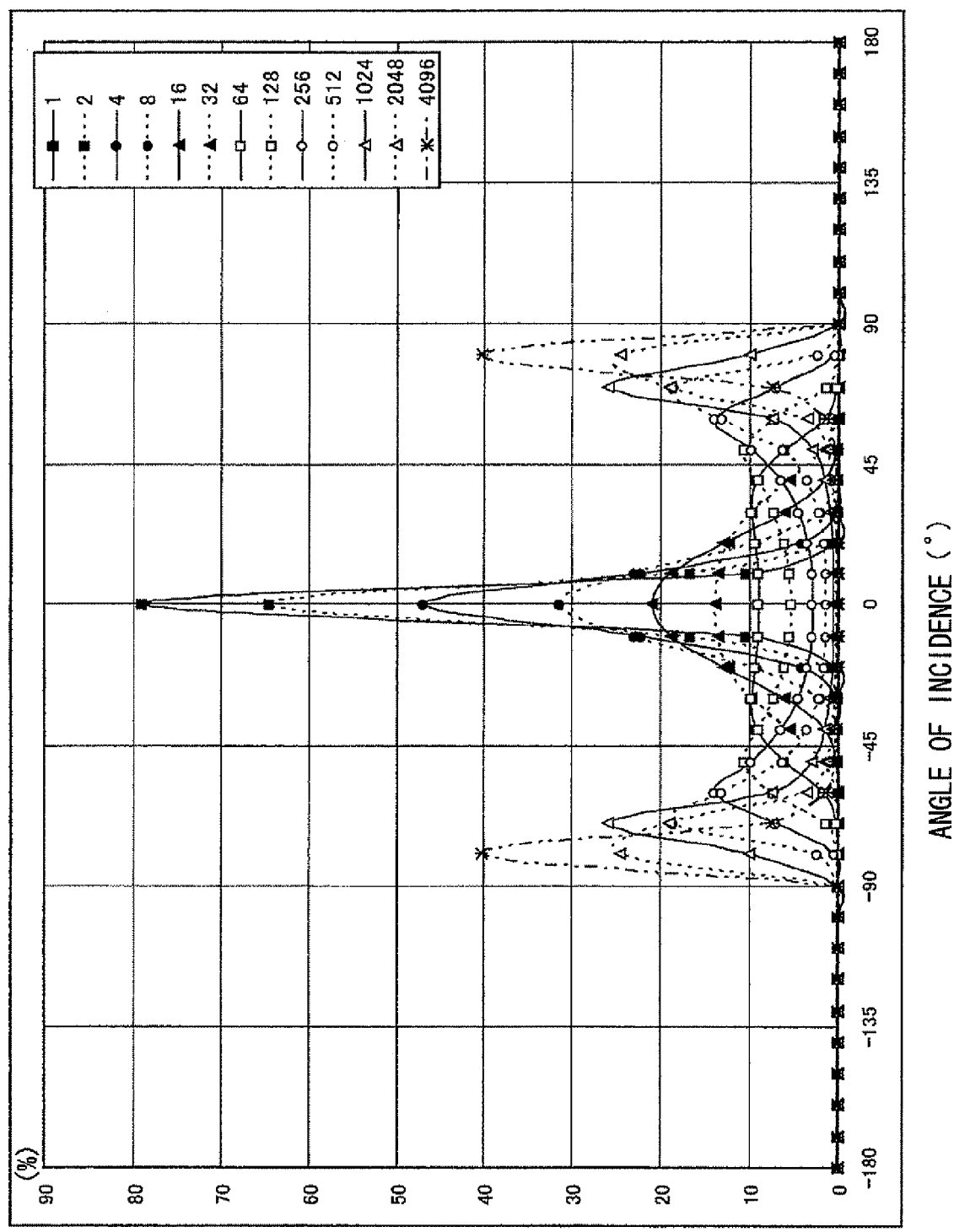
FIG. 27 provides simulation obtained through calculation, indicating various angle distributions achieved at different stages of scattering of light having entered a light concentrating optical element at normal incidence.

FIG. 27 provides simulation similar to those provided in FIG. 24, obtained through calculation, indicating how the angle distribution of light having entered the light concentrating optical element 20 along the vertical direction changes as it is scattered. In FIG. 27, the horizontal axis indicates the angle of light (the angle of incidence at which it enters particles) with the angle of light entering the light concentrating optical element 20 along the vertical direction set at 0° and the x-axis forming ±90° within the xy plane, whereas the ratios (percentages) of light oriented along various angular directions indicated along the vertical axis. The parameters represented by squares, circles, triangles and the like in the graph each indicate a specific number of scattering stages through which light is scattered via the particles (micro-optical members 12) and data are plotted every 2° times.

These simulation indicate that more of the light, having initially entered the light concentrating optical element along the vertical direction, becomes inclined toward the positive range and the negative range of the x-axis as the scattering process, achieved via the particles, continues on to a more advanced stage. This basic tendency is similar to that observed in the description of the specific example of the light concentrating optical element 10 achieved in the third embodiment. A thorough examination of the data reveals that up to approximately the 32nd stage in the scattering process achieved via the particles, the amount of light traveling along the 0° direction keeps decreasing, resulting in an increased width in the angle distribution. However, the ratio of light advancing along the 0° direction remains the highest through the initial phase and thus, a cresting distribution pattern with a single peak is assumed during the initial phase. A relatively flat distribution pattern with hardly any peak manifests at the 64th stage, and this relatively flat distribution pattern changes into a distribution pattern with a gentle dip at the center at the 128th stage and the 256th stage. Beyond the 512th stage, a clear double peak pattern, having left/right symmetry manifests, and practically no light in the range of −20° to +20° is observed at the 1024th stage. Beyond the 2048th stage, the extent of change in the angle assuming a peak value decreases with clear peaks occurring at approximately ±80°, with hardly any light observed in the range of −40° to +40°.

Based upon the simulation, it can be safely assumed that by the time the scattering process achieved via the particles advances to approximately the 2000th stage, most of the light propagates through the element with angles equal to and greater than +40° and angles equal to and less than −40°, i.e., with angles exceeding the critical angle of total reflection occurring at the interface between the substrate 21 and the air. Accordingly, incident light can be trapped within the light concentrating optical element 20 and the light thus trapped can be input as concentrated light to the photoelectric conversion elements 50 and 50 disposed at the two ends facing opposite each other along the x-axis by configuring the light concentrating optical element 20 so as to induce multiple scattering, via the micro-optical members 22, of light entering the substrate 21 along the vertical direction through 2000 stages or more. Oblique incident light that enters the light concentrating optical element along a diagonal direction, instead of the vertical direction, becomes trapped through fewer scattering stages compared to the vertical incident light at this light concentrating optical element.

(Comparison Example)

For purposes of comparison, simulation for a light concentrating element comprising a substrate and micro-optical members, neither of which have a birefringence property, have been obtained through similar simulation. The substrate and the micro-optical members are designed so as to achieve the following conditions.

refractive index of the substrate: $n_{axy}=n_{ayx}=n_{azy}=1.49$ refractive index of the micro-optical members: $n_{bxy}=n_{byx}=n_{bzy}=1.66$ particle diameter of the micro-optical members: $d=1.0\ \mu m$ distribution density of the micro-optical members; 0.1 particles/$\mu m^3$ The size parameter α is calculated to be 7.40 when the wavelength λ of the incident light is 633 nm.

Figure 29:
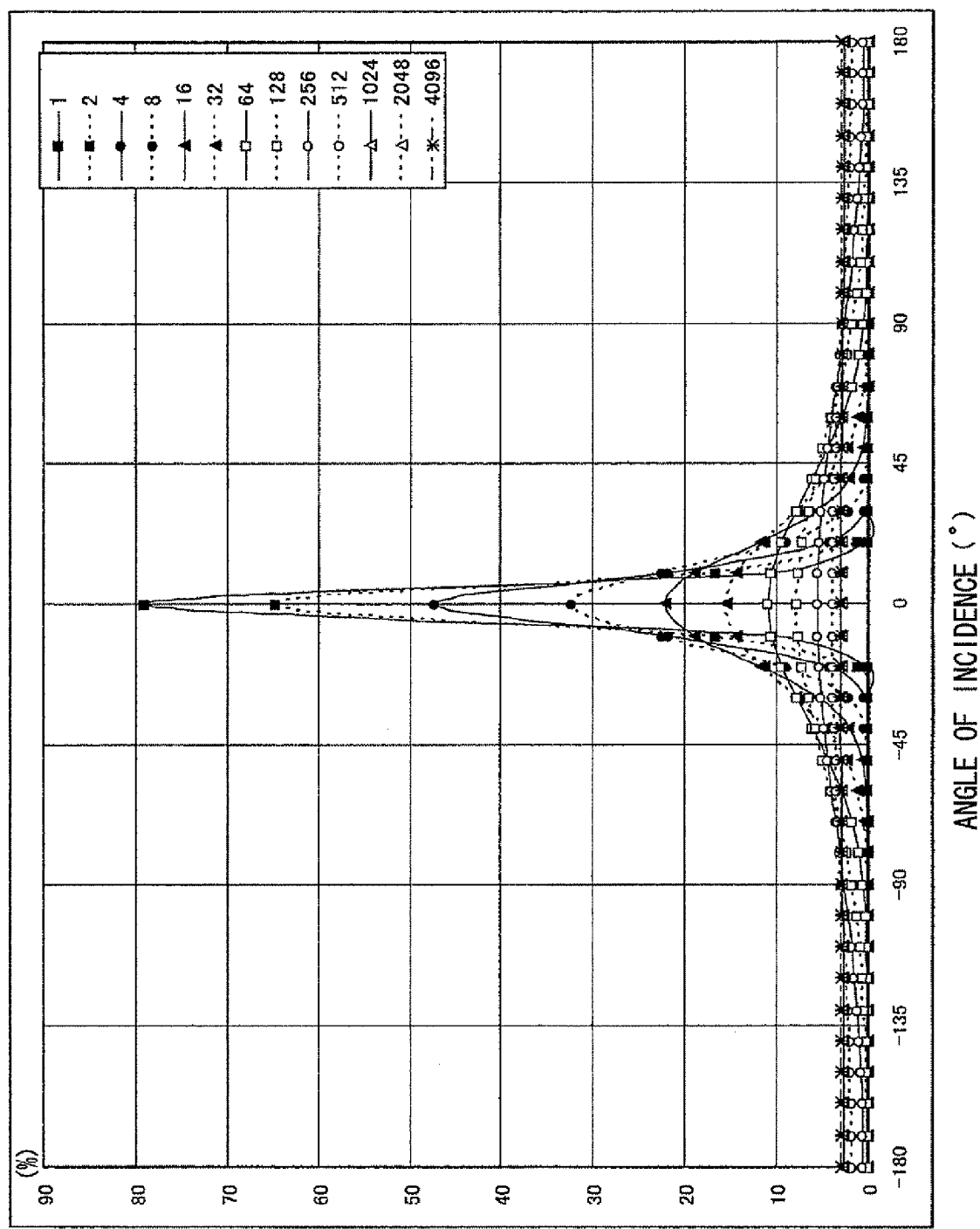
FIG. 29 provides simulation obtained through calculation, indicating various angle distributions achieved at different stages of scattering of light having entered a light concentrating optical element normal incidence.

FIG. 28 presents a table similar to those presented in FIGS. 23 and 26, indicating how the angle of incidence at the micro-optical member affects the various indices including the scattering cross section and the scattering probability. FIG. 29 provides simulation similar to those provided in FIG. 24 and FIG. 27, obtained through calculation, indicating how the angle distribution of light having entered the light concentrating optical element along the vertical direction changes as it is scattered.

The simulation in FIG. 29 indicate how light having entered the light concentrating optical element along the vertical direction becomes scattered as the scattering process achieved via the particles, continues to a more advanced stage. In addition, by comparing the simulations with those provided in FIG. 24 and FIG. 27, it is ascertained that the scattering process occurring at the light concentrating optical element in the comparison example is clearly different from the scattering process that occurs at the light concentrating optical element achieved in the third embodiment or the scattering process that occurs at the light concentrating optical element achieved in the fourth embodiment.

Namely, at the light concentrating optical element in the third embodiment, which may be manufactured through the specific manufacturing process described above, or at the light concentrating optical element in the fourth embodiment, which may be manufactured through the specific manufacturing process described above, light having entered therein along the vertical direction becomes inclined toward the positive range and the negative range along the x-axis through scattering, eventually manifesting two clear peaks after a specific number of scattering stages. However, no such tendency is observed in the comparison example.

A thorough examination of the data reveals that the tendency observed during the initial phase, whereby the angle distribution width increases as the light is scattered via the particles and the amount of light advancing along the 0° direction decreases, is similar to that observed during the initial phase at the light concentrating optical element in the third embodiment and the light concentrating optical element in the fourth embodiment. However, the comparison example is distinguishable from the embodiments in that this tendency is sustained even as the scattering process continues on to an advanced stage with the angle distribution continuing to broaden and that the ratio of light advancing with angles exceeding 90', i.e., advancing through 90 through 180° directions, closer to the orientation of the incident light, increases as the scattering process continues on to advanced stages. This is simply a phenomenon whereby light having entered the element is merely diffused as it is scattered via the particles present in the medium. As light reaches the surface facing opposite the entry surface, all rays forming angles smaller than the critical angle of total reflection will be allowed to exit the light concentrating optical element. As this occurs repeatedly, light trapped inside the light concentrating optical element will be depleted.

Accordingly, it can be easily surmised that even if this light concentrating optical element is manufactured so as to fulfill exactly the same conditions for the refractive indices of the substrate and the micro-optical members, the particle diameter of the micro-optical members, the micro-optical member distribution density and the like, as those in either of the two specific examples while selecting a Mie scattering size parameter exactly equal to that in either of the two specific examples, incident light cannot be trapped inside the light concentrating optical element in the comparison example and thus concentrated light cannot be input with a high level of efficiency to photoelectric conversion elements disposed at the ends of the element.

While the light concentrating optical elements achieved in the embodiments described above each include a substrate without a birefringence property and micro-optical members having a positive or negative birefringence property, the present invention may be adopted in a light concentrating optical element having non-birefringent micro-optical members and a substrate having a positive or negative birefringence property (see FIG. 18B and FIG. 19B) or in a light concentrating optical element comprising a birefringent substrate and birefringent micro-optical members. In addition, while the explanation has been given on an example in which, for the sake of simplification, the wavelength of light entering the light concentrating optical element is uniform, the particle diameter d of the micro-optical members can be set to an optimal value corresponding to the wavelength band of the target light to be concentrated if the incident light assumes a certain range. In more specific terms, the particle diameter d may be set in conjunction with target light in a wavelength band ranging from 400 to 1800 nm corresponding to the sunlight radiation spectrum, target light in a wavelength band ranging from 400 to 800 nm corresponding to an intense radiation spectrum or target light in a wavelength band assuring a high level of conversion efficiency for the photoelectric conversion elements 50 in the photovoltaic power generation device to be described next. The particle diameter d of the micro-optical members may be set based upon the center, the gravitational center or the like of such a wavelength band, or a plurality of particle diameters d1, d2, d3 . . . , each corresponding to a specific wavelength band segment among the wave band segments obtained by dividing the whole wavelength range into a plurality of segments (i.e., particle diameters of a plurality of micro-optical members in a mixture made up with a micro-optical members having different particle diameters) may be set.

(Structural Examples for Light Concentrating Devices and Photovoltaic Power Generation Devices)

Figure 30:
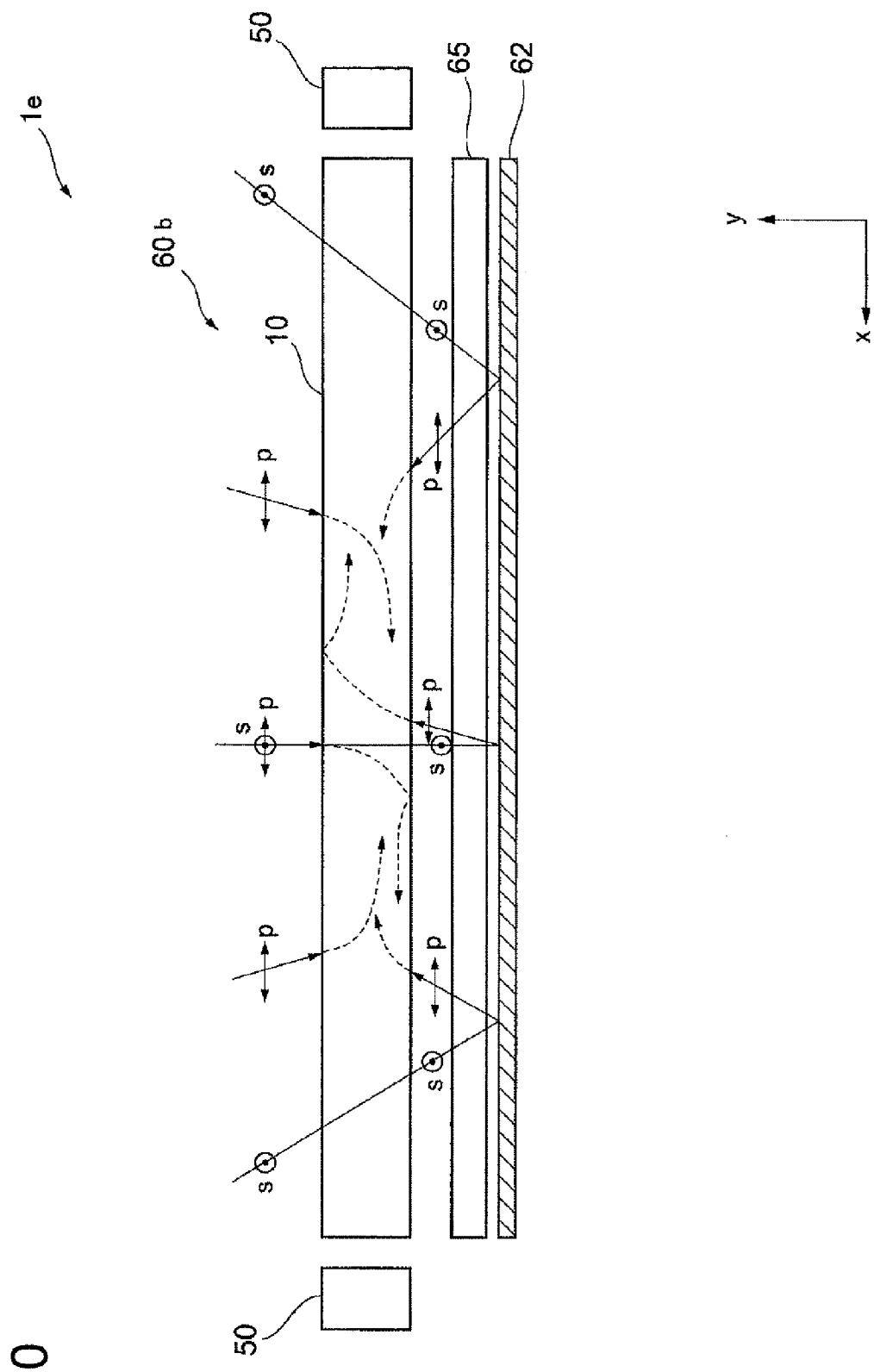
FIG. 30 is a schematic diagram showing the structure of a light concentrating device.
Figure 31:
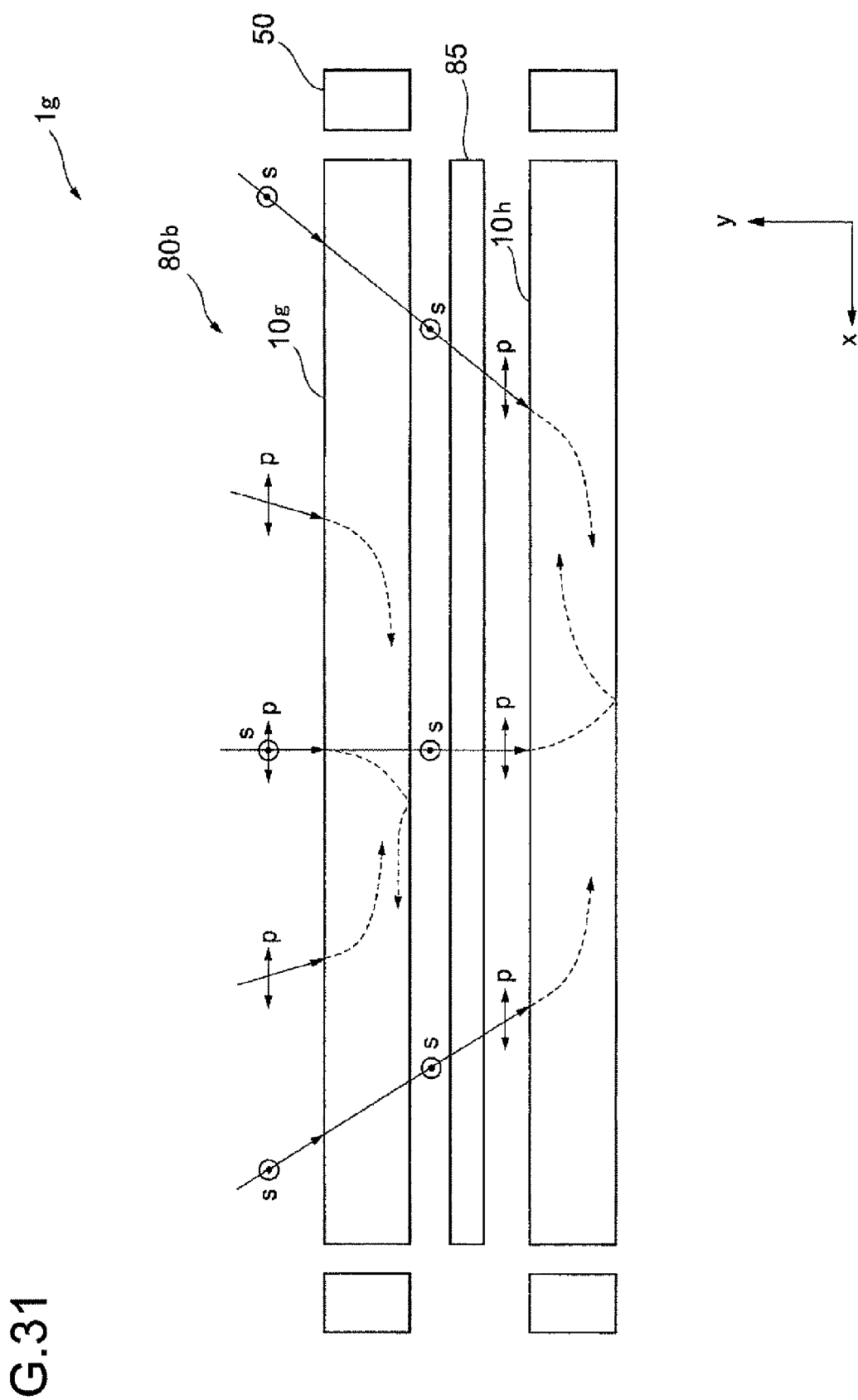
FIG. 31 is a schematic diagram showing the structure of a light concentrating device.

FIGS. 30 and 31 each present an example of a light concentrating device and a photovoltaic power generation device that may be configured with a polarization plane rotating element 65 and a reflecting mirror 62 or with a polarization plane rotating element 85. Light concentrating devices 60b, 70b and 80b and photovoltaic power generation devices 1e, 1f and 1g, each configured with a light concentrating optical element 10 achieved in the third embodiment and/or the light concentrating optical element 20 achieved in the fourth embodiment, may include a plurality of light concentrating optical elements stacked one on top of another and a polarization plane rotating element or a reflecting mirror used in conjunction with a light concentrating optical element, as do the light concentrating devices 60a, 70a and 80a configured with the light concentrating optical element 10 in the first embodiment, the light concentrating devices configured with the light concentrating optical element 20 in the second embodiment and the photovoltaic power generation devices 1a, 1b and 1c. Accordingly, a description of the structure adopted for the light concentrating device 60b and the photovoltaic power generation device 1e in FIG. 30 will be redundant and thus will not be provided. Likewise, a description of the light concentrating device 70b and the photovoltaic power generation device 1f (not shown) will be redundant and thus will not be provided, and a description of the structure adopted for the light concentrating device 80b and the photovoltaic power generation device 1g in FIG. 31 will not be provided either.

(Methods of Light Energy Extraction at End Areas of Light Concentrating Optical Elements)

The energy of light concentrated at the positive-side end and the negative-side end facing opposite each other along the x-axis at the light concentrating optical element 10 in the third embodiment and at the light concentrating optical element 20 in the fourth embodiment as described above may be extracted in much the same way as the energy of light concentrated at the ends of the light concentrating optical element 10 in the first embodiment and the light concentrating optical element 20 in the second embodiment is extracted as explained earlier in reference to FIGS. 16A through 16E.

It is to be noted that, in order to simplify the explanation, the light concentrating optical elements achieved in the third and fourth embodiments are described as those assuming a plate form. In addition, the functions of the light concentrating optical elements achieved in the embodiments are described in specific detail by quoting specific materials used to constitute the substrate and the micro-optical members and defining values taken for their refractive indices accordingly. However, embodiments of the present invention are not limited to such substructure modes or structural examples. For instance, the present invention may be adopted in a light concentrating optical element formed as a thin sheet or a light concentrating optical element formed as a rod (a bar shape or a linear shape) such as the shape of a prismatic column or a circular column. In addition, the present invention may be adopted in a light concentrating optical element comprising a substrate and micro-optical members constituted of optimal materials selected from various resin materials, inorganic materials and the like. Furthermore, the light concentrating optical element according to the present invention may include another member in addition to the substrate and the micro-optical members, as long as the presence of the additional member does not cause a departure from the spirit of the invention.

As described above, particulate micro-optical members, with a particle diameter set in an order substantially matching the order of the wavelength of the light to be concentrated, are dispersed in a substrate (base member) at the light concentrating optical element 10 achieved in the third embodiment and the light concentrating optical element 20 achieved in the fourth embodiment. The substrate and the micro-optical members are designed so that the refractive index of the substrate and the refractive index of the micro-optical members are different for p-polarized light advancing along the y-axis, i.e., along the thickness-wise direction and that the refractive index of the substrate and the refractive index of the micro-optical members are substantially equal to each other for light advancing along the x-axis. The light concentrating devices 60b, 70b and 80b, and the photovoltaic power generation device 1 (the photovoltaic power generation devices 1e, 1f and 1g) are all configured with such light concentrating optical elements.

As a result, the light concentrating optical element 10 and the light concentrating optical element 20, respectively achieved in the third embodiment and in the fourth embodiment as described earlier, and the light concentrating devices 60*b*, 70*b* and 80*b*, make it possible to provide a new device with a low-profile and a simple structure, capable of fulfilling a light concentrating function that enables efficient utilization of light energy such as sunlight. In addition, the photovoltaic power generation device 1 (the photovoltaic power generation devices 1*e*, 1*f* and 1*g*), configured by adopting the light concentrating optical element 10 or 20 and the light concentrating device 60*b*, 70*b* or 80*b*, is a compact, lightweight device with the light concentrating unit assuming a reduced thickness along the optical axis. In addition, the power generation device 1 does not always require a tracking device used to track the movement of the sun. Such a photovoltaic power generation device 1 will be ideal in applications in which it is used as new system that provides an effective solar power generation function. Similar advantages will be achieved when the present invention is adopted in photothermal conversion devices.

Fifth and Sixth Embodiments

Figure 32:
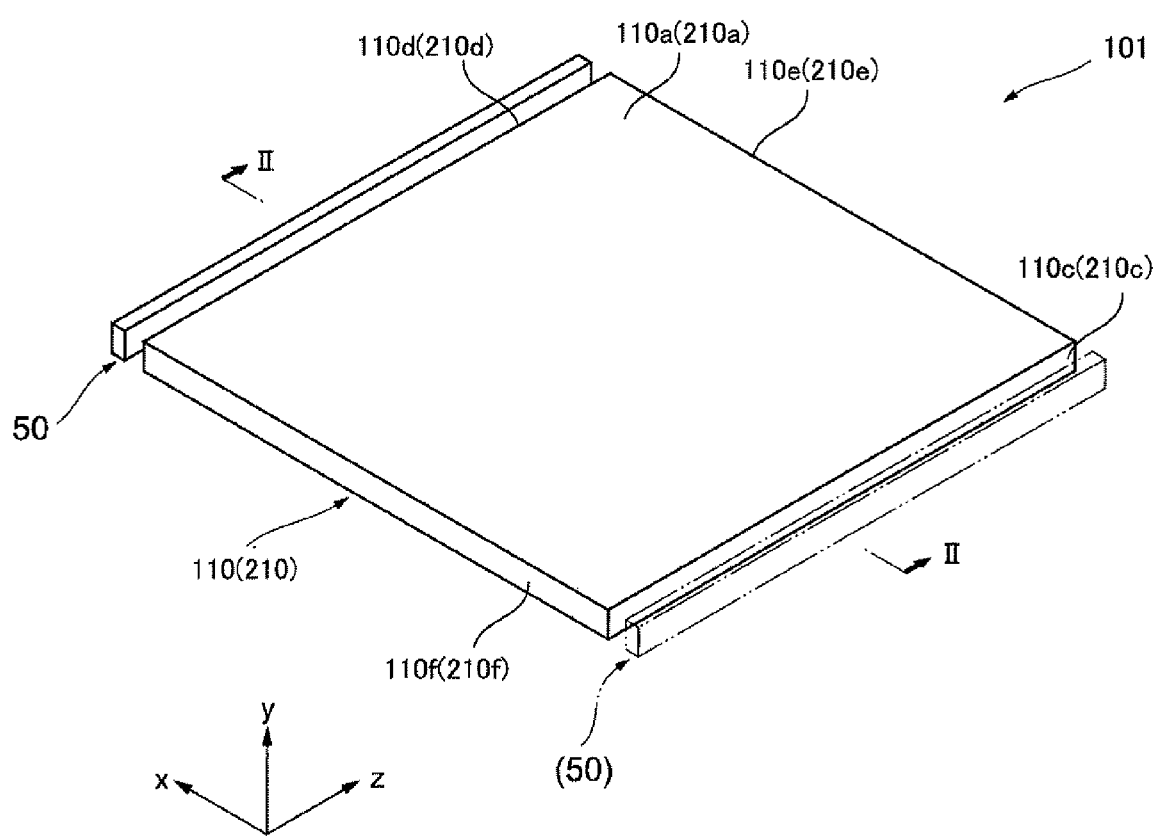
FIG. 32 is a perspective providing an external view of a photovoltaic power generation device.
Figure 33:
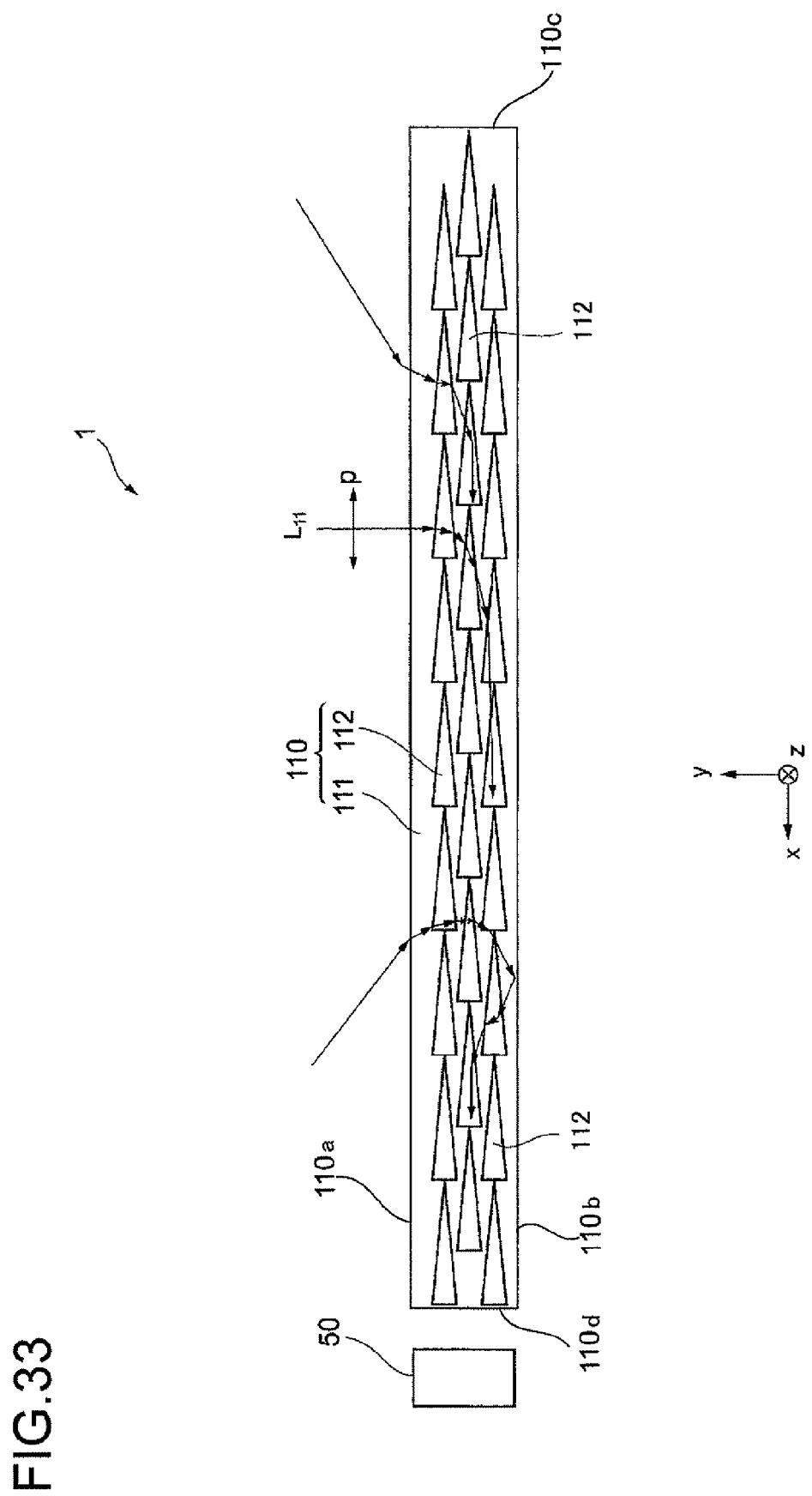
FIG. 33 provides a schematic sectional view of the photovoltaic power generation device, in reference to which the functions of the light receiving optical element is to be described.

The following is a description of a light concentrating optical element 110 achieved in the fifth embodiment of the present invention and a light concentrating optical element 210 achieved in the sixth embodiment of the present invention, given in reference to drawings. FIG. 32 is a perspective providing an external view of a photovoltaic power generation device 101 that includes the light concentrating optical element 110 achieved in the fifth embodiment of the present invention or the light concentrating optical element 210 achieved in the sixth embodiment of the present invention, whereas FIG. 33 provides a schematic sectional view taken as indicated by arrows II-II in FIG. 32. It is to be noted that in order to facilitate an explanation, a coordinate system configured with an x-axis, a y-axis and a z-axis, extending perpendicular to one another, is defined as shown in FIG. 32. The y-axis extends along the thickness of the light concentrating optical element 110, whereas the x-axis and the z-axis intersect each other orthogonally within a plane parallel to the surface of the light concentrating optical element. FIG. 33 is equivalent to a schematic view of a section sliced through a plane (an xy plane) containing the x-axis and y-axis and ranging perpendicular to the z-axis. It is to be noted that while the directional terms top/bottom/left/right may be used in relation to the orientation shown in FIG. 33 in the following description, this directional convention is used exclusively to facilitate the explanation and the actual photovoltaic power generation device may be installed with any orientation.

(Overview of the Photovoltaic Power Generation Device)

The photovoltaic power generation device 101 comprises a light concentrating optical element 110 (210) that concentrates light entering along the thickness-wise direction and a photoelectric conversion element 50, where light, having been concentrated at the light concentrating optical element and guided to one of the two ends of the light receiving optical element facing opposite each other along the x-axis, undergoes photoelectric conversion. The photovoltaic power generation device 101 shown in the figure is configured by using a light concentrating optical element 110 (210) assuming plate form. The photoelectric conversion element 50, which may be any photoelectric conversion element among various elements known in the related art, may be configured by using a specific type of solar cell among various types of solar cells constituted of a silicon-based material, a compound-based material, an organic material, a dye-sensitized material and the like as described earlier.

(Overview of the Light Concentrating Optical Element)

The light concentrating optical element 110 (210) in FIGS. 32 and 33 is formed by dispersing a plurality of micro-optical members inside a substrate assuming plate form (or a panel form). The substrate includes a flat surface 110*a* (210*a*) located on the front side of the substrate and a flat surface 110*b* (210*b*) located on the back side of the substrate, which face opposite each other, and substrate side surfaces 110*c* (210*c*), 110*d* (210*d*), 110*e* (210*e*) and 110*f* (210*f*). The sides forming the edges of the front flat surface 110*a* (210*a*) and the back flat surface 110*b* (210*b*), which range two dimensionally, each have a length greater than the distance between the front flat surface 110*a* (210*a*) and the back flat surface 110*b* (210*b*) facing opposite each other, i.e., greater than the thickness of the light concentrating optical element 110 (210), by a sufficient extent. The front flat surface 110*a* (210*a*) and the back flat surface 110*b* (210*b*) each have a square shape or a rectangular shape, and the front flat surface 110*a* (210*a*) in particular, which functions as a sunlight entry surface, ranges over a large area so as to take in the maximum possible amount of sunlight. The photoelectric conversion element 50 is disposed so as to face opposite the side surface 110*d* (210*d*), which faces opposite the side surface 110*c* (210*c*), and light exiting through the side surface 110*d* (210*d*) is received at the photoelectric conversion element 50 where the light then undergoes photoelectric conversion. Namely, the side surface 110*d* (210*d*) of the substrate forms one of the two ends facing opposite each other along the x-axis mentioned earlier. Sunlight having entered through the front flat surface 110*a* (210*a*) is concentrated inside the substrate and then exits through the side surface 110*d* (210*d*). Since the areal size of the side surface 110*c* (210*c*) and the side surface 110*d* (210*d*) is smaller than that of the front flat surface 110*a* (210*a*), the installation space taken up by the photoelectric conversion element 50 can be minimized.

The main components constituting the light concentrating optical element 110 (210) include a substrate 111 (211) through which sunlight is transmitted and numerous micro-optical members 112 (212) dispersed through the substrate. The micro-optical members, each assuming a wedge shape that widens as it ranges along the x-axis, are disposed so that the micro-optical members overlap along the thickness-wise direction. The light concentrating optical element described below includes micro-optical members taking a wedge shape that forms an isosceles triangle within the plane that contains the x-axis and the z-axis. The micro-optical members are disposed so that the vertical line drawn from the vertex of the isosceles triangle toward the bottom side is directed toward the positive side of the x-axis.

It is to be noted that while the micro-optical members 112 are aligned in a regular pattern both along the x-axis and the y-axis with the micro-optical members in an upper layer offset along the x-axis by a half pitch relative to the micro-optical members in the lower layer provided in a schematic view in FIG. 33 illustrating the function of the light concentrating optical element, the micro-optical members 112 may instead be evenly dispersed with a random pattern. In addition, the number of layers of micro-optical members set one on top of another along the y-axis (the number of overlaps) should be set to an optimal value in correspondence to the materials used to constitute the substrate and the micro-optical members, the shapes of the substrate and the micro-optical members, the operating conditions under which the light concentrating optical element is used and the like. This point will be described in detail later.

The substrate 111 (211) and the micro-optical members 112 (212) at the light concentrating optical element 110 (210)

demonstrate refractive index characteristics different from each other, with at least either the substrate or the micro-optical members having a birefringence property. In the following description, the refractive index of the substrate with which light, the polarization plane of which is contained in the xy plane with the electric field component thereof vibrating along the x-axis, is refracted at the substrate will be notated as $n_{ax}$ and the refractive index of the substrate with which light, the polarization plane of which is contained in the xy plane with the electric field component thereof vibrating along the y-axis, is refracted at the substrate will be notated as $n_{ay}$. Likewise, the refractive index of the micro-optical members with which light, the polarization plane of which is contained in the xy plane with the electric field component thereof vibrating along the x-axis, is refracted at the micro-optical members will be notated as $n_{bx}$ and the refractive index of the micro-optical members with which light, the polarization plane of which is contained in the xy plane with the electric field component thereof vibrating along the y-axis, is refracted at the micro-optical members will be notated as $n_{by}$.

Light polarized with its electric field component thereof vibrating along a direction parallel to the drawing sheet on which FIG. 33 is provided is referred to as p-polarized light, whereas light polarized with its electric field component thereof vibrating along a direction perpendicular to the drawing sheet is referred to as s-polarized light. Light with the polarization plane thereof contained in the xy plane and its electric field component thereof vibrating along the x-axis is p-polarized light advancing along the y-axis, whereas light with the polarization plane thereof contained in the xy plane and its electric field component thereof vibrating along the y-axis is p-polarized light advancing along the x-axis. In addition, light with the polarization plane thereof contained in the yz plane and its electric field component thereof vibrating along the z-axis is s-polarized light advancing along the y-axis.

The substrate 111 (211) and the micro-optical members 112 (212) are designed so that the values taken for $n_{ax}$ and $n_{bx}$ are different from each other and that the values taken for $n_{ay}$ and $n_{by}$ are substantially equal to each other. It is to be noted that when $n_{ay}$ and $n_{by}$ are substantially equal to each other, no significant refraction of the p-polarized light advancing along the x-axis occurs at the interface between the substrate and a micro-optical member. More specifically, the difference between the refractive indices may be, for instance, 0.05 or less.

At this light concentrating optical element 110 (210), p-polarized light having entered the element from above and advancing along the y-axis is refracted toward the positive side or the negative side (to the left or the right in FIG. 33) along the x-axis each time it enters and exits a wedge-shaped micro-optical member 112 (212) since $n_{ax}$ and $n_{bx}$ are not equal to each other. As the p-polarized light is transmitted through a plurality of micro-optical members, the light advancing direction becomes more and more in line with the x-axis. Accordingly, the relationship between $n_{ax}$ and $n_{bx}$ determines whether the p-polarized light, the advancing direction of which gradually shifts toward the x-axis, is refracted toward the positive side or the negative side of the x-axis. More specifically, the light is refracted toward the positive range of the x-axis (to the left in FIG. 33) when $n_{ax} < n_{bx}$, whereas it is refracted toward the negative range of the x-axis (to the right in FIG. 33) when $n_{ax} > n_{bx}$. On the other hand, p-polarized light advancing along the x-axis continues to advance along the x-axis without becoming refracted at the interface of the substrate and any micro-optical member, since substantially equal refractive indices are assumed at the substrate and the micro-optical members for the p-polarized light advancing along the x-axis. It is to be noted that $n_{ax}$ is smaller than $n_{bx}$ at the light concentrating optical element shown in FIG. 33.

Thus, as p-polarized light having entered the light concentrating optical element 110 (210) from above advances through the element along the thickness-wise direction, the light advancing direction is rotated either toward the positive range or the negative range along the x-axis from the direction along which the y-axis extends, whereas light advancing along the x-axis continues toward either the left end or the right end along the x-axis. In addition, even light advancing diagonally downward without ever becoming perfectly aligned with the x-axis becomes inclined toward the x-axis by a great extent within the xy plane. The light advancing toward the bottom surface with its advancing direction greatly inclined toward the x-axis is totally reflected at the bottom surface (at the interface between the substrate and the air) and subsequently, as it is transmitted through a plurality of micro-optical members, its advancing direction becomes increasingly rotated toward the x-axis.

As a result, the light constituted with the p-polarized light component, having entered the light concentrating optical element 110 (210) from above, is directed either to the left or to the right along the x-axis substantially in its entirety. Light having been concentrated in this manner is guided to the photoelectric conversion element 50 disposed at one of the two ends facing opposite each other along the x-axis in the light concentrating optical element 110 (210).

It is to be noted that the refractive index $n_{az}$, with which s-polarized light advancing through the substrate 111 (211) along the y-axis is refracted and the refractive index $n_{bz}$, with which s-polarized light advancing through the micro-optical members 112 (212) along the y-axis is refracted should be substantially equal to each other. In such a case, the s-polarized light advancing along the y-axis continues to advance along the y-axis and exits the light concentrating optical element 110 (210) without ever becoming refracted at the interface between the substrate and a micro-optical member. In more specific terms, this condition is achieved when, for instance, the birefringence property of at least either the substrate or the micro-optical members is a uniaxial birefringence property, whereby p-polarized light advancing along the y-axis will be extraordinary rays, while s-polarized light advancing along the y-axis, p-polarized light and s-polarized light advancing along the x-axis and the like will be ordinary rays.

At the light concentrating optical element 110 (210) structured as described above, light having entered the light concentrating optical element 110 (210) from above is only refracted toward the x-axis due to the difference between the refractive index of the substrate and the refractive index of the micro-optical members, i.e., the light is not refracted along directions other than along the x-axis, and thus, the loss attributable to refraction along the z-axis can be minimized. While s-polarized light having entered this light concentrating optical element from above is directly transmitted through the light concentrating optical element, the transmitted light can be exploited with a high level of efficiency by, for instance, disposing a similar light concentrating optical element 110 (210) with a 90° turn around the y-axis on the bottom surface of the first light concentrating optical element. A light concentrating device adopting such a configuration, which includes a plurality of light concentrating optical elements, will be described in detail later.

(Light Concentrating Optical Element Achieved in the Fifth Embodiment)

Figure 34:
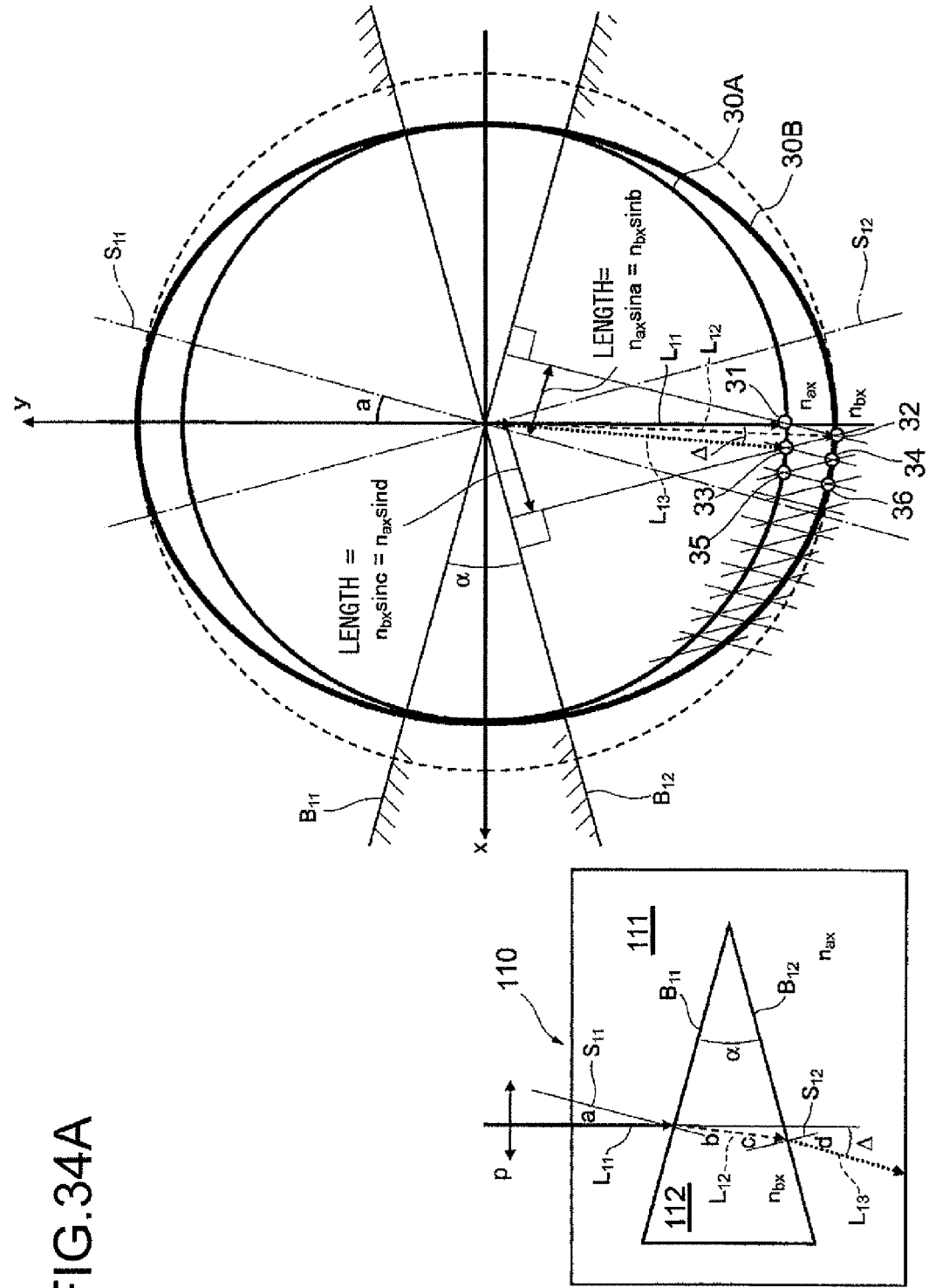
FIGS. 34A and 34B are illustrations showing how a light beam is refracted as p polarized light enters a light concentrating optical element from above.

Next, the manner in which p-polarized light, having entered the light concentrating optical element from above, is refracted and its advancing direction becomes rotated due to the difference between the values taken for $n_{ax}$ and $n_{bx}$ will be described in more specific terms. First, in reference to FIG. 34, an example of a structural design that may be adopted at a light concentrating optical element where $n_{ax}$ is less than $n_{bx}$ will be described.

FIGS. 34A and 34B show how rays of light are refracted after p-polarized light enters the light concentrating optical element 110 achieved in the fifth embodiment from above. FIG. 34A illustrates how light is transmitted through a micro-optical member 112 within the substrate 111 as it is refracted at the entry surface and the exit surface of the micro-optical member 112 and eventually exits the micro-optical member 112 into the substrate 111. FIG. 34B shows how the path of refracted light is altered as it successively enters a plurality of micro-optical members 112 in an illustration prepared in relation to the refractive indices of the substrate 111 and the micro-optical members 112 assumed within the xy plane and Snell's law.

The light concentrating optical element 110 in the embodiment includes birefringent micro-optical members 112, which manifests refractive index characteristics represented by a positive index ellipsoid 30B in FIG. 34B, whereby the refractive index $n_{bx}$ for p-polarized light advancing along the y-axis is greater than the refractive index $n_{by}$ for p-polarized light advancing along the x-axis. The substrate 111 does not have a birefringence property and accordingly, its refractive index characteristics are represented by an index circle 30A with a uniform refractive index ($n_{ax}=n_{ay}$) for light advancing along the x-axis and the light advancing along the y-axis. In addition, the refractive index $n_{by}$ of the micro-optical members 112 with which p-polarized light advancing along the x-axis is refracted at the micro-optical members 112 is substantially equal to the refractive index $n_{ay}$ with which p-polarized light advancing along the x-axis is refracted at the substrate 111.

It is to be noted that the simulation in FIG. 34B are obtained for a typical example of a light concentrating optical element at which the substrate 111 and the micro-optical members 112 achieve the relationship $n_{ax}<n_{bx}$ with the refractive indices $n_{ax}$ and $n_{ay}$ of the substrate 111 both set equal to 1.64, the refractive index $n_{bx}$ of the micro-optical members 112, with which p-polarized light advancing along the y-axis is refracted, set to 1.88 and the refractive index $n_{by}$ of the micro-optical members 112, with which p-polarized light advancing along the x-axis is refracted, set to 1.64. In addition, the micro-optical members 112 are formed in a wedge shape with the vertex α thereof set to 30°.

Such a light concentrating optical element 110 may be manufactured by using a naphthalate 70/terephthalate 30 copolyester (coPEN) to constitute the substrate 111, using a polyethylene naphthalate (PEN) for the micro-optical members 112, co-extruding the naphthalate 70/terephthalate 30 copolyester and the polyethylene naphthalate so as to form a laminated base material and uniaxially drawing the base material along the x-axis. At the substrate 111 (coPEN) which does not have a birefringence property, a uniform refractive index is applied to rays of light advancing in all directions, i.e., $n_{ax}=n_{ay}=$approximately 1.64. The micro-optical members 112, on the other hand, assume a refractive index along the drawing direction (along the x-axis) different from that assumed along other directions. Namely, they have a refractive index of approximately 1.88 for light polarized in a plane ranging along the drawing direction and a refractive index of approximately 1.64 for light polarized in a plane ranging along another direction.

As shown in FIGS. 34A and 34B, p-polarized light $L_{11}$ indicated by the bold solid line, having traveled through the substrate 111 along the y-axis, enters the micro-optical member 112 with an angle of incidence a, and is refracted at an interface $B_{11}$. The refracted light then advances through the micro-optical member 112 with a refractive angle b. Since $n_{ax}<n_{bx}$, the angle a is greater than the angle b, and thus, the light (refracted light) $L_{12}$ refracted at the interface $B_{11}$, advances through the micro-optical member 112 with an inclination toward the positive range of the x-axis (toward the +x direction). In FIGS. 34A and 34B, the refracted light $L_{12}$ advancing through the micro-optical member 112 is indicated by the fine dotted line. It is to be noted that $S_{11}$ in the figures is a vertical line running perpendicular to the interface $B_{11}$.

As shown in FIG. 34B, the relationship achieved by the incident light $L_{11}$ and the refracted light $L_{12}$ at the interface $B_{11}$ can be expressed as; $n_{ax} \sin a = n_{bx} \sin b$, as substantiated by Snell's law. The figure also shows the shift from a point 31 taken on the inner circle 30A, which indicates the front end of the vector of the incident light $L_{11}$, to a point 32 taken on the outer ellipse 30B, which indicates the front end of the vector of the refracted light $L_{12}$, illustrating how the refracted light $L_{12}$ becomes inclined further toward the positive range of the x-axis.

The refracted light $L_{12}$ having traveled through the micro-optical member 112 reaches an interface $B_{12}$ at an angle of incidence c and is refracted again at the interface $B_{12}$ so as to exit the micro-optical member 112 with an exit angle d into the substrate 111. Since $n_{ax}<n_{bx}$, the angle c is smaller than the angle d and the light (exiting light) $L_{13}$ having been refracted at the interface $B_{12}$ advances through the substrate 111, again with an inclination toward the positive range of the x-axis. In FIGS. 34A and 34B, the exiting light $L_{13}$ exiting the micro-optical member 112 is indicated by a bold dotted line. It is to be noted that $S_{12}$ in the figures is a vertical line running perpendicular to the interface $B_{12}$.

As shown in FIG. 34B, the relationship achieved by the incident light $L_{12}$ and the exiting light $L_{13}$ at the interface $B_{12}$ can be expressed as; $n_{bx} \sin c = n_{ax} \sin d$, as substantiated by Snell's law as in the case with the relationship between the incident light $L_{11}$ and the refracted light $L_{12}$ described earlier. The figure also shows the shift from the point 32 taken on the outer ellipse 30B, which indicates the front end of the vector of the refracted light $L_{12}$, to a point 33 taken on the inner circle 30A, which indicates the front end of the vector of the exiting light $L_{13}$, illustrating how the exiting light $L_{13}$ becomes inclined even further toward the positive range of the x-axis.

As the p-polarized light $L_{11}$, having traveled along the y-axis and entered the micro-optical member 112, is transmitted through the wedge-shaped micro-optical member 112, it becomes inclined toward the positive range of the x-axis (toward the +x direction) by an extent matching a small angle Δ and exits the micro-optical member 112 as the light $L_{13}$. Under the conditions outlined earlier, this small angle Δ will be equal to 4 to 5°.

The light inclining from the y-axis toward the positive range of the x-axis by the small angle then enters a micro-optical member 112 disposed at the next stage along the thickness-wise direction, and is subsequently refracted further toward the positive range of the x-axis at the entry interface and the exit interface of the micro-optical member 112 in much the same way as that described above. The initial micro-optical member 112 that the light first enters is notated as a micro-optical member $OA_1$, the micro-optical member 112 that the light enters next is notated as a micro-optical member $OA_2$, and subsequent micro-optical members that the light enters subsequently are likewise notated as micro-optical members $OA_3$ . . . . A point 34 taken on the outer ellipse 30B, a point 35 taken on the inner circle 30A and a point 36 taken on the outer ellipse 30B in FIG. 34B respectively indicate the position of the front end of the vector of light refracted at the entry interface of the micro-optical member $OA_2$, the position of the front end of the vector of light refracted at the exit interface of the micro-optical member $OA_2$, and the position of the front end of the vector of light refracted at the entry interface of the micro-optical member $OA_3$.

As these points clearly indicate, the p-polarized light having entered the light concentrating optical element 110 through the top surface thereof, which sequentially enters the micro-optical members 112 ($OA_1$, $OA_2$, $OA_3$ . . . ) disposed so as to overlap one another along the thickness-wise direction, becomes slightly more inclined each time it exits a micro-optical member, and the position of the front end of its vector shifts between the outer ellipse and the inner circle in FIG. 34B. Namely, the direction of the vector of the p-polarized light having entered the light concentrating optical element 110 through its top surface shifts toward the positive range of the x-axis by a very small angle each time it is transmitted through one of the micro-optical members 112 ($OA_1$, $OA_2$, $OA_3$ . . . ) until it becomes aligned with the x-axis through the clockwise rotation of the light vector, as shown in FIG. 34B.

In addition, as FIG. 34B indicates, as the vector of light entering a micro-optical member 112 shifts further toward the x-axis, the difference between the refractive index of the substrate 111 and the refractive index of the micro-optical member 112 becomes smaller, resulting in a reduction in the small angle Δ. When the vector of light entering a micro-optical member 112 extends perfectly along the x-axis (parallel to the x-axis), the difference between the refractive index of the substrate 111 and the refractive index of the micro-optical member 112 becomes substantially equal to 0, and thus, the light is allowed to continue to travel over the positive range along the x-axis without becoming refracted at the interface between the substrate 111 and the micro-optical member 112. Namely, the micro-optical member 112 will have no effect once the vector of the light extends parallel to the x-axis and such light continues to advance toward the positive-side end along the x-axis as if traveling through a pure substrate 111 having no micro-optical members disposed therein.

Accordingly, by designing the light concentrating optical element 110 so that the vector of light, having initially entered the light concentrating optical element 110 as p-polarized light through the top surface thereof, extends parallel to the x-axis as the light is transmitted through a micro-optical member 112 (notated as micro-optical member $OA_m$) located in the lowermost layer, the p-polarized light having entered the light concentrating optical element 110 can be directed toward the positive-side end along the x-axis, ideally in its entirety, and the light thus directed to the positive-side end can then be input as concentrated light to the photoelectric conversion element 50.

Even if the vector of light exiting the lowermost micro-optical member $OA_m$ has not been rotated sufficiently to set the vector parallel to the x-axis, the light exiting the micro-optical member $OA_m$ and advancing through the substrate 111 toward the bottom surface will be totally reflected at the bottom surface as long as its advancing direction has been inclined by an extent matching the angle at which total reflection occurs at the interface between the substrate 111 and the air. Each time such light having been totally reflected at the bottom surface and traveling upward enters and exits a micro-optical member 112, the light will be refracted toward the positive range of the x-axis and the light vector will thus shift toward the x-axis.

In other words, at the light concentrating optical element 110 comprising the substrate 111 and the micro-optical members 112 designed so that the light advancing toward the bottom surface from the micro-optical member $OA_m$ disposed closest to the bottom surface is totally reflected at the bottom surface, the entirety of the p-polarized light having entered the light concentrating optical element 110 can be directed as concentrated light toward the positive-side end along the x-axis. Since this structure allows the number of layers over which micro-optical members 112 are disposed along the thickness-wise direction, to be reduced, the light concentrating optical element 110 can be provided as a low-profile element.

The light concentrating optical element 110 described above concentrates the p-polarized light having entered therein toward the positive-side end along the x-axis. At the photovoltaic power generation device 101, the light having been concentrated at the positive-side end along the x-axis undergoes photoelectric conversion via the photoelectric conversion element 50 and electric energy resulting from the photoelectric conversion is output.

It is to be noted that while an example in which p-polarized light enters the light concentrating optical element 110 through the top surface thereof along the vertical direction in the xy plane has been described for purposes of simplification, a similar process of refraction will occur for incident light inclining either to the left or to the right over the entry surface in the xy plane as clearly indicated in FIG. 33.

(Light Concentrating Optical Element Achieved in the Sixth Embodiment)

Figure 35:
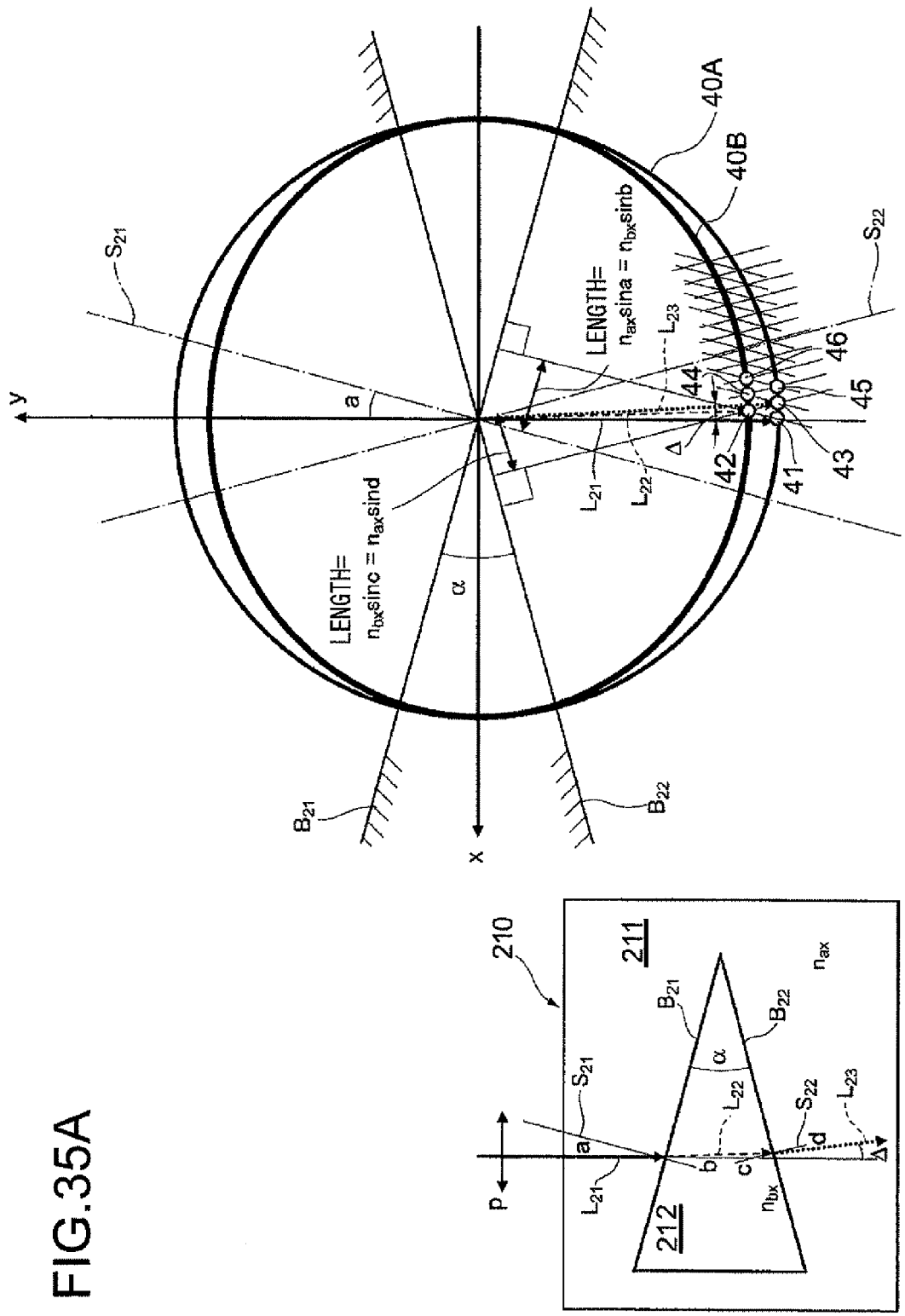
FIGS. 35A and 35B are an illustrations showing how a light beam is refracted as p polarized light enters a light concentrating optical element from above.

Next, the manner in which p-polarized light, having entered the light concentrating optical element from above, is refracted and its advancing direction becomes rotated due to the difference between the values taken for $n_{ax}$ and $n_{bx}$ will be described in reference to FIG. 35 presenting an example in which $n_{ax} > n_{bx}$, i.e. an example in which the relationship between $n_{ax}$ and $n_{bx}$ is the reverse of that in the fifth embodiment.

The main components constituting the light concentrating optical element 210 achieved in the sixth embodiment, similar to the light concentrating optical element 110 achieved in the fifth embodiment as shown in FIG. 33, include a substrate 211 through which sunlight is transmitted and numerous micro-optical members 212 dispersed through the substrate. The micro-optical members 212, each assuming a wedge shape that widens as it ranges along the x-axis, are disposed so that the micro-optical members overlap along the thickness-wise direction. The micro-optical members 212 take a wedge shape that forms an isosceles triangle within the plane that contains the x-axis and the z-axis and are disposed so that the vertical line drawn from the vertex of the isosceles triangle toward the bottom side is directed toward the positive side of the x-axis. Namely, the substrate 211 and the micro-optical members 212 are disposed by adopting a positional arrangement similar to that adopted in the light concentrating optical element 110 in the fifth embodiment.

FIG. 35 shows how rays of light are refracted after p-polarized light enters the light concentrating optical element 210 achieved in the sixth embodiment from above, in a view similar to that provided in FIGS. 34A and 34B. Namely, FIG. 35A illustrates how light is transmitted through a micro-optical member 212 within the substrate 211 as it is refracted at the entry surface and the exit surface of the micro-optical member 212 and eventually exits the micro-optical member 212 into the substrate 211. FIG. 35B shows how the path of refracted light is altered as it successively enters a plurality of micro-optical members 212 in an illustration prepared in relation to the refractive indices of the substrate 211 and the micro-optical members 212 assumed within the xy plane and Snell's law.

While the micro-optical members 212 in the embodiment have a birefringence property as do the micro-optical members in the fifth embodiment, the birefringent characteristics of the micro-optical members 212 are represented by an index ellipsoid 40B, which is set inside an index circle 40A representing the refractive index characteristics of the substrate 211. Namely, the refractive index characteristics of the micro-optical members 212, represented by the negative index ellipsoid 40B, are negative index characteristics whereby the refractive index $n_{bx}$, with which p-polarized light advancing along the y-axis is refracted, is smaller than the refractive index $n_{by}$ for light advancing along the x-axis. The substrate 211 does not have a birefringence property and accordingly, its refractive index characteristics are represented by an index circle 40A with a uniform refractive index ($n_{ax}=n_{ay}$) for light advancing along the x-axis and the light advancing along the y-axis. In addition, the refractive index $n_{by}$ of the micro-optical members 212 with which p-polarized light advancing along the x-axis is refracted at the micro-optical members 212 is substantially equal to the refractive index $n_{ay}$ with which p-polarized light advancing along the x-axis is refracted at the substrate 211.

The simulations in FIGS. 35A and 35B are obtained for a typical example of a light concentrating optical element at which the substrate 211 and the micro-optical members 212 achieve the relationship $n_{ax} > n_{bx}$ with the refractive indices $n_{ax}$ and $n_{ay}$ of the substrate 211 both set equal to 1.65, the refractive index $n_{bx}$ of the micro-optical members 212, with which p-polarized light advancing along the y-axis is refracted, set to 1.48 and the refractive index $n_{by}$ of the micro-optical members 212 with which p-polarized light advancing along the x-axis is refracted, set to 1.65. In addition, the micro-optical members 212 are formed in a wedge shape with the vertex α thereof set to 30°, as in the fifth embodiment.

Such a light concentrating optical element 210 may be manufactured by using a naphthalate 70/terephthalate 30 copolyester (coPEN) to constitute the substrate 211, using calcite for the micro-optical members 212, dispersing the micro-optical members 212 through the naphthalate 70/terephthalate 30 co-polyester so as to form a laminated base material and uniaxially drawing the base material along the x-axis. At the substrate 211, which does not have a birefringence property, a uniform refractive index is applied to rays of light advancing in all directions, i.e., $n_{ax}=n_{ay}$=approximately 1.65. The micro-optical members 212, on the other hand, assume a negative refractive property, with light with the polarization plane thereof ranging along a direction in which the wedge widens (along the drawing direction) refracted with a refractive index of approximately 1.48 and light with polarization planes thereof ranging along other directions refracted with a refractive index of approximately 1.65.

As shown in FIGS. 35A and 35B, p-polarized light $L_{21}$ indicated by the bold solid line, having traveled through the substrate 211 along the y-axis, enters the micro-optical member 212 with an angle of incidence a, and is refracted at an interface $B_{21}$. The refracted light then advances through the micro-optical member 212 with a refractive angle b. Since $n_{ax} > n_{bx}$, the angle a is smaller than the angle b, and thus, the light (refracted light) $L_{22}$ refracted at the interface $B_{21}$ advances through the micro-optical member 212 with an inclination toward the negative range of the x-axis (toward the −x direction). In FIGS. 35A and 35B, the refracted light $L_{22}$ advancing through the micro-optical member 212 is indicated by a fine dotted line. It is to be noted that $S_{21}$ in the figures is a vertical line running perpendicular to the interface $B_{21}$.

As shown in FIG. 35B, the relationship achieved by the incident light $L_{21}$ and the refracted light $L_{22}$ at the interface $B_{21}$ can be expressed as; $n_{ax} \sin a = n_{bx} \sin b$, as substantiated by Snell's law, as in the previous example. The figure also shows the shift from a point 41 taken on an outer circle 40A, which indicates the front end of the vector of the incident light $L_{21}$, to a point 42 taken on an inner ellipse 40B, which indicates the front end of the vector of the refracted light $L_{22}$, illustrating how the refracted light $L_{22}$ becomes inclined further toward the negative range of the x-axis.

The refracted light $L_{22}$ having traveled through the micro-optical member 212 enters an interface $B_{22}$ at an angle of incidence c and is refracted again at the interface $B_{22}$ so as to exit the micro-optical member 212 with an exit angle d into the substrate 211. Since $n_{ax} > n_{bx}$, the angle c is larger than the angle d and the light (exiting light) $L_{23}$ having been refracted at the interface $B_{22}$ advances through the substrate 211, again with an inclination toward the negative range of the x-axis. In FIGS. 35A and 35B, the exiting light $L_{23}$ exiting the micro-optical member 212 is indicated by a bold dotted line. It is to be noted that $S_{22}$ in the figures is a vertical line running perpendicular to the interface $B_{22}$.

As shown in FIG. 35B, the relationship achieved by the refracted light $L_{22}$ and the exiting light $L_{23}$ at the interface $B_{22}$ can be expressed as; $n_{bx} \sin c = n_{ax} \sin d$, as substantiated by Snell's law. The figure also shows the shift from the point 42 taken on the inner ellipse 40B, which indicates the front end of the vector of the refracted light $L_{22}$, to a point 43 taken on the outer circle 40A which indicates the front end of the vector of the exiting light $L_{23}$, illustrating how the exiting light $L_{23}$ becomes inclined even further toward the negative range of the x-axis.

As the p-polarized light $L_{21}$, having traveled along the y-axis and entered the micro-optical member 212, is transmitted through the wedge-shaped micro-optical member 212, it becomes inclined toward the negative range of the x-axis (toward the −x direction) by an extent matching a small angle Δ and exits the micro-optical member 212 as the light $L_{23}$. Under the conditions outlined earlier, this small angle Δ will be equal to 3 to 4°.

The light inclining from the y-axis toward the negative range of the x-axis by the small angle then enters a micro-optical member 212 disposed at the next stage along the thickness-wise direction, and is subsequently refracted toward the negative range of the x-axis at the entry interface and the exit interface of the micro-optical member 212 in much the same way as that described above. The initial micro-optical member 212 that the light first enters is notated as a micro-optical member $OB_1$, the micro-optical member 212 that the light enters next is notated as a micro-optical member $OB_2$, and subsequent micro-optical members that the light enters subsequently are likewise notated as micro-optical members $OB_3$ . . . . A point 44 taken on the inner ellipse 40B, a point 45 taken on the outer circle 40A and a point 46 taken on the inner ellipse 40B in FIG. 35B respectively indicate the position of the front end of the vector of light refracted at the entry interface of the micro-optical member $OB_2$, the position of the front end of the vector of light refracted at the exit interface of the micro-optical member $OB_2$, and the position of the front end of the vector of light refracted at the entry interface of the micro-optical member $OB_3$.

As these points clearly indicate, the p-polarized light having entered the light concentrating optical element 210 through the top surface thereof, which sequentially enters the micro-optical members 212 ($OB_1$, $OB_2$, $OB_3$ . . . ) disposed so as to overlap one another along the thickness-wise direction, becomes slightly more inclined each time it exits a micro-optical member, and the position of the front end of its vector shifts between the outer circle 40A and the inner ellipse 40B in FIG. 35B. Namely, the direction of the vector of the p-polarized light having entered the light concentrating optical element 210 through its top surface shifts toward the negative range of the x-axis by a very small angle each time it is transmitted through one of the micro-optical members 212 ($OB_1$, $OB_2$, $OB_3$ . . . ), until it becomes aligned with the x-axis through the counterclockwise rotation of the light vector, as shown in FIG. 35B.

As the vector of light entering a micro-optical member 212 shifts further toward the x-axis, the difference between the refractive index of the substrate 211 and the refractive index of the micro-optical member 212 becomes smaller, resulting in a reduction in the small angle Δ. When the vector of light entering a micro-optical member 212 extends perfectly along the x-axis, the difference between the refractive index of the substrate 211 and the refractive index of the micro-optical member 212 becomes substantially equal to 0, and thus, the light is allowed to continue to travel over the negative range along the x-axis without becoming refracted at the interface between the substrate 211 and the micro-optical member 212. Namely, the micro-optical member 212 will have no effect once the vector of the light extends parallel to the x-axis and such light continues to advance toward the negative-side end along the x-axis as if traveling through pure substrate 211 having no micro-optical members disposed therein.

The light, the advancing direction of which has shifted so as to extend along the x-axis, and the light having exited the micro-optical members 212 located in the lowermost layer, the vector of which has not been rotated to a sufficient extent to allow it to extend parallel to the x-axis, with an inclination angle large enough that the light, having advanced through the substrate 211 to the bottom surface thereof, is totally reflected at the interface between the substrate 211 and the air, are both concentrated at this light concentrating optical element 210 in much the same way as at the light concentrating optical element in the fifth embodiment.

At the light concentrating optical element 210 described above, the p-polarized light having entered therein is directed so as to concentrate at the negative-side end along the x-axis. A photovoltaic power generation device 101 can be configured by disposing a photoelectric conversion element 50 where the light concentrated at the negative-side end along the x-axis undergoes photoelectric conversion.

At the light concentrating optical element 210 achieved in the sixth embodiment, the refractive index $n_{ax}$, with which p-polarized light advancing through the substrate along the thickness-wise direction is refracted, and the refractive index $n_{bx}$, with which p-polarized light advancing through the micro-optical members along the thickness-wise direction is refracted, assume a relationship that is the reverse of the relationship between the refractive index $n_{ax}$ and the refractive index $n_{bx}$ at the light concentrating optical element 110 in the fifth embodiment, causing light to be concentrated toward the negative-side end along the x-axis, i.e., toward the exact opposite side along the x-axis.

In addition, FIGS. 34A, 34B, 35A and 35B clearly indicate that the substrate and the micro-optical members only need to assure a certain degree of difference between the refractive indices for p-polarized light advancing along the y-axis and assure a very small difference between the refractive indices for p-polarized light advancing along the x-axis. The illustrations also clearly show that only either the substrate or the micro-optical members need to have a birefringence property or both the substrate and the micro-optical members may have a birefringence property.

Furthermore, as can be clearly understood in reference to the description provided above, the conditions for concentrating p-polarized light entering the light concentrating optical element 110 (210) from above along the thickness-wise direction with a high level of efficiency can be defined based upon factors such as the refractive indices of the substrate 111 (211) and the micro-optical members 112 (212), the shape of the micro-optical members 112 (212) and the allowable inclining angle set for p-polarized light entering the light concentrating optical element. In other words, by selecting the optimal materials to constitute the substrate and the micro-optical members, the optimal shape for the micro-optical members, the optimal number of layers over which the micro-optical members are to be disposed with overlaps and the like in correspondence to the purposes of use of the light concentrating optical element 110 (210), the operating conditions under which the light concentrating optical element 110 (210) is to be employed and the like, a high-performance light concentrating optical element capable of concentrating light entering therein via its top surface along the thickness-wise direction with a high level of efficiency can be obtained.

It is to be noted that as long as the micro-optical members achieve a wedge shape that widens as they range along the x-axis, they may take on an alternative shape such as a right angle triangle or they may be formed as a ribbon-shaped or sheet-shaped continuous member with the bottom side of a triangle connecting with the vertex of an adjacent triangle. In addition, while the dimension of the wedge shaped micro-optical members, measured along the x-axis, needs to be equal to or greater than 1/10 of the wavelength of concentration target light to be concentrated via the light concentrating optical element, a light concentrating optical element taking the form of a thin, flexible sheet can be manufactured through an optimal application of a uniaxial drawing method or the like if the dimension of the wedge shaped micro-optical members, measured along the x-axis is 0.1 to 100 μm and the dimension, measured along the y-axis, is equal to or less than one third of the measurement taken along the x-axis.

(Structural Examples for Light Concentrating Devices and Photovoltaic Power Generation Devices)

Figure 36:
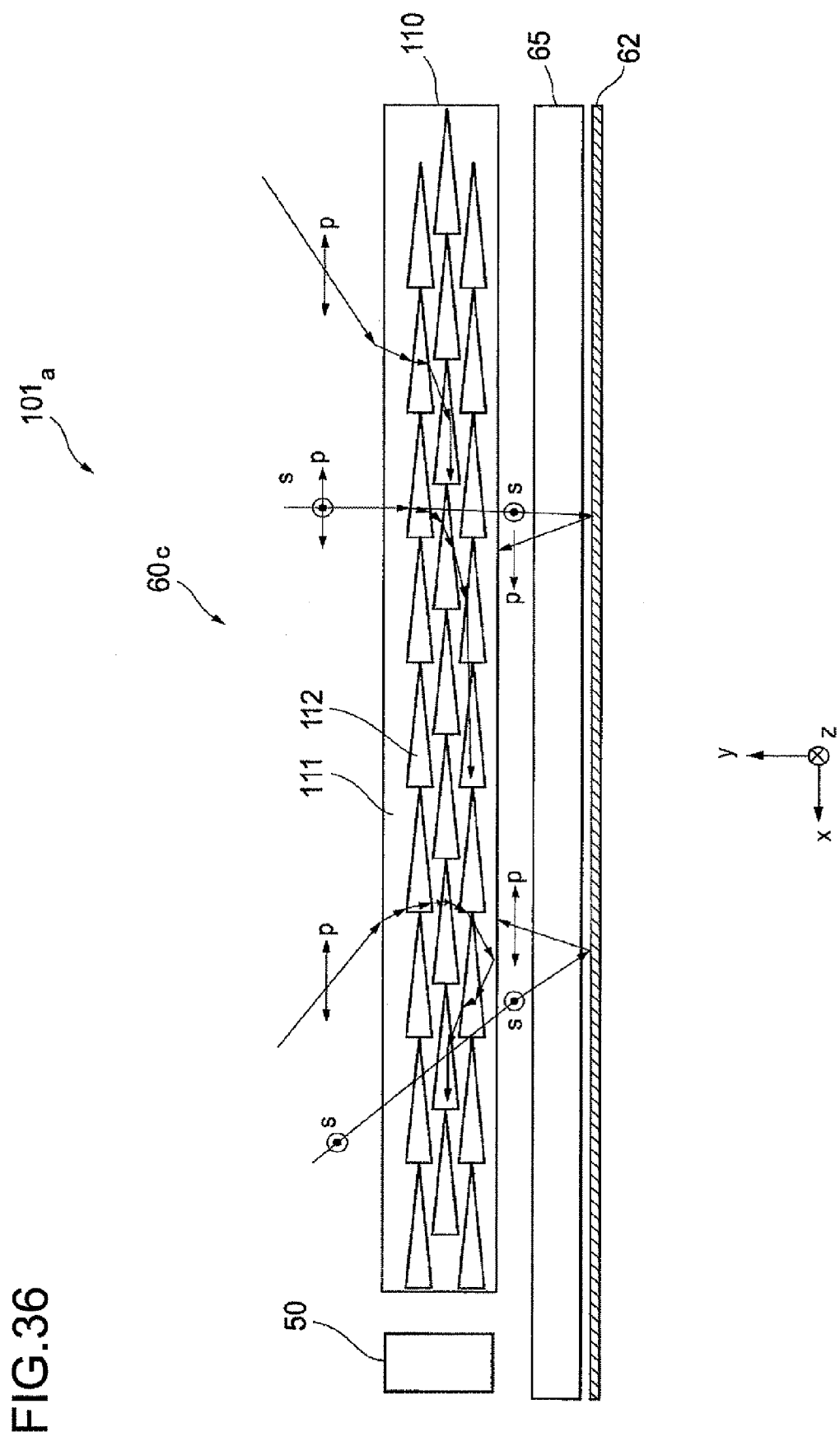
FIG. 36 is a schematic diagram showing the structure of a light concentrating device.
Figure 37:
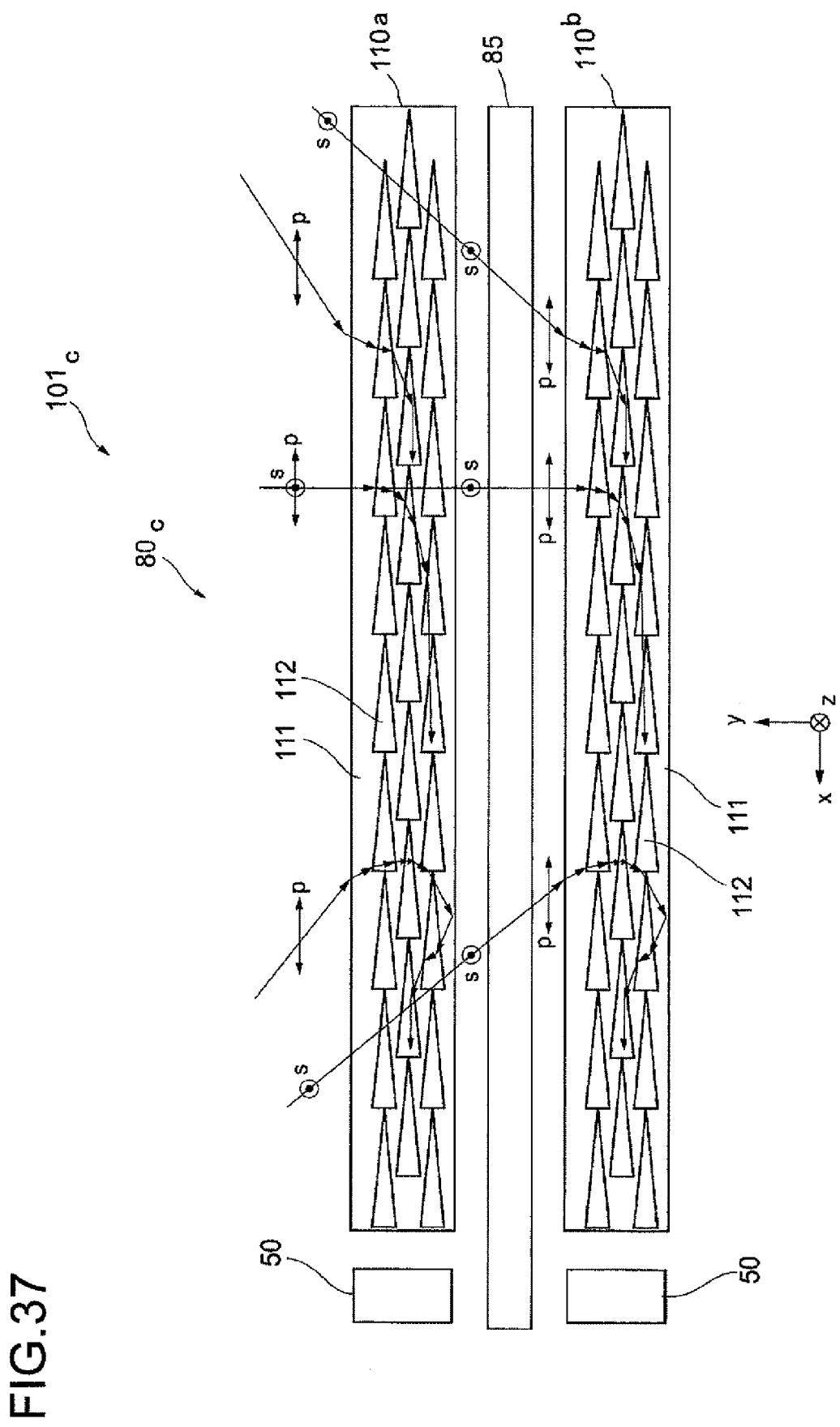
FIG. 37 is a schematic diagram showing the structure of a light concentrating device.

FIGS. 36 and 37 each present an example of a light concentrating device and a photovoltaic power generation device that may be configured with a polarization plane rotating element 65 and a reflecting mirror 62 or with a polarization plane rotating element 85. Light concentrating devices 60*c*, 70*c* and 80*c* and photovoltaic power generation devices 101*a*, 101*b* and 101*c*, each configured with a light concentrating optical element 110 achieved in the fifth embodiment and/or the light concentrating optical element 210 achieved in the sixth embodiment, may include a plurality of light concentrating optical elements stacked one on top of another and a polarization plane rotating element or a reflecting mirror used in conjunction with a light concentrating optical element, as do the light concentrating devices 60*a*, 70*a* and 80*a* configured with the light concentrating optical element 10 in the first embodiment, the light concentrating device configured with the light concentrating optical element 20 achieved in the second embodiment and the photovoltaic power generation devices 1*a*, 1*b* and 1*c*. Accordingly, a description of the structure adopted for the light concentrating device 60*c* and the photovoltaic power generation device 101*a* in FIG. 36 will be redundant and thus will not be provided. Likewise, a description of the light concentrating device 70c and the photovoltaic power generation device 101b (not shown) will be redundant and thus will not be provided, and a description of the structure adopted for the light concentrating device 80c and the photovoltaic power generation device 101c in FIG. 37 will not be provided either.

(Methods of Light Energy Extraction at End Areas of Light Concentrating Optical Elements)

The energy of light concentrated at the positive-side end or the negative-side end along the x-axis at the light concentrating optical element 110 in the fifth embodiment and at the light concentrating optical element 210 in the sixth embodiment as described above may be extracted in much the same way as the energy of light concentrated at the ends of the light concentrating optical element 10 in the first embodiment and the light concentrating optical element 20 in the second embodiment, is extracted as explained earlier in reference to FIGS. 16A through 16E.

It is to be noted that, in order to simplify the explanation, the light concentrating optical elements achieved in the fifth and sixth embodiments are described as those assuming a plate form. In addition, the functions of the light concentrating optical element achieved in the embodiments are described in specific detail by quoting specific materials used to constitute the substrate and the micro-optical members and defining values taken for their refractive indices accordingly. However, embodiments of the present invention are not limited to such substructure modes or structural examples. For instance, the present invention may be adopted in a light concentrating optical element formed as a thin sheet or a light concentrating optical element formed as a rod (a bar shape or a linear shape) such as the shape of a prismatic column or circular column. In addition, the present invention may be adopted in a light concentrating optical element comprising a substrate and micro-optical members constituted of optimal materials selected from various resin materials, inorganic materials and the like. Furthermore, the light concentrating optical element according to the present invention may include another member in addition to the substrate and the micro-optical members, as long as the presence of the additional member does not cause a departure from the spirit of the invention.

It is to be noted that while the principle of light concentration applicable to the fifth and sixth embodiments has been described based upon the theory of geometric optics, it will be obvious that the light concentration action through Mie scattering can be induced at the light concentrating optical elements in the fifth and sixth embodiments as in those in the first through fourth embodiments by setting specific dimensions for the micro-optical members and selecting a specific light wavelength, and the principle of light concentration achieved at such light concentrating optical elements can be explained based upon the theory of Mie scattering.

The light concentrating optical element 110 achieved in the fifth embodiment and the light concentrating optical element 210 achieved in the sixth embodiment described above each include a plurality of wedge-shaped micro-optical members disposed in the substrate (base member) and is designed so that the substrate and the micro-optical members have refractive indices which are different from each other for p-polarized light advancing along the thickness-wise direction, i.e., along the y-axis, and have refractive indices taking on values substantially equal to each other for light advancing along the x-axis, i.e., the direction along which the micro-optical members are oriented. The light concentrating devices 60c, 70c and 80c and the photovoltaic power generation device 101 (the photovoltaic power generation devices 101a, 101b and 101c) are all configured with such light concentrating optical elements.

As a result, the light concentrating optical element 110 and the light concentrating optical element 210, respectively achieved in the fifth embodiment and in the sixth embodiment as described earlier, and the light concentrating devices 60c, 70c and 80c make it possible to provide a new device with a low-profile and a simple structure, capable of fulfilling a light concentrating function that enables efficient utilization of light energy such as sunlight. In addition, the photovoltaic power generation device 101 (the photovoltaic power generation devices 101a, 101b and 101e) configured by adopting the light concentrating optical element 110 or 210 and the light concentrating device 60c, 70c or 80c, is a compact, lightweight device with the light concentrating unit assuming a reduced thickness along the optical axis. In addition, the photovoltaic power generation device 101 does not always require a tracking device used to track the movement of the sun. Such a photovoltaic power generation device 101 will be ideal in applications in which it is used as new system that provides an effective solar power generation function. Similar advantages will be achieved when the present invention is adopted in photothermal conversion devices.

Seventh and Eighth Embodiments

While a light concentrating optical element 10 achieved in the seventh embodiment and a light concentrating optical element 20 achieved in the eighth embodiment are structurally similar to the light concentrating optical element 10 in the third embodiment and the light concentrating optical element 20 in the fourth embodiment, they are each characterized in that the aspect ratio, i.e., longer side/shorter side, of a light concentrating panel 8 is set in correspondence to the shape and dimensions of a large exit surface.

Figure 38:
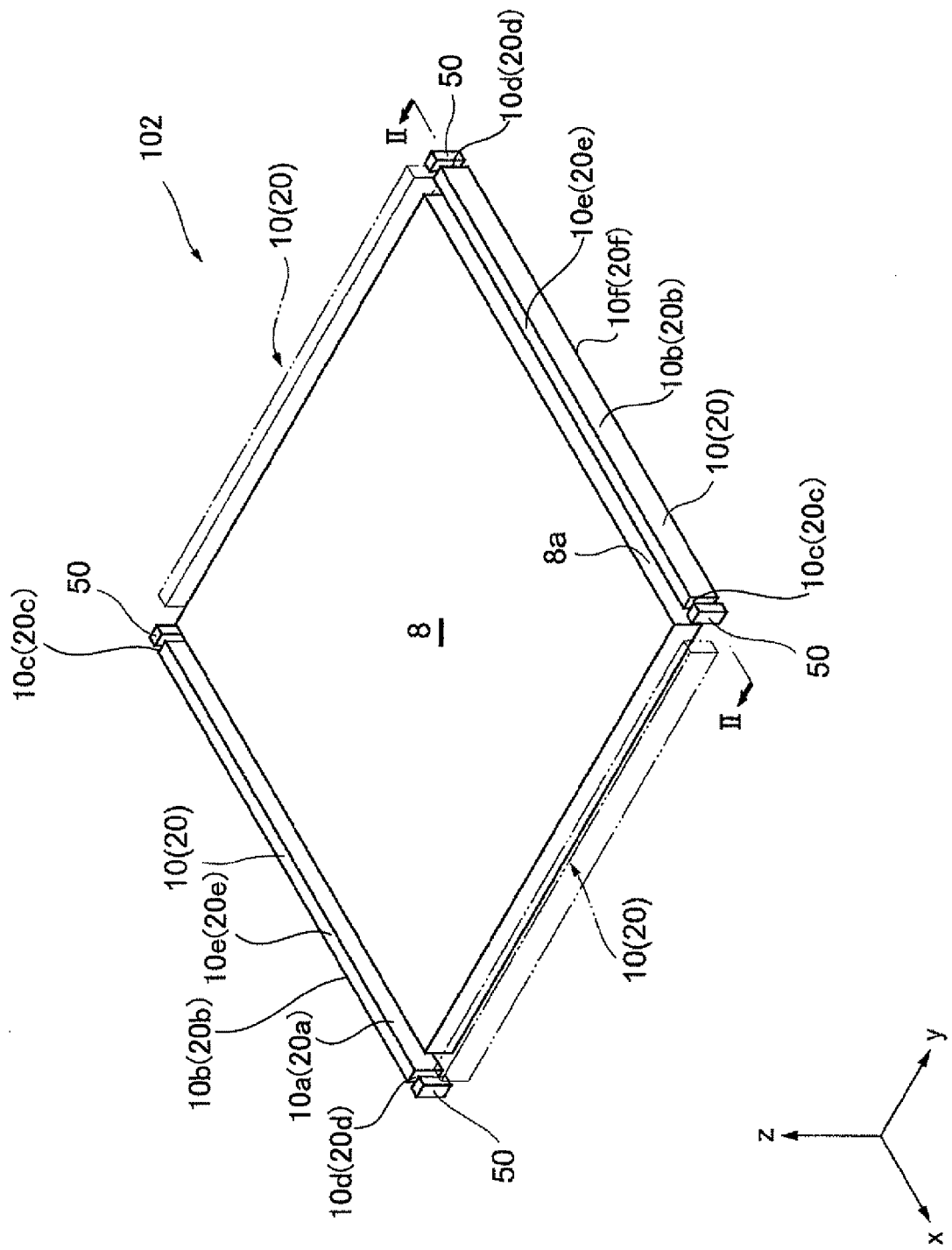
FIG. 38 is a perspective providing an external view of a photovoltaic power generation device.
Figure 39:
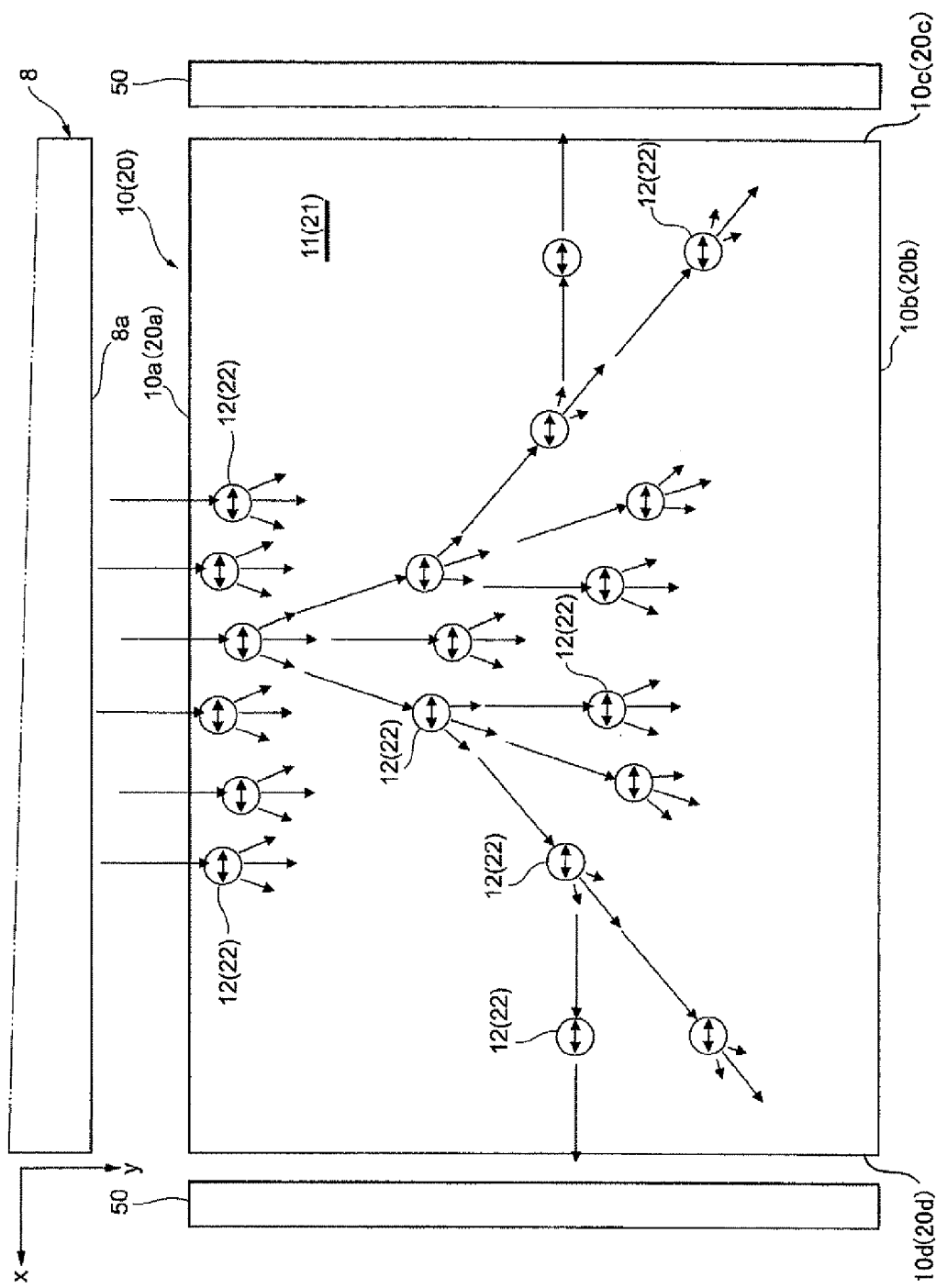
FIG. 39 is an illustration showing how the light advancing direction changes as light becomes scattered.

The following is a description of the light concentrating optical element 10 achieved in the seventh embodiment of the present invention and the light concentrating optical element 20 achieved in the eighth embodiment of the present invention, given in reference to drawings. FIG. 38 is a perspective providing an external view of a photovoltaic power generation device 102 that includes the light concentrating optical elements 10 achieved in the seventh embodiment of the present invention or the light concentrating optical elements 20 achieved in the eighth embodiment of the present invention, whereas FIG. 39 provides a schematic sectional view taken as indicated by arrows II-II in FIG. 38. It is to be noted that in order to facilitate an explanation, a coordinate system configured with an x-axis, a y-axis and a z-axis, extending perpendicular to one another, is defined as shown in FIG. 38. Light exiting the light concentrating panel 8 enters the light concentrating optical elements 10 along the y-axis, whereas the x-axis and the z-axis are two axes extending perpendicular to each other along an entry surface 10a of a light concentrating optical element 10. FIG. 39 is equivalent to a schematic view of a section sliced through a plane (an xy plane) containing the x-axis and y-axis and ranging perpendicular to the z-axis. It is to be noted that while the directional terms up/down and left/right may be used in relation to the orientation shown in FIG. 38 in the following description, this directional convention is used exclusively to facilitate the explanation and the actual photovoltaic power generation device may be installed with any orientation.

(Overview of the Photovoltaic Power Generation Device)

An overall structure that may be adopted in the photovoltaic power generation device 102 equipped with the light concentrating optical elements 10 achieved in the seventh embodiment or the light concentrating optical elements 20 achieved in the eighth embodiment is briefly described. The photovoltaic power generation device 102 comprises a light concentrating panel 8 assuming a plate form, from which light, initially having entered through the top surface thereof along the thickness-wise direction (along the z-axis) in FIG. 38 and having been concentrated therein eventually departs through exit surfaces 8a located at the side ends, light concentrating optical elements 10 (20) each disposed along an exit surface 8a, so as to concentrate broad exiting light exiting through the exit surface 8a with a large aspect ratio (longer side/shorter side) along the x-axis (or the y-axis) extending in the direction in which the longer side ranges, and photoelectric conversion elements 50 where light having been concentrated via the light concentrating optical elements and guided to the ends facing opposite each other along the x-axis and/or the y-axis undergoes photoelectric conversion. The photovoltaic power generation device 102 shown in FIG. 38 is configured by using light concentrating optical elements 10 (20) assuming a rod form (a bar shape). The photoelectric conversion elements 50, which may be any photoelectric conversion elements among various elements known in the related art, may be configured by using a specific type of solar cell among various types of solar cells constituted of a silicon-based material, a compound-based material, an organic material, a dye-sensitized material and the like as described earlier.

(Overview of the Light Concentrating Panel)

The light concentrating panel 8 in FIG. 38 is a light concentrating optical element assuming a plate form, which traps light having entered therein through its top surface along the thickness-wise direction (along the z-axis) within the plate, concentrates the light along the y-axis (and/or along the x-axis) and then outputs the concentrated light through the exit surfaces 8a located at the side ends thereof. The light concentrating panel 8 may be constituted with any of the light concentrating optical elements achieved in the first through sixth embodiments described earlier or it may be configured as a light concentrating device equipped with any of the light concentrating optical elements achieved in the first through sixth embodiments, or a light concentrating optical element at which light is scattered as substantiated by a similar scattering theory. As an alternative, the light concentrating panel 8 may be configured as a light concentrating unit that includes a light concentrating optical element adopting a fluorescence collector plate system or a spectral concentration system known in the related art, a light concentrating optical element with waveguide paths, at which a plurality of initially condensed light fluxes, having been condensed via a lens array, are guided to exit surfaces located at the side ends thereof and concentrated at the exit surfaces or the like.

(Overview of the Light Concentrating Optical Elements)

The light concentrating optical element 10 (20) in FIGS. 38 and 39 is formed by dispersing a plurality of micro-optical members inside a substrate assuming plate form (or a panel form). The substrate includes a flat surface 10a (20a) located on the front side of the substrate and a flat surface 10b (20b) located on the back side of the substrate, which face opposite each other, and side surfaces 10c (20c), 10d (20d), 10e (20e) and 10f (20f). The sides forming the edges of the front flat surface 10a (20a) and the back flat surface 10b (20b), which range two dimensionally, each have a length greater than the distance between the front flat surface 10a (20a) and the back flat surface 10b (20b) facing opposite each other, i.e., greater than the thickness of the light concentrating optical element 10 (20), by a sufficient extent. The front flat surface 10a (20a) and the back flat surface 10b (20b) each form a rectangular shape with a large aspect ratio (longer side/shorter side), and the front flat surface 10a (20a) set so as to face opposite an exit surface 8a of the light concentrating panel 8, functions as an entry surface where the broad exiting light having departed the light concentrating panel 8 through the exit surface 8a is received. For this reason, the plate-shaped light concentrating optical elements 10 (20) in this embodiment are each formed as a rod (bar) assuming a measurement (thickness) taken along the y-axis or the x-axis and a measurement (width) taken along the z-axis, which are both smaller by a sufficient extent than the measurement (length) taken along the x-axis or the y-axis, as shown in FIG. 38. The photoelectric conversion elements 50 are disposed by the side surface 10c (20c) and the side surface 10d (20d) facing opposite each other, with one photoelectric conversion element 50 positioned so as to face opposite the side surface 10c (20c) and another photoelectric conversion elements 50 positioned so as to face opposite the side surface 10d (20d). At the photoelectric conversion element 50, light having exited through the side surface 10c (20c) and the side surface 10d (20d) is received and the received light undergoes photoelectric conversion. Namely, the side surfaces 10c (20c) and 10d (20d) of the substrate defines the ends along the x-axis and/or the z-axis mentioned earlier (along the longer sides of the entry surface). The broad light having entered through the front flat surface 10a (20a) is concentrated inside the substrate along the longer sides of the entry surface and then exits through the side surface 10c (20c) and the side surface 10d (20d). Since the side surfaces 10c (20c) and 10d (20d) forming the end areas are narrower (sufficiently smaller) than the front flat surface 10a (20a) forming the entry surface, the installation space taken up by each photoelectric conversion element 50 can be minimized.

Since the components constituting the light concentrating optical elements 10 and 20 achieved in the embodiments and the principal of light concentration achieved via the light concentrating optical elements 10 and 20 in the embodiments are similar to those described earlier in reference to the third and fourth embodiments, a repeated detailed explanation is not provided.

(Light Concentrating Optical Element Achieved in the Seventh Embodiment)

In the light concentrating optical element achieved in the seventh embodiment, micro-optical members 12 have a birefringence property with the major axis of uniaxial anisotropic birefringence oriented along the x-axis. At the light concentrating optical element 10 in the seventh embodiment, the micro-optical members 12 act as particles distinguishable from the medium (substrate 11) for p-polarized light advancing along the y-axis in light having exited the light concentrating panel 8 and entered the light concentrating optical element 10 to advance through the substrate, since $n_{axy} \ne n_{bxy}$. However, the micro-optical members 12 do not act as particles and thus, the medium assumes a state in which the particles are, in effect, nonexistent (as if the medium were pure) for p-polarized light advancing along the x-axis, since $n_{ayx} \approx n_{byx}$.

As a result, while the p-polarized light (p-polarized light component) having entered the light concentrating optical element 10 from above and advancing along the y-axis is scattered via the micro-optical members 12 acting as particles within the medium due to the refractive index difference, the p-polarized light advancing along the x-axis continues to advance along the x-axis without becoming scattered via the micro-optical members, since they do not act as particles distinguishable from the medium for the p-polarized light advancing along the x-axis.

According to the present invention achieved by taking advantage of the difference in the refractive index resulting from the birefringence occurring as described above, the scattering cross section changes in correspondence to the angle of incidence at which light enters the micro-optical members 12, which, in turn, alters the scattering efficiency. The relationship between the angle of incidence at which light enters the micro-optical members 12 and light scattering is similar to that manifesting in the third embodiment having been described in reference to the schematic illustrations provided in FIGS. 20A through 20D. Since the relationship has been described in detail in reference to FIGS. 20A through 20D, a repeated explanation is not provided.

At the light concentrating optical element 10 structured as described above, the p-polarized light having entered therein through the entry surface 10a of the light concentrating optical element and advancing along the y-axis is multiply scattered via the micro-optical members 12 acting as particles within the substrate (medium) 11.

As a result, the ratio of light continuing to advance parallel to the y-axis through the light concentrating optical element 10 decreases and, instead, the ratio of light inclining diagonally over the xy plane increases. While the scattering efficiency with which light inclining toward the x-axis over the positive range or the negative range decreases as the angle of incidence at which light enters the micro-optical members 12 becomes larger, leading to a smaller extent of change in the inclination angle, the ratio of light inclining toward the x-axis by a large extent (i.e., light with a nearly horizontal orientation in FIG. 39 and FIG. 20) increases. Light that advances along the x-axis is not scattered via the micro-optical members 12 and continues to advance toward the positive-side end or the negative-side end along the x-axis.

In this situation, if the inclining angle of light reaching the back surface 10b of the light concentrating optical element as rays of light inclined toward the x-axis is equal to or greater than the critical angle of total reflection occurring at the interface between the substrate 11 and the air, the light having entered the light concentrating optical element 10 can be trapped within the element. Light having been totally reflected at the back surface 10b of the light concentrating optical element 10 is scattered via the micro-optical members 12 as it advances from the back surface side toward the entry surface side and thus, its advancing direction is deflected toward the x-axis.

It is to be noted that while a protective film or the like with a refractive index different from that of the substrate 11 may be formed at the back surface 10b of the light concentrating optical element, the total reflection conditions will be fulfilled at least at the interface between the film and the air and thus light will be trapped inside the light concentrating optical element 10 as long as the inclining angle of light having reached the back surface is equal to or greater than the critical angle of total reflection at the interface between the substrate and the air.

In addition, if the inclining angle of light having reached the back surface of the light concentrating optical element that includes the protective film or the like as described above is equal to or greater than the critical angle of total reflection at the interface between the substrate and the film, the total reflection conditions will be fulfilled at the interface between the substrate and the film, and in such a case, the light having reached the back surface will be totally reflected into the substrate without being allowed to advance into the film. Thus, the light constituted with the p-polarized light component having entered the light concentrating optical element 10 will be trapped and deflected toward the x-axis within the light concentrating optical element 10 if the total reflection conditions do not exist at the interface between the film and the air with the film having, for instance, an uneven outer surface.

As a result, the p-polarized light having exited the light concentrating panel 8 and entered the light concentrating optical element 10 is directed substantially in its entirety either to the positive-side end surface or the negative-side end surface along the x-axis, and the light having been directed to the end surfaces then enters the photoelectric conversion elements 50 disposed at the ends facing opposite each other along the x-axis as concentrated light. While s-polarized light having entered this light concentrating optical element and advancing along the y-axis will be directly transmitted through the light concentrating optical element 10, even such transmitted light can be collected as concentrated light with a high degree of efficiency in a light concentrating device configured as described later.

This structure, in which light having exited the light concentrating panel 8 through an exit surface assuming a large width along the x-axis and a large aspect ratio (e.g., an exit surface with an aspect ratio of 50 to 500) is concentrated along the x-axis via each light concentrating optical element 10 so that the aspect ratio of the cross section of the light becomes reduced (e.g., with the aspect ratio of the cross section of the light reduced to 1 to 10 at an exit surface of the light concentrating optical element 10), greatly improves the light concentration efficiency. In addition, since no scattering of light occurs along the z-axis, i.e., along the direction in which no difference in the refractive index manifests, the scattering loss along the z-axis can be minimized at the light concentrating optical element structured as described above.

(Light Concentrating Optical Element Achieved in the Eighth Embodiment)

The light concentrating optical element 20 in the eighth embodiment is structured by orienting the major axis of uniaxial anisotropic birefringence along the y-axis (see FIGS. 19A, 19B and 19C). The p-polarized light among rays of light entering such a light concentrating optical element 20 to advance through the substrate is scattered in much the same way as the p-polarized light scattered at the light concentrating optical element 10 in the seventh embodiment described earlier.

Namely, at the light concentrating optical element 20, the micro-optical members 22 act as particles distinguishable from the medium for p-polarized light advancing along the y-axis in light having entered the light concentrating optical element 20 and advancing through the substrate 21, since $n_{axy} \neq n_{bxy}$. However, the micro-optical members 22 do not act as particles and thus, the medium assumes a state in which the particles are, in effect, nonexistent for p-polarized light advancing along the x-axis through the substrate, since $n_{ayx} \approx n_{byx}$.

A phenomenon similar to that described above occurs at the light concentrating optical element 20, involving s-polarized light having entered the light concentrating optical element 20 and advancing through the substrate along the y-axis. More specifically, at the light concentrating optical element 20, the major axis of the uniaxial anisotropic birefringence occurring thereat is oriented along the y-axis, and axial symmetry centered on the y-axis is achieved by the refractive index of the substrate 21 and the refractive index of the micro-optical members 22. For this reason, a phenomenon similar to that described earlier also occurs in the zy plane ranging perpendicular to the xy plane.

Namely, the micro-optical members 22 act as particles distinguishable from the medium (substrate 21) for light among rays of light having entered the light concentrating optical element 20 and advancing through the substrate, which advances along the y-axis with the electric field component thereof vibrating within the zy plane (i.e., p-polarized light advancing along the y-axis in the zy plane), since $n_{azy} \neq n_{bzy}$. In addition, the micro-optical members 22 do not act as particles distinguishable from the medium for light among rays of light advancing through the substrate, which advances along the z-axis with the electric field component thereof vibrating within the zy plane (i.e., p-polarized light advancing along the z-axis in the zy plane), since $n_{ayz} \approx n_{byz}$.

Thus, light having entered the light concentrating optical element 20 through the entry surface and advancing along the y-axis undergoes the process of multiple scattering via a plurality of micro-optical members 22 distributed through the substrate 21 along the thickness-wise direction, which act as particles within the substrate 21. The ratio of p-polarized light (light constituted with the p-polarized light component) advancing through the element parallel to the y-axis in FIG. 39 decreases further into the light concentrating optical element 20 while the ratio of light inclining toward the positive range of the x-axis or the negative range of the x-axis within the xy plane increases. In addition, the ratio of s-polarized light (light constituted with the s-polarized light component) advancing parallel to the y-axis through the element in FIG. 39 decreases further into the light concentrating optical element 20, while the ratio of s-polarized light inclining toward the positive range of the z-axis or the negative range of the z-axis within the zy plane increases.

The ratio of light inclined by a greater extent increases further toward the back surface. P-polarized light advancing along the x-axis is not scattered via the micro-optical members 22 and continues to advance toward the positive-side end surface or the negative-side end surface along the x-axis. S-polarized light advancing along the z-axis is not scattered via the micro-optical members 22 and continues to advance toward the positive-side end surface or the negative-side end surface along the z-axis.

As long as the inclining angle of light inclined toward the x-axis or the z-axis at this light concentrating optical element exceeds the critical angle of total reflection occurring at the interface between the substrate 21 and the air, the light having entered the light concentrating optical element 20 is totally reflected at the back surface (the top surface or the bottom surface in relation to s-polarized light) and is thus trapped inside the light concentrating optical element 20. The light having been totally reflected at the back surface of the light concentrating optical element 20 becomes scattered via the micro-optical members 22 as it advances from the back surface side toward the entry surface side, and thus, its advancing direction becomes deflected toward the x-axis or the z-axis. A principle similar to that described in reference to the light concentrating optical element 10 in the seventh embodiment will apply to a configuration that includes a protective film or the like with a refractive index different from that of the substrate 21, formed over the bottom surface of the light concentrating optical element.

Thus, almost all the p-polarized light component in light having entered from the light concentrating panel 8 to the light concentrating optical element 20 is bound to be directed either to the front side end surface or the back side end surface along the x-axis, and the light having been directed in this manner then enters the photoelectric conversion elements 50 disposed at the ends facing opposite each other along the x-axis as concentrated light. While almost all the s-polarized light component in light having entered the light concentrating optical element and advancing along the y-axis will be directed either to the top side end surface or the bottom side end surface along the z-axis, such s-polarized light can be guided along the x-axis and can be concentrated with a high degree of efficiency in much the same way as the p-polarized light is guided and concentrated in a light concentrating device configured as described later.

This structure, in which light having exited the light concentrating panel 8 through an exit surface assuming a large width along the x-axis and a large aspect ratio is concentrated along the x-axis via each light concentrating optical element 20 so that the aspect ratio of the cross section of the light becomes reduced, greatly improves the light concentration efficiency.

(Size Parameter)

The optimal structures that may be adopted for the substrates 11 and 21 and the micro-optical members 12 and 22 can be described in more specific detail based upon the Mie scattering theory, as with the substrates and the micro-optical members in the first through fourth embodiments. Accordingly, the size parameter $\alpha$ defined as in (1) is used in the seventh and eighth embodiments, as in the first through fourth embodiments. Namely, the substrate 11 at the light concentrating optical element 10 (20) is not a birefringent member, and the medium has a constant refractive index; $n = n_{axy} = n_{ayx} = n_{azy} = 1.64$. In addition, the refractive index $n_{bxy}$ of the particles is 1.88, and the wavelength 2 of the incident light is equal to 633 nm.

The size parameter $\alpha$ for the light concentrating optical element, comprising a substrate and micro-optical members, should be set in a range; $1.5 \leq \alpha \leq 40$, and it is even more desirable to set the size parameter $\alpha$ in a range; $2 \leq \alpha \leq 20$, as in the first through fourth embodiments. In addition, the particle diameter d of the micro-optical members should be set equal to or less than 20 μm and even more desirably to a value equal to or less than 10 μm.

The following is a description of specific examples of the light concentrating optical element 10 in the seventh embodiment and the light concentrating optical element 20 in the eighth embodiment.

(A Specific Example of the Light Concentrating Optical Element Achieved in the Seventh Embodiment)

The substrate 11 and the micro-optical members 12 in the light concentrating optical element 10 in the seventh embodiment may be designed to fulfill the following conditions.

refractive index of the substrate: $n_{axy} = n_{ayx} = n_{azy} = 1.64$ refractive index of the micro-optical members: $n_{axy} = 1.88$ $n_{byx} = n_{bzy} = 1.64$ particle diameter of the micro-optical members: d=1.0 μm (particle diameter following the drawing step)

distribution density of the micro-optical members: 0.1 particles/μm$^3$

The size parameter $\alpha$ is calculated to be 8.14 when the wavelength $\lambda$ of the incident light is 633 nm. The micro-optical members of the light concentrating optical element 10 in the seventh embodiment designed as outlined above manifest a positive birefringence property (a birefringence property whereby the refractive index for extraordinary rays is higher than the refractive index for ordinary rays) along the x-axis. Such a light concentrating optical element 10 in the seventh embodiment may be manufactured under manufacturing conditions substantially identical to those under which the light concentrating optical element 10 in the third embodiment is manufactured. The description of the manufacturing conditions for the light concentrating optical element 10 in the third embodiment can also be read as a description of the manufacturing conditions for the light concentrating optical element 10 in the seventh embodiment, simply by replacing FIGS. 17, 30 and 31 with FIGS. 39, 40, 41, 42 and 43. Accordingly, a further description of the manufacturing conditions for the light concentrating optical element 10 in the seventh embodiment is not provided.

(A Specific Example of the Light Concentrating Optical Element in the Eighth Embodiment)

The substrate 21 and the micro-optical members 22 in the light concentrating optical element 20 in the eighth embodiment may be designed to fulfill the following conditions.

refractive index of the substrate: $n_{axy}=n_{ayx}=n_{azy}=1.49$
refractive index of the micro-optical members: $n_{bxy}=1.49$ $n_{byx}=n_{bzy}=1.66$
particle diameter of the micro-optical members: $d=1.0\ \mu m$
distribution density of the micro-optical members: 0.1 particles/$\mu m^3$ The size parameter α is calculated to be 7.40 when the wavelength λ of the incident light is 633 nm. The micro-optical members of the light concentrating optical element 20 in the eighth embodiment designed as outlined above manifest a negative birefringence property (a birefringence property whereby the refractive index for extraordinary rays is lower than the refractive index for ordinary rays) along the y-axis. Such a light concentrating optical element 20 in the eighth embodiment may be manufactured under manufacturing conditions substantially identical to those under which the light concentrating optical element 20 in the fourth embodiment is manufactured. The description of the manufacturing conditions for the light concentrating optical element 20 in the eighth embodiment will be similar to the description of the manufacturing conditions for the light concentrating optical element 20 in the fourth embodiment. Accordingly, a further description of the manufacturing conditions for the light concentrating optical element 20 in the eighth embodiment is not provided.

(Comparison Example)

For purposes of comparison, simulation for a light concentrating element comprising a substrate and micro-optical members, neither of which have a birefringent properties, have been obtained through similar simulation. The substrate and the micro-optical members are designed so as to achieve the following conditions.

refractive index of the substrate: $n_{axy}=n_{ayx}=n_{azy}=1.49$
refractive index of the micro-optical members: $n_{bxy}=n_{byx}=n_{bzy}=1.66$
particle diameter of the micro-optical members: $d=1.0\ \mu m$
distribution density of the micro-optical members: 0.1 particles/$\mu m^3$ The size parameter α is calculated to be 7.40 when the wavelength λ of the incident light is 633 nm. The conditions set for the comparison example as listed above are identical to the conditions set for the comparison example described in reference to the third and fourth embodiments. Namely, the description of the comparison example given in reference to the third and fourth embodiments can be used directly as a description of the comparison example for the current embodiments, simply by replacing "third embodiment" and "fourth embodiment" in the earlier description with "seventh embodiment" and "eighth embodiment". Accordingly, any further description of the comparison example for the current embodiments is not provided.

Light concentrating devices equipped with light concentrating optical elements such as those explained above are now described. As a typical example of the light concentrating device according to the present invention, a light concentrating device equipped with the light concentrating optical element 10 will be described in reference to FIGS. 40 through 43. In each figure, p-polarized light with the electric field component thereof vibrating along a direction parallel to the drawing sheet is marked with double-ended arrows and s-polarized light with the electric field component thereof vibrating along a direction perpendicular to the drawing sheet is marked with circles, each having a dot set at the center thereof.

(Structural Examples for a Light Concentrating Device 600 and a Photovoltaic Power Generation Device 102*a*)

As has been explained, the light concentrating optical element 10 achieved in the seventh embodiment is structured so that the refractive index of the substrate 11 and the refractive index of the micro-optical members 12 take values different from each other for p-polarized light advancing along the y-axis and that the values taken for the refractive indices at the substrate 11 and the micro-optical members 12 for s-polarized light advancing along the y-axis and light advancing along the x-axis are substantially equal to each other.

Figure 40:
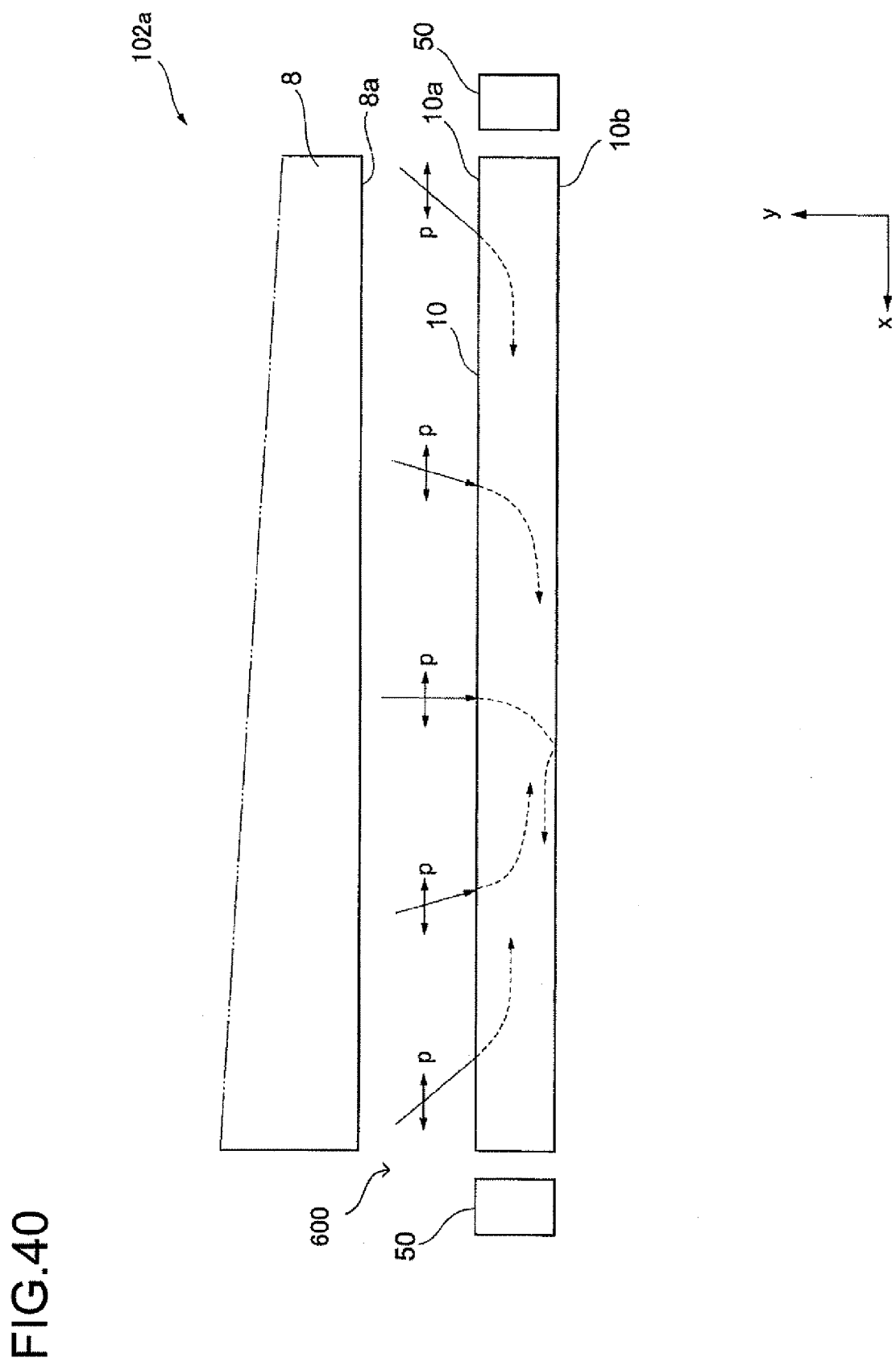
FIG. 40 is a schematic diagram showing the structure of a light concentrating device.

Accordingly, assuming that p-polarized light having been linearly polarized exits the light concentrating panel through its exit surface 8*a*, the light enters the light concentrating optical element 10, is all scattered via the micro-optical members with the advancing direction thereof (the light vector) oriented toward the positive-side end or the negative-side end along the x-axis and is caused to concentrate at the end areas facing opposite each other along the x-axis as shown in FIG. 40. As a result, a light concentrating device 600 configured with a single light concentrating optical element 10 and still capable of collecting all the incident light having exited the light concentrating panel through the exit surface 8*a* as concentrated light along the x-axis is achieved. Simply by disposing photoelectric conversion elements 50 at the ends of the light concentrating optical element, facing opposite each other along the x-axis, a photovoltaic power generation device 102*a*, such as that shown in FIG. 38, adopting a very simple structure, can be configured at low cost.

(Structural Examples for a Light Concentrating Device 60*d* and a Photovoltaic Power Generation Device 102*b*)

Figure 41:
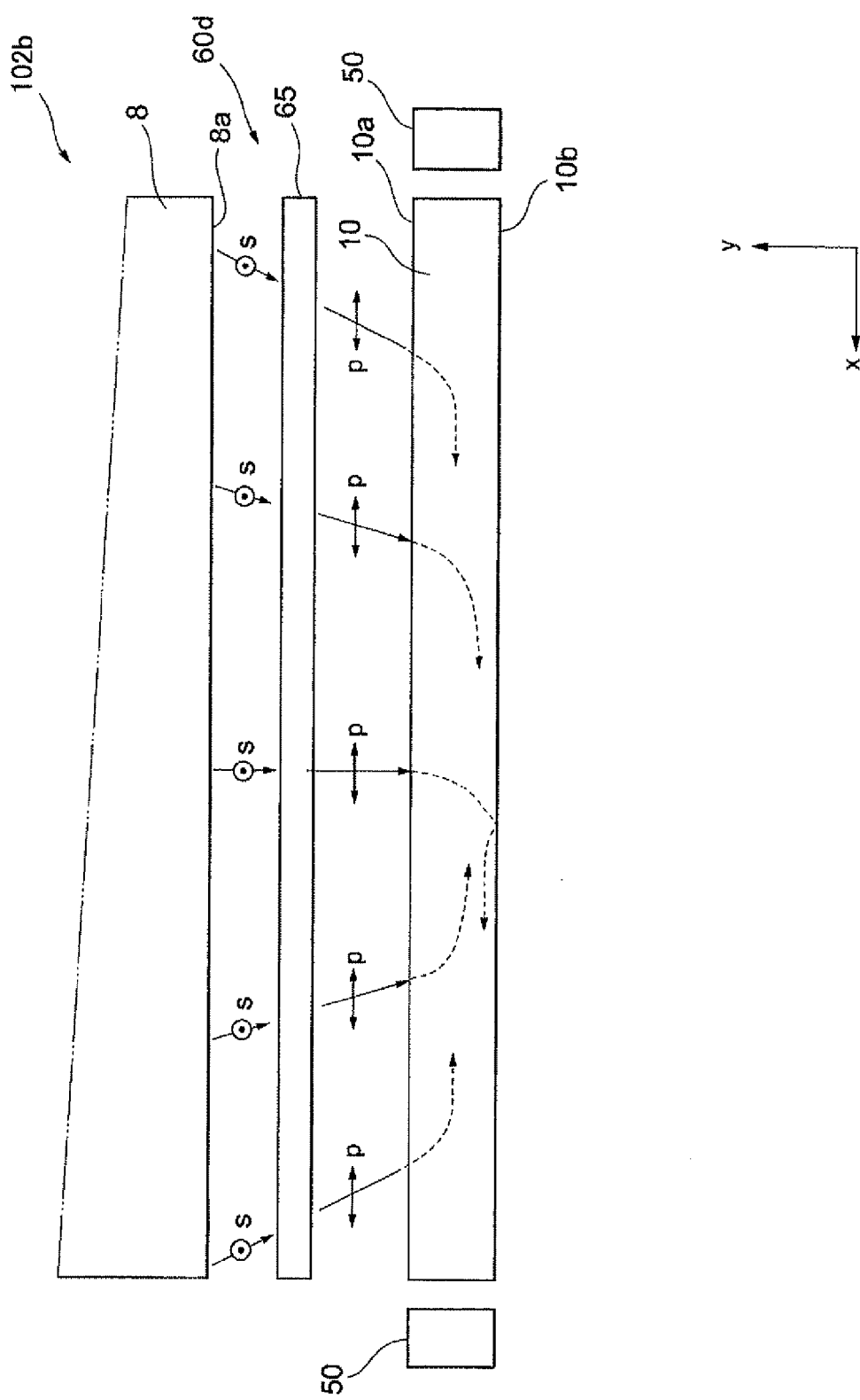
FIG. 41 is a schematic diagram showing the structure of a light concentrating device.

In addition, the light concentrating device 60*d* shown in FIG. 41 may be utilized for s-polarized light exiting the light concentrating panel through its exit surface 8*a* as linearly polarized light (e.g., when the light concentrating panel 8 is configured with a substrate and micro-optical members similar to those constituting the light concentrating optical element 10 or 20).

The light concentrating device 60*d* comprises a light concentrating optical element 10 and a polarization plane rotating element 65 disposed between the exit surface 8*a* of the light concentrating panel and the entry surface 10*a* of the light concentrating optical element. The polarization plane rotating element 65 is an optical element via which the polarization plane of the light transmitted through it is rotated by 90°. An optimal polarization plane rotating element fulfilling such a function may be, for instance, a wide-band half wavelength plate via which s-polarized light is converted to p-polarized light as light in the sunlight wavelength band is transmitted once.

At the light concentrating device 60*d* configured as described above, s-polarized light having exited the light concentrating panel through the exit surface 8*a* is converted to p-polarized light as it is transmitted through the polarization plane rotating element 65 and the p-polarized light resulting from the conversion then enters the light concentrating optical element 10. As a result, the light having entered the light concentrating optical element 10 is all scattered via the micro-optical members with the advancing direction thereof oriented toward the positive-side end or the negative-side end along the x-axis and is caused to concentrate at the end areas facing opposite each other along the x-axis. As a result, a light concentrating device 60d, simply configured with a single pair of light concentrating optical elements 10 and a polarization plane rotating element 65 but still capable of collecting all the incident light having exited the light concentrating panel through the exit surface 8a, as concentrated light along the x-axis is achieved. Simply by disposing photoelectric conversion elements 50 at the ends facing opposite each other along the x-axis, a photovoltaic power generation device 102b adopting a very simple structure can be configured at low cost.

(Structural Examples for Other Light Concentrating Devices and Photovoltaic Power Generation Devices)

Figure 42:
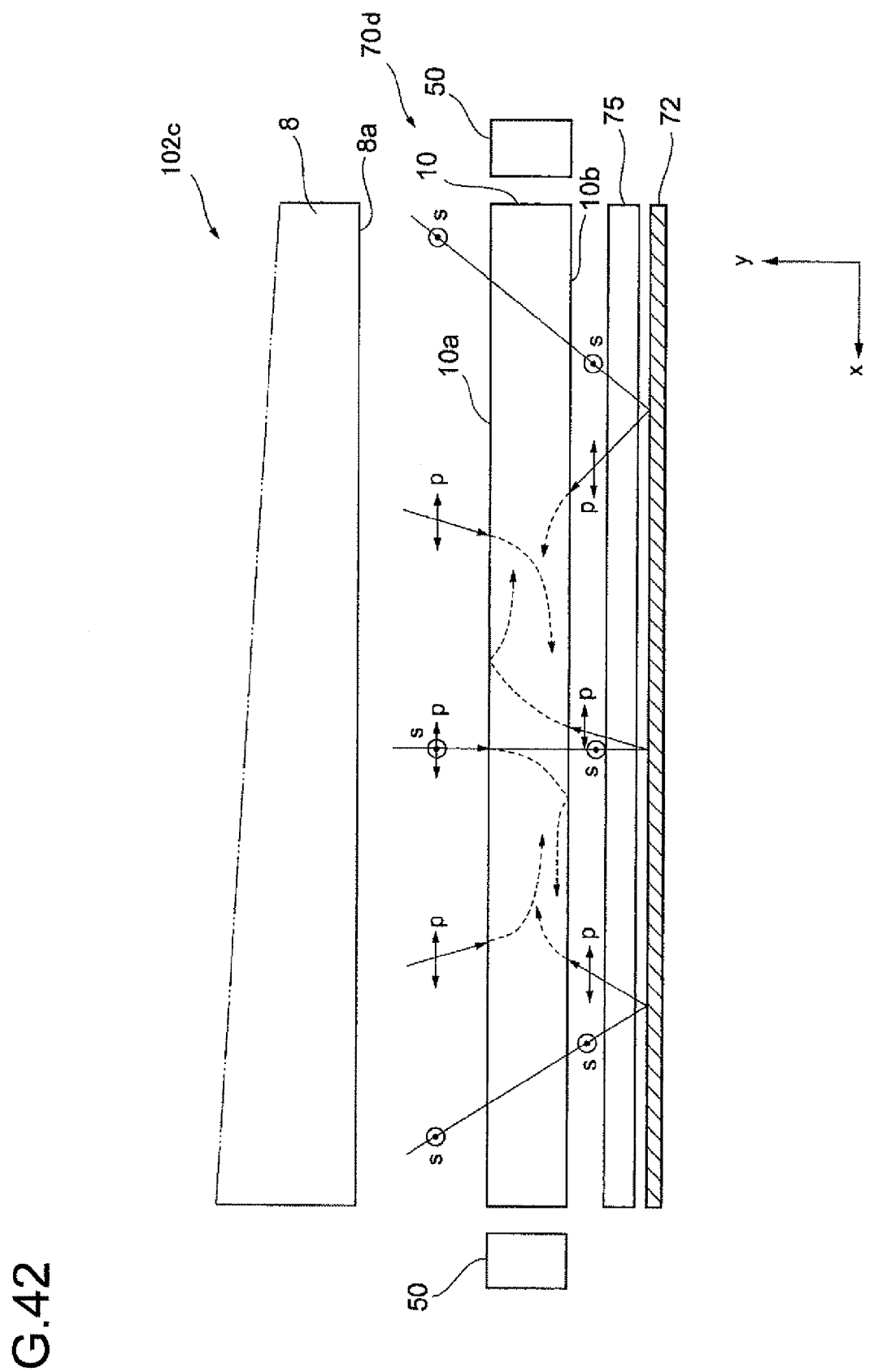
FIG. 42 is a schematic diagram showing the structure of a light concentrating device.
Figure 43:
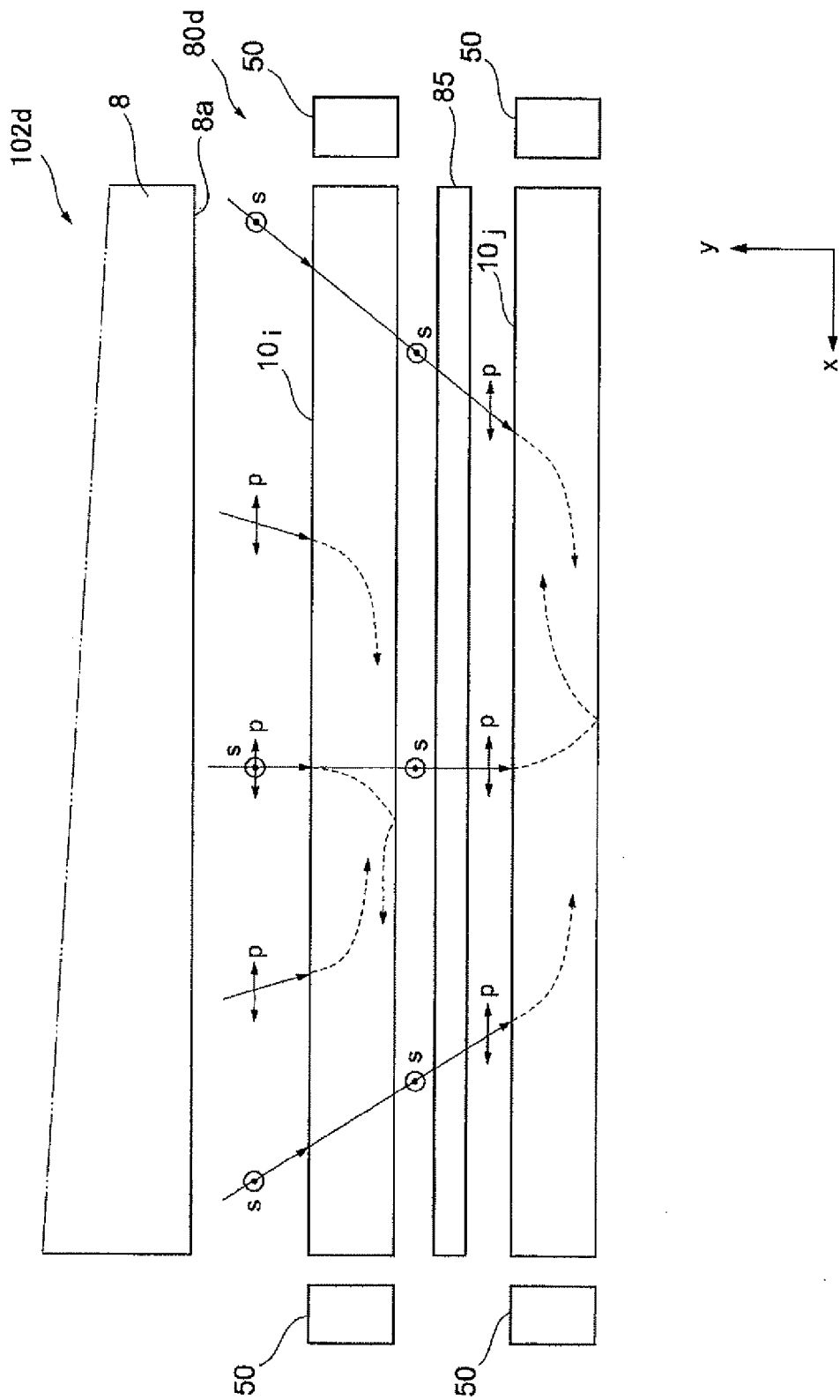
FIG. 43 is a schematic diagram showing the structure of a light concentrating device.

If light exiting the light concentrating panel through the exit surface 8a includes both a p-polarized light component and an s-polarized light component (e.g., light made up of polarized light components traveling along two directions perpendicular to each other, randomly polarized light, elliptically polarized light or circularly polarized light made up with the p-polarized light component and the s-polarized light component, or the like), the s-polarized light component in the light having entered the light concentrating optical element 10 in the light concentrating device 600 or the light concentrating device 60d described above will not be concentrated along the x-axis but instead it will exit the light concentrating optical element 10 through the back surface thereof. Light concentrating devices 70d and 80d, each configured by using the light concentrating optical element 10 achieved in the seventh embodiment, allow the entirety of the light entering the light concentrating optical element 10 to be collected as concentrated light regardless of the polarized light component composition in the incident light. The light concentrating devices 70d and 80d and photovoltaic power generation devices 102c and 102d, each equipped with the light concentrating optical element 10 achieved in the seventh embodiment, can each be configured by using a polarization plane rotating element or a reflecting mirror in combination with the light concentrating optical element 10, as in the case with the light concentrating devices 60a and 80a and the photovoltaic power generation devices 1a and 1c equipped with the light concentrating optical element 10 achieved in the first embodiment. For this reason, a description of the structures adopted for the light concentrating device 70d and the photovoltaic power generation device 102c in FIG. 42 is not provided. Likewise, a description of the structures adopted for the light concentrating device 80d and the photovoltaic power generation device 102d in FIG. 43 is not provided.

While the light concentrating devices are each configured with the light concentrating optical element 10 achieved in the seventh embodiment in the description provided above, a light concentrating device may also be configured, in much the same way, in conjunction with the light concentrating optical element 20 achieved in the eighth embodiment. Such a light concentrating device will function in a manner similar to that with which the light concentrating devices 600 and 60d in FIGS. 40 and 41 function, as long as light exiting the light concentrating panel through the exit surface 8a is p-polarized light having been linearly polarized or as long as light exiting the light concentrating panel through the exit surface 8a is s-polarized light having been linearly polarized.

If, on the other hand, light exiting the light concentrating panel through the exit surface 8a includes both p-polarized light and s-polarized light, the s-polarized light having entered the light concentrating optical element 20 in the eighth embodiment through the entry surface thereof along the thickness-wise direction will exit the light concentrating optical element 20 through the positive-side surface (designated as the top surface in this example) along the z-axis or through the negative-side surface (designated as the bottom surface in this example) along the z-axis. The light exiting the light concentrating optical element 20 through its top surface or its bottom surface assumes an electric field amplitude ranging along the z-axis within the zy plane, and thus, the advancing direction of this light cannot be simply deflected toward the x-axis.

Accordingly, a polarization plane rotating element 75 and a reflecting mirror 72 may be disposed by allowing them range along the exit surface (e.g., the top surface) through which the s-polarized light component exits, as in the light concentrating device 70d, so as to rotate the polarization plane of the light having exited the light concentrating optical element 20 through its top surface by 90°, cause the light to reenter the light concentrating optical element 20 and direct the reentered light toward the positive-side end or the negative-side end along the x-axis as concentrated light.

Alternatively, a polarization plane rotating element 85 and a second light concentrating optical element 10 (or 20) may be disposed by allowing them to range along the exit surface (e.g., the top surface) through which the s-polarized light component exits, as in the light concentrating device 80d, so as to rotate the polarization plane of the light having exited the light concentrating optical element 20 through its top surface by 90°, cause the light from the polarization plane rotating element to enter the second light concentrating optical element 10 and direct that light toward the positive-side end or the negative-side end along the x-axis as concentrated light.

(Methods of Light Energy Extraction at End Areas of Light Concentrating Optical Elements)

The concepts of typical methods that may be adopted when extracting the energy of light concentrated along the x-axis of the light concentrating optical element 10 achieved in the seventh embodiment and the light concentrating optical element 20 achieved in the eighth embodiment are briefly described in reference to FIGS. 44A through 44E.

Figure 44A:
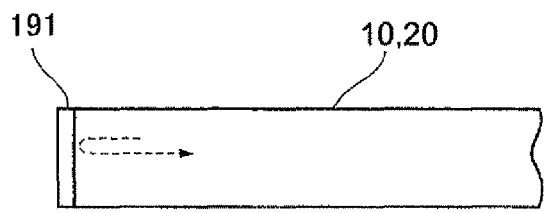
FIGS. 44A, 44B, 44C, 44D and 44E are conceptual diagrams showing how light energy may be extracted from a light concentrating optical element.
Figure 44B:
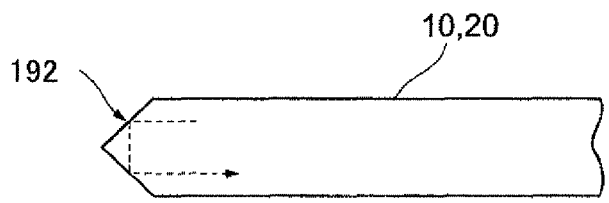
Figure 44C:
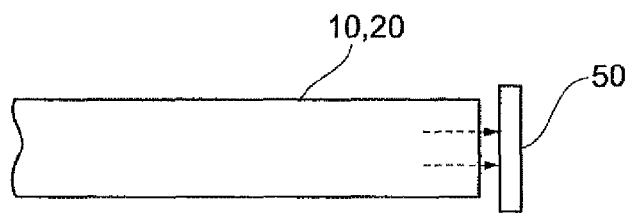
Figure 44D:
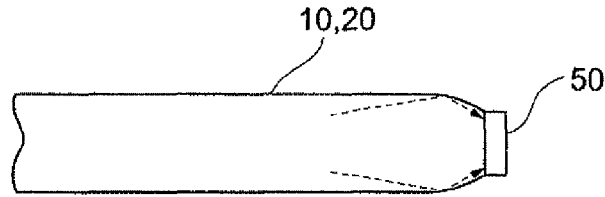
Figure 44E:
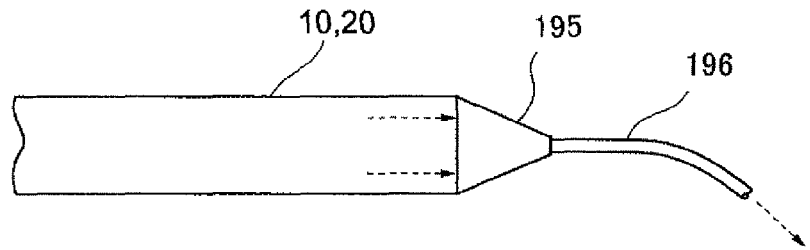

FIGS. 44A and 44E each present a structural example that includes a reflecting unit that reflects light, disposed at one end of the light concentrating optical element 10 (20), either on the positive-side end or the negative-side end along the x-axis (e.g., at the negative-side end of the light concentrating optical element along the x-axis), so as to concentrate light having entered the light concentrating optical element toward the other end along the x-axis (e.g., toward the positive-side end along the x-axis). In the structural example presented in FIG. 44A, a mirror 191 is disposed at the negative-side end surface of the light concentrating optical element 10 (20) along the x-axis or a reflecting film is formed over the negative-side end surface of the light concentrating optical element 10 (20) along the x-axis so as to concentrate light at the negative-side end by reflecting light having traveled to the negative-side end toward the positive-side end along the x-axis. FIG. 44B presents a structural example that includes a prismatic reflecting portion 192 formed at the negative-side end of the light concentrating optical element 10 (20) along the x-axis or a rectangular prism facing opposite the negative-side end surface of the light concentrating optical element 10 (20) along the x-axis so as to concentrate at the light positive-side end by reflecting light having traveled to the negative-side end toward the positive-side end along the x-axis. Either of these structural features doubles the light concentration rate (the power density of the extracted light) achieved at the light concentrating optical element 10 (20) over that achieved otherwise.

FIG. 44C presents a structural example that may be adopted when utilizing light having been concentrated at an end of a light concentrating optical element by converting the concentrated light to electric energy or thermal energy. In the example presented in FIG. 44C, a photoelectric conversion element 50 is coupled with a light concentration-side end of the light concentrating optical element 10 (20) and the energy of the concentrated light is extracted as electric energy via the photoelectric conversion element 50 where the light energy undergoes photoelectric conversion. In addition, it is desirable to extract the energy of the concentrated light as thermal energy via a heat pipe or the like that includes a light absorber where the concentrated light is converted to heat through photothermal conversion. Any light concentrating optical element and light concentrating device among those described earlier may be used to configure a photothermal conversion device used to extract the energy of concentrated light as heat.

FIG. 44D presents a structural example that may be adopted to extract the energy of light concentrated in an end area by further improving the light concentration rate. The light concentrating optical element 10 (20) in this example is formed so that at least either its measurement taken along the x-axis or its measurement taken along the y-axis, located near the light concentration-side end, becomes gradually reduced toward the end (i.e., so that the opening area at the end is reduced). As a result, an even higher light concentration rate is achieved when the light having been directed along the x-axis is concentrated at the exit end area. Through these measures, the concentrated light can be input to a photoelectric conversion element 50 or a heat pipe with even higher power density.

FIG. 44E presents a structural example with an optical fiber 196 connected via a coupler 195 to an end of the light concentrating optical element 10 (20). The coupler 195 may be constituted with, for instance, an optical member formed in a circular truncated cone shape. This configuration enables utilization of light having been concentrated at the light concentrating optical element 10 (20) at a remote location away from the light concentrating panel 8. For instance, a photoelectric conversion element 50 may be installed inside a unit box equipped with a cooling device that prevents the photoelectric conversion element from becoming overheated and light having been concentrated at the light concentrating optical element 10 (20), may be transmitted into this unit box via the optical fiber 196. In a similar application, light having been concentrated at the light concentrating optical element 10 (20) may be transmitted via the optical fiber 196 so that the concentrated light can be used at, for instance, an agricultural plant geographically separated from the light concentrating device.

While the seventh and eighth embodiments described above are achieved by utilizing the light concentrating optical elements in the third and fourth embodiments, the present invention may also be embodied in an ideal manner by using the light concentrating optical element achieved in another embodiment instead of the light concentrating optical elements in the third and fourth embodiments.

In order to simplify the explanation, the light concentrating optical elements achieved in the seventh and eighth embodiments are described as those assuming a rod (rectangular bar) form. In addition, the functions of the light concentrating optical elements achieved in the embodiments are described in specific detail by quoting specific materials used to constitute the substrate and the micro-optical members and defining values taken for their refractive indices accordingly. However, embodiments of the present invention are not limited to such substructure modes or structural examples. For instance, the present invention may be adopted in a light concentrating optical element formed as a plate, as a thin sheet, as a circular column or as a linear element. In addition, the present invention may be adopted in a light concentrating optical element comprising a substrate and micro-optical members constituted of optimal materials selected from various resin materials, inorganic materials and the like. Furthermore, the light concentrating optical element according to the present invention may include another member in addition to the substrate 11 and the micro-optical members 12, as long as the presence of the additional member does not cause a departure from the spirit of the invention.

At the light concentrating optical element 10 achieved in the seventh embodiment and the light concentrating optical element 20 achieved in the eighth embodiment, broad light exiting the light concentrating panel 8 through its exit surface with a large aspect ratio (longer side/shorter side) is concentrated along the direction in which the longer sides of the light concentrating panel 8 extends, as described above. Thus, the light concentration efficiency for the light exiting through the exit surface assuming a large width along the x-axis can be increased, thereby making it possible to provide an innovative device having a light concentrating function that will enable efficient utilization of light energy such as some might. The light concentrating devices 600, 60d, 70d and 80d, and the photovoltaic power generation device 102 (the photovoltaic power generation devices 102a, 102b, 102c and 102d) are all configured with such light concentrating optical elements. As a result, a light concentrating device and a photovoltaic power generation device adopting simple structures, which enable efficient utilization of light energy such as sunlight, can be provided as compact systems at low cost. Similar advantages will be achieved when the present invention is adopted in photothermal conversion devices.

The above light concentrating optical element, the above light concentrating device, the above photovoltaic power generation device and the above photothermal conversion device according to the present invention enable efficient utilization of light energy such as sunlight through efficient concentration thereof, while at the same time eliminating the need for tracking the movement of the sun.

It is to be noted that the embodiments and variations thereof described above simply represent examples and the present invention is in no way limited to these examples, as long as the features characterizing the present invention remain intact. Any other embodiment conceivable within the technical scope of the present invention should, therefore, be considered to be within the range of the present invention.

What is claimed is:

1. A light concentrating optical element, comprising:
a substrate; and
a plurality of micro-optical members dispersed inside the substrate, wherein:
the plurality of micro-optical members each direct light having been transmitted through the substrate and having entered a micro-optical member along at least one entering direction, so that the light exits the micro-optical member along a matching direction matching the at least one entering direction, and direct light having entered the micro-optical member along an other entering direction different from the at least one entering direction, so that the light exits the micro-optical member along at least one exiting direction different from the other entering direction, resulting in an advancing direction of light having entered the substrate through a substrate front surface and advancing through the substrate being deflected via the plurality of micro-optical members to extend along the matching direction;
further wherein:
(i) the micro-optical members are each formed as a particle and assume a particle diameter d, expressed as a diameter of an equivalent circle set to 0.1λ to 10λ with λ representing a wavelength of light entering along the thickness-wise direction and refractive indices achieve a relationship whereby $n_{axy}$ and $n_{bxy}$ are different from each other, $n_{ax\varnothing}$ and $n_{bx\varnothing}$ are equal to each other and $\sin\varnothing > (1/n_{ax\varnothing})$, or (ii) the micro-optical members assume a wedge shape and measurement of each micro-optical member among the plurality of micro-optical members taken along the first direction is equal to or greater than $\frac{1}{10}$ of a wavelength of light advancing through the substrate, and refractive indices achieve a relationship whereby $n_{ax}$ and $n_{bx}$ are different from each other, and $n_{ay}$ and $n_{by}$ are substantially equal to each other; and the light having been deflected via the plurality of micro-optical members so as to advance through the substrate along the matching direction is concentrated at an end area of the substrate.

2. A light concentrating optical element according to claim 1, wherein:

at least either the substrate or the plurality of micro-optical members have a birefringence property; and a refractive index of the substrate and a refractive index of each of the micro-optical members are substantially equal to each other in relation to light advancing through the substrate along the matching direction.

3. A light concentrating optical element according to claim 1, wherein:

the micro-optical members are dispersed along a thickness-wise direction extending along a thickness of the substrate and along a first direction and a second direction each extending perpendicular to the thickness-wise direction;

the relationship whereby $n_{axy}$ and $n_{bxy}$ are different from each other, $n_{ax\varnothing}$ and $n_{bx\varnothing}$ are equal to each other and $\sin\varnothing > (1/n_{ax\varnothing})$ is true, when;

an axis extending along the thickness-wise direction is designated as a y-axis, an axis extending along the first direction is designated as an x-axis, an axis extending along the second direction is designated as a z-axis and a plane that contains both the x-axis and the y-axis is designated as an xy plane;

a refractive index for light advancing through the substrate along the y-axis with an electric field component thereof vibrating within the xy plane is notated as $n_{axy}$, a refractive index for light advancing through the substrate along the x-axis with the electric field component thereof vibrating within the xy plane is notated as $n_{ayx}$ and a refractive index for light advancing through the substrate along an axial direction inclining from the y-axis toward the x-axis by an angle $\varnothing$ ($0<\varnothing\leq 90°$) with the electric field component thereof vibrating within the xy plane is notated as $n_{ax\varnothing}$; and a refractive index for light advancing through each micro-optical member among the plurality of micro-optical members along the y-axis with an electric field component thereof vibrating within the xy plane is notated as $n_{bxy}$, a refractive index for light advancing through the micro-optical member along the x-axis with the electric field component thereof vibrating within the xy plane is notated as $n_{byx}$ and a refractive index for light advancing through the micro-optical member along the axial direction inclining from the y-axis toward the x-axis by the angle $\varnothing$ with the electric field component thereof vibrating within the xy plane is notated as $n_{bx\varnothing}$.

4. A light concentrating optical element according to claim 3, wherein:

the refractive indices further achieve a relationship expressed as; $n_{bxy} > n_{bx\varnothing} > n_{byx}$.

5. A light concentrating optical element according to claim 3, wherein:

the refractive indices further achieve a relationship expressed as; $n_{bxy} < n_{bx\varnothing} < n_{byx}$.

6. A light concentrating optical element according to claim 3, wherein:

the refractive indices further achieve a relationship expressed as; $n_{axy} > n_{ax\varnothing} > n_{ayx}$.

7. A light concentrating optical element according to claim 3, wherein:

the refractive indices further achieve a relationship expressed as; $n_{axy} < n_{ax\varnothing} < n_{ayx}$.

8. A light concentrating optical element according to claim 3, wherein:

the refractive indices further achieve a relationship whereby $n_{azy}$ and $n_{bzy}$ are different from each other, $n_{ayz}$ and $n_{byz}$ are different from each other, $n_{az\gamma}$ and $n_{bz\gamma}$ are equal to each other and $\sin\gamma > (1/n_{az\gamma})$ is true, when;

a plane that contains both the y-axis and the z-axis is designated as a zy plane;

a refractive index for light advancing through the substrate along the y-axis with an electric field component thereof vibrating within the zy plane is notated as $n_{azy}$, a refractive index for light advancing through the substrate along the z-axis with the electric field component thereof vibrating within the zy plane is notated as $n_{ayz}$ and a refractive index for light advancing through the substrate along an axial direction inclining from the y-axis toward the z-axis by an angle $\gamma$ ($0<\gamma\leq 90°$) with the electric field component thereof vibrating within the zy plane is notated as $n_{az\gamma}$; and a refractive index for light advancing through each micro-optical member among the plurality of micro-optical members along the y-axis with an electric field component thereof vibrating within the zy plane is notated as $n_{bzy}$, a refractive index for light advancing through the micro-optical member along the z-axis with the electric field component thereof vibrating within the zy plane is notated as $n_{byz}$ and a refractive index for light advancing through the micro-optical member along the axial direction inclining from the y-axis toward the z-axis by the angle $\gamma$ with the electric field component thereof vibrating within the zy plane, is notated as $n_{bz\gamma}$.

9. A light concentrating optical element according to claim 3, wherein:

the refractive indices achieve a relationship whereby $n_{ax\varnothing}$ is equal to $n_{ayx}$, $n_{bx\varnothing}$ is equal to $n_{byx}$, $n_{axy}$ and $n_{bxy}$ are different from each other and $n_{ayx}$ and $n_{byx}$ are substantially equal to each other when the angle $\varnothing$ is 90°.

10. A light concentrating optical element according to claim 9, wherein:

the refractive indices further achieve a relationship expressed as; $n_{axy} < n_{bxy}$ and $n_{bxy} > n_{byx}$.

11. A light concentrating optical element according to claim 9, wherein:

the refractive indices further achieve a relationship expressed as; $n_{axy} < n_{bxy}$ and $n_{axy} < n_{ayx}$.

12. A light concentrating optical element according to claim 9, wherein:

the refractive indices further achieve a relationship expressed as; $n_{axy} > n_{bxy}$ and $n_{bxy} < n_{byx}$.

13. A light concentrating optical element according to claim 9, wherein:

the refractive indices further achieve a relationship expressed as; $n_{axy} > n_{bxy}$ and $n_{axy} > n_{ayx}$.

14. A light concentrating optical element according to claim 9, wherein:

the refractive indices further achieve a relationship whereby $n_{azy}$ and $n_{bzy}$ are substantially equal to each other when;

a refractive index for light advancing through the substrate along the x-axis with an electric field component thereof vibrating within the zy plane is notated as $n_{azy}$; and a refractive index for light advancing through each micro-optical member among the plurality of micro-optical members along the x-axis with an electric field component thereof vibrating within the zy plane is notated as $n_{bzy}$.

15. A light concentrating optical element according to claim 3, wherein:

a size parameter α defined as; $(\pi \times d \times n_{axy})/\lambda$ is within a range of $1.5 \le \alpha \le 40$.

16. A light concentrating optical element according to claim 3, wherein:

a size parameter α defined as; $(\pi \times d \times n_{axy})/\lambda$ is within a range of $2 \le \alpha \le 20$.

17. A light concentrating optical element according to claim 3, wherein:

the micro-optical members each assume a particle diameter d equal to or less than 20 μm.

18. A light concentrating optical element according to claim 3, wherein:

a distribution density with which the micro-optical members are dispersed in the substrate is set so that light having entered the substrate through the front surface thereof along the thickness-wise direction, which is then multiply scattered via the plurality of micro-optical members to advance toward a back surface, is totally reflected at the back surface.

19. A light concentrating optical element according to claim 1, wherein:

the micro-optical members are disposed within the substrate along a thickness-wise direction extending along a thickness of the substrate and along a first direction and a second direction each extending perpendicular to the thickness-wise direction and the wedge shape widening gradually along the first direction within a plane that contains the thickness-wise direction and the first direction and ranges perpendicular to the second direction;

the relationship whereby $n_{ax}$ and $n_{bx}$ are different from each other, and $n_{ay}$ and $n_{by}$ are substantially equal to each other, when;

a refractive index for light advancing through the substrate along the thickness-wise direction with an electric field component thereof vibrating along the first direction is notated as $n_{ax}$, and a refractive index for light advancing through the substrate along the first direction with the electric field component thereof vibrating along the thickness-wise direction is notated as $n_{ay}$; and a refractive index for light advancing through each micro-optical member among the plurality of micro-optical members along the thickness-wise direction with an electric field component thereof vibrating along the first direction is notated as $n_{bx}$ and a refractive index for light advancing through the micro-optical member along the first direction with the electric field component thereof vibrating along the thickness-wise direction is notated as $n_{by}$.

20. A light concentrating optical element according to claim 19, wherein:

the plurality of micro-optical members each assume an isosceles triangle wedge shape within the plane containing the thickness-wise direction and the first direction and the micro-optical members are each disposed so that a vertical line extending from a vertex of the isosceles triangle toward a base side is aligned in the first direction.

21. A light concentrating optical element according to claim 19, wherein:

a vertex of the wedge shape assumed by each of the micro-optical members and a number of micro-optical members that overlap each other along the thickness-wise direction are set so that;

light having entered the substrate through the front surface thereof along the thickness-wise direction and having been sequentially refracted within the plane containing the thickness-wise direction and the first direction via the plurality of micro-optical members to advance toward a back surface from one of the micro-optical members located closest to the back surface of the substrate, is totally reflected at the back surface of the substrate.

22. A light concentrating optical element according to claim 1, wherein:

the substrate is formed as a plate or a sheet with an entry surface through which light enters the substrate having a greater area than side surfaces forming the end area of the substrate, and dimensions of the substrate taken along the first direction and along the second direction each running perpendicular to the thickness-wise direction are both greater than a dimension taken along the thickness-wise direction by a sufficient extent.

23. A light concentrating optical element according to claim 1, wherein:

the substrate is formed so that an area of a side surface thereof forming the end area of the substrate is smaller by a sufficient extent compared to an area of an entry surface thereof through which light enters the substrate.

24. A light concentrating device, comprising:

a light concentrating optical element according to claim 1:

a reflecting mirror disposed on a side where a back surface, facing opposite an entry surface of the substrate through which light enters the substrate of the light concentrating optical element, is located so as to range along the back surface; and a polarization plane rotating element disposed between the light concentrating optical element and the reflecting mirror, which causes a 90° rotation of a polarization plane of light transmitted through the polarization plane rotating element twice.

25. A light concentrating device, comprising:

a first light concentrating optical element according to claim 1; and a second light concentrating optical element according to claim 1, wherein:

the second light concentrating optical element is disposed on a side where a back surface, facing opposite an entry surface of the substrate through which light enters the substrate of the first light concentrating optical element, is located; and the first direction assumed at the second light concentrating optical element and the second direction assumed at the first light concentrating optical element extend parallel to each other.

26. A light concentrating device, comprising:
a first light concentrating optical element according to claim 1; and
a second light concentrating optical element according to claim 1, wherein:
the second light concentrating optical element is disposed on a side where a back surface, facing opposite an entry surface of the substrate through which light enters the substrate of the first light concentrating optical element, is located;
the first direction assumed at the second light concentrating optical element and the first direction assumed at the first light concentrating optical element extend parallel to each other; and
a polarization plane rotating element, which causes a 90° rotation of a polarization plane of light transmitted through the polarization plane rotating element, is disposed between the first light concentrating optical element and the second light concentrating optical element.

27. A light concentrating device, comprising:
a light concentrating optical element according to claim 1; and
a light concentrating unit that concentrates light entering along a thickness-wise direction and outputs the concentrated light through an exit surface located at a side end thereof, wherein:
an entry surface through which light enters the substrate is set so as to face opposite the exit surface and
the matching direction extends along longer sides of the entry surface.

28. A light concentrating device according to claim 24, further comprising:
a light concentrating unit that concentrates light entering along a thickness-wise direction and outputs the concentrated light through an exit surface located at a side end thereof, wherein:
an entry surface through which light enters the substrate is set so as to face opposite the exit surface and
the matching direction extends along longer sides of the entry surface.

29. A photovoltaic power generation device, comprising:
a light concentrating optical element according to claim 1; and
a photoelectric conversion element where light having advanced through the substrate and been concentrated at the end area of the substrate undergoes photoelectric conversion, wherein:
the one entering direction is a first direction.

30. A photovoltaic power generation device, comprising:
a light concentrating optical element according to claim 1; and
a photoelectric conversion element where light having advanced through the substrate and been concentrated at the end area of the substrate undergoes photoelectric conversion, wherein:
the one entering direction is a first direction and a second direction.

31. A photovoltaic power generation device, comprising:
a light concentrating device according to claim 24; and
a photoelectric conversion element where light having advanced through the substrate and been concentrated at the end area of the substrate undergoes photoelectric conversion, wherein:
the one entering direction is a first direction.

32. A photovoltaic power generation device, comprising:
a light concentrating device according to claim 25,
a first photoelectric conversion element where light having advanced through the substrate of the first light concentrating optical element and concentrated at the end area of the substrate in the first light concentrating optical element undergoes photoelectric conversion; and
a second photoelectric conversion element where light having advanced through the substrate of the second light concentrating optical element and concentrated at the end area of the substrate in the second light concentrating optical element undergoes photoelectric conversion, wherein:
the one entering direction assumed at the first light concentrating optical element is a first direction taken at the first light concentrating optical element and the one entering direction assumed at the second light concentrating optical element is the first direction taken at the second light concentrating optical element.

33. A photothermal conversion device, comprising:
a light concentrating optical element according to claim 1; and
a photothermal conversion element where light having advanced through the substrate and been concentrated at the end area of the substrate undergoes photothermal conversion, wherein:
the one entering direction is a first direction.

34. A photothermal conversion device, comprising:
a light concentrating optical element according to claim 1; and
a photothermal conversion element where light having advanced through the substrate and been concentrated at the end area of the substrate undergoes photothermal conversion, wherein:
the one entering direction is a first direction and a second direction.

35. A photothermal conversion device, comprising:
a light concentrating device according to claim 24; and
a photothermal conversion element where light having advanced through the substrate and been concentrated at the end area of the substrate undergoes photothermal conversion, wherein:
the one entering direction is a first direction.

36. A photothermal conversion device, comprising:
a light concentrating device according to claim 25,
a first photothermal conversion element where light having advanced through the substrate of the first light concentrating optical element and concentrated at the end area of the substrate in the first light concentrating optical element undergoes photothermal conversion; and
a second photothermal conversion element where light having advanced through the substrate of the second light concentrating optical element and concentrated at the end area of the substrate in the second light concentrating optical element undergoes photothermal conversion, wherein:
the one entering direction assumed at the first light concentrating optical element is a first direction taken at the first light concentrating optical element and the one entering direction taken at the second light concentrating optical element is the first direction assumed at the second light concentrating optical element.

* * * * *